(12) United States Patent
Nakashima et al.

(10) Patent No.: US 11,885,621 B2
(45) Date of Patent: Jan. 30, 2024

(54) SENSOR DEVICE

(71) Applicant: PANASONIC INTELLECTUAL PROPERTY MANAGEMENT CO., LTD., Osaka (JP)

(72) Inventors: Koichiro Nakashima, Fukui (JP); Takashi Uchida, Fukui (JP); Yusuke Nakamura, Hyogo (JP); Hideki Ueda, Fukui (JP); Naruhito Noda, Fukui (JP); Toshitsugu Konishi, Fukui (JP); Toshio Yamazaki, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 183 days.

(21) Appl. No.: 17/415,340

(22) PCT Filed: Feb. 4, 2020

(86) PCT No.: PCT/JP2020/004060
§ 371 (c)(1),
(2) Date: Jun. 17, 2021

(87) PCT Pub. No.: WO2020/162436
PCT Pub. Date: Aug. 13, 2020

(65) Prior Publication Data
US 2022/0057211 A1 Feb. 24, 2022

(30) Foreign Application Priority Data

Feb. 5, 2019 (JP) ................................. 2019-019086
May 24, 2019 (JP) ................................. 2019-098036
Jul. 12, 2019 (WO) .................. PCT/JP2019/027805

(51) Int. Cl.
G01C 19/5783 (2012.01)
B81B 7/00 (2006.01)
G01C 19/5684 (2012.01)

(52) U.S. Cl.
CPC .......... G01C 19/5783 (2013.01); B81B 7/007 (2013.01); B81B 7/0048 (2013.01); G01C 19/5684 (2013.01); B81B 2201/0242 (2013.01)

(58) Field of Classification Search
None
See application file for complete search history.

(56) References Cited

U.S. PATENT DOCUMENTS 4,959,574 A  9/1990 Suzuki et al.
7,002,257 B2 * 2/2006 Tao .................. H01L 24/29
                                                   257/E31.127
(Continued)

FOREIGN PATENT DOCUMENTS

JP    H01-299415 A   12/1989
JP    2000-249562 A   9/2000
(Continued)

OTHER PUBLICATIONS

Extended European Search Report dated May 11, 2022 issued in the European Patent Application No. 20752631.0.
(Continued)

*Primary Examiner* — Paul M. West
*Assistant Examiner* — Mark A Shabman
(74) *Attorney, Agent, or Firm* — Rimon P.C.

(57) ABSTRACT

A sensor device includes a sensor element, a substrate, and a bonding wire. Over the substrate, provided is the sensor element. The bonding wire forms at least part of a connection path that electrically connects the sensor element and
(Continued)

the substrate together. The bonding wire is provided to connect two connection surfaces that intersect with each other.

7 Claims, 30 Drawing Sheets

(56) References Cited

U.S. PATENT DOCUMENTS

| | | | |
|---|---|---|---|
| 2003/0006508 A1 | 1/2003 | Ikezawa et al. | |
| 2005/0199988 A1 | 9/2005 | Ikezawa et al. | |
| 2006/0097331 A1 | 5/2006 | Hattori et al. | |
| 2009/0255335 A1* | 10/2009 | Fly | G01C 21/166 |
| | | | 73/493 |
| 2011/0221050 A1 | 9/2011 | Kurita | |
| 2012/0236507 A1* | 9/2012 | Koyama | G01C 19/5783 |
| | | | 361/728 |
| 2013/0193536 A1 | 8/2013 | Arai | |
| 2015/0330854 A1 | 11/2015 | Tsushima | |
| 2016/0027992 A1 | 1/2016 | Lo | |
| 2016/0141272 A1 | 5/2016 | Inakawa | |
| 2018/0065257 A1 | 3/2018 | Iwasaka et al. | |
| 2018/0069145 A1 | 3/2018 | Ishida et al. | |
| 2018/0090423 A1 | 3/2018 | Shimizu et al. | |

FOREIGN PATENT DOCUMENTS

| | | | |
|---|---|---|---|
| JP | 2003-021647 | A | 1/2003 |
| JP | 2006-278598 | A | 10/2006 |
| JP | 2011-027708 | A | 2/2011 |
| JP | 2011-058944 | A | 3/2011 |
| JP | 2011-187841 | A | 9/2011 |
| JP | 2013-154427 | A | 8/2013 |
| JP | 2013-183083 | A | 9/2013 |
| JP | 2013-183115 | A | 9/2013 |
| JP | 2015-002308 | A | 1/2015 |
| JP | 2015-219095 | A | 12/2015 |
| JP | 5908136 | B1 | 4/2016 |
| JP | 2016-170002 | A | 9/2016 |
| JP | 2018-056369 | A | 4/2018 |
| WO | 2016/159322 | A1 | 10/2016 |

OTHER PUBLICATIONS

Supplementary Partial European Search Report dated Apr. 4, 2022 issued in the corresponding European Patent Application No. 20752631.0.

International Search Report and Written Opinion issued in International Patent Application No. PCT/JP2020/004060, dated Mar. 31, 2020; with partial English translation.

Japanese Office Action dated Jun. 27, 2023 issued in the corresponding Japanese Patent Application No. 2020-571205, with English translation.

* cited by examiner

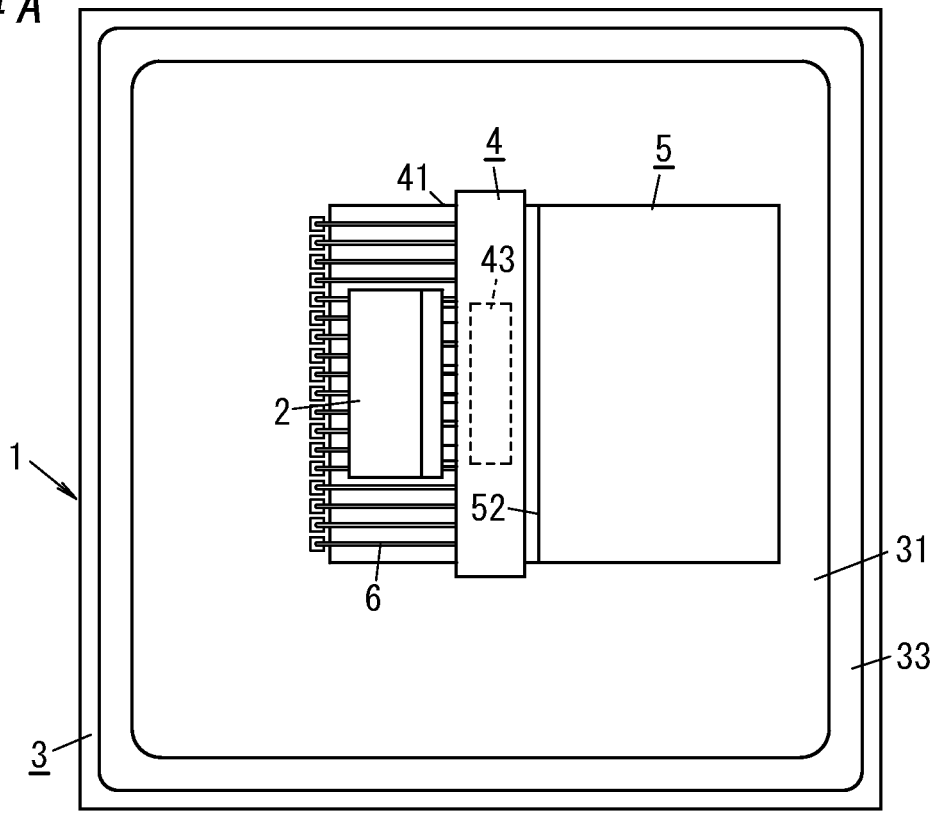
FIG. 4A
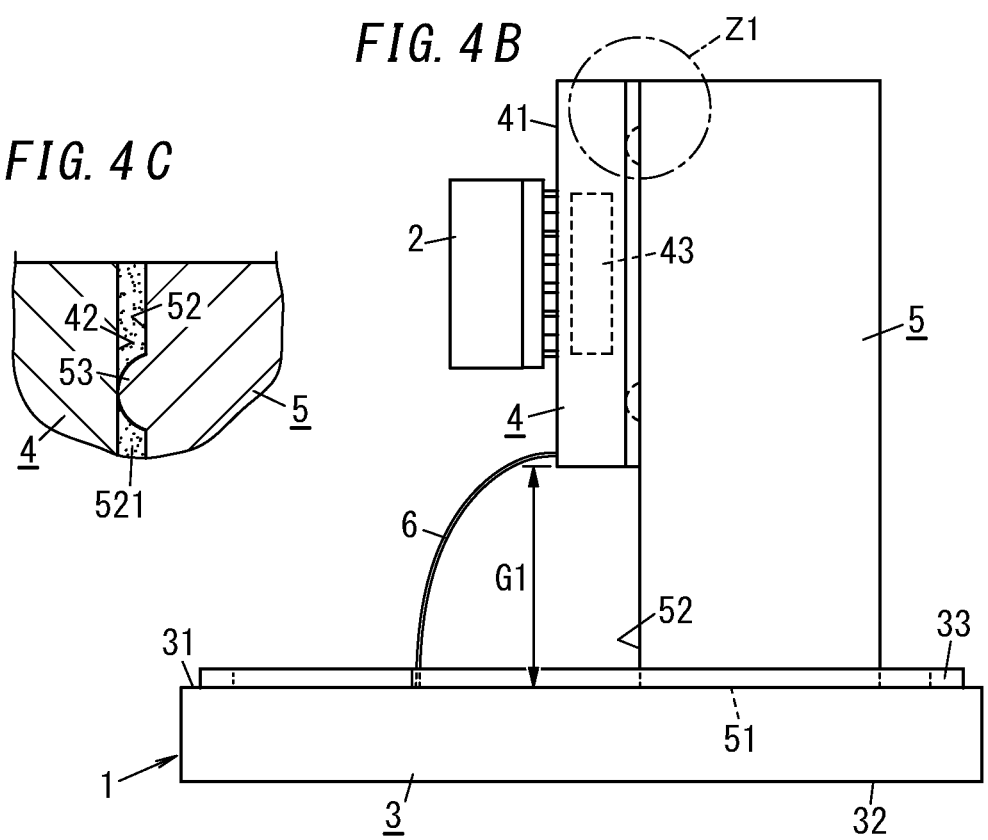
FIG. 4B
FIG. 4C

FIG. 16A
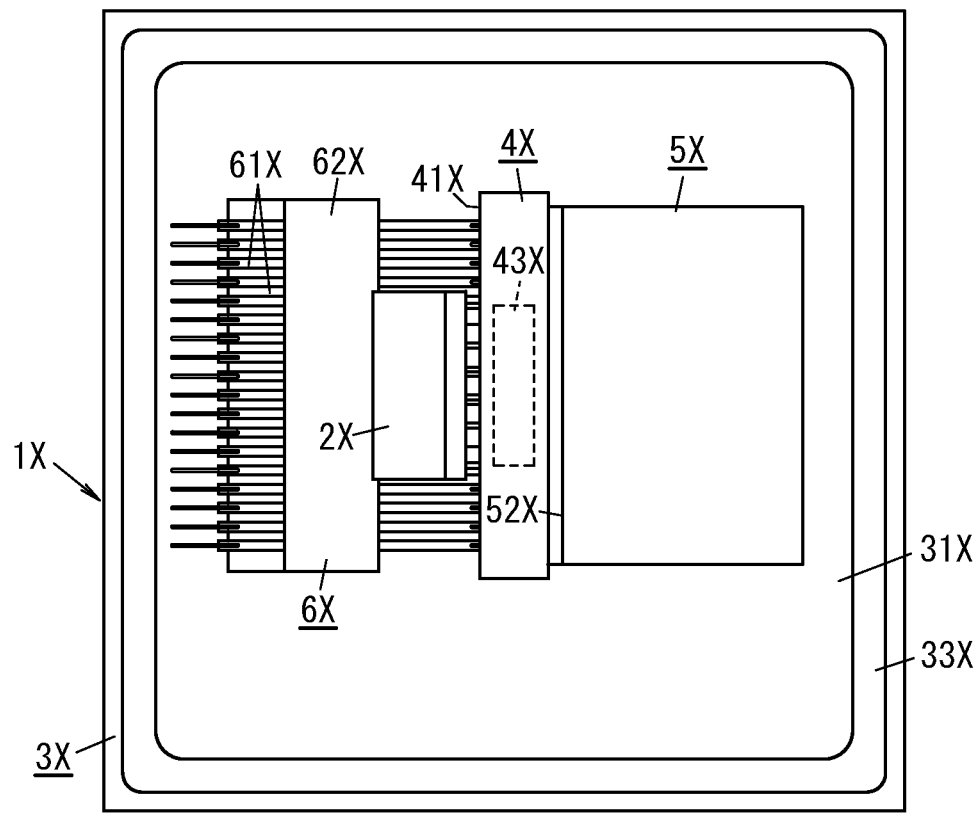
FIG. 16B
FIG. 16C
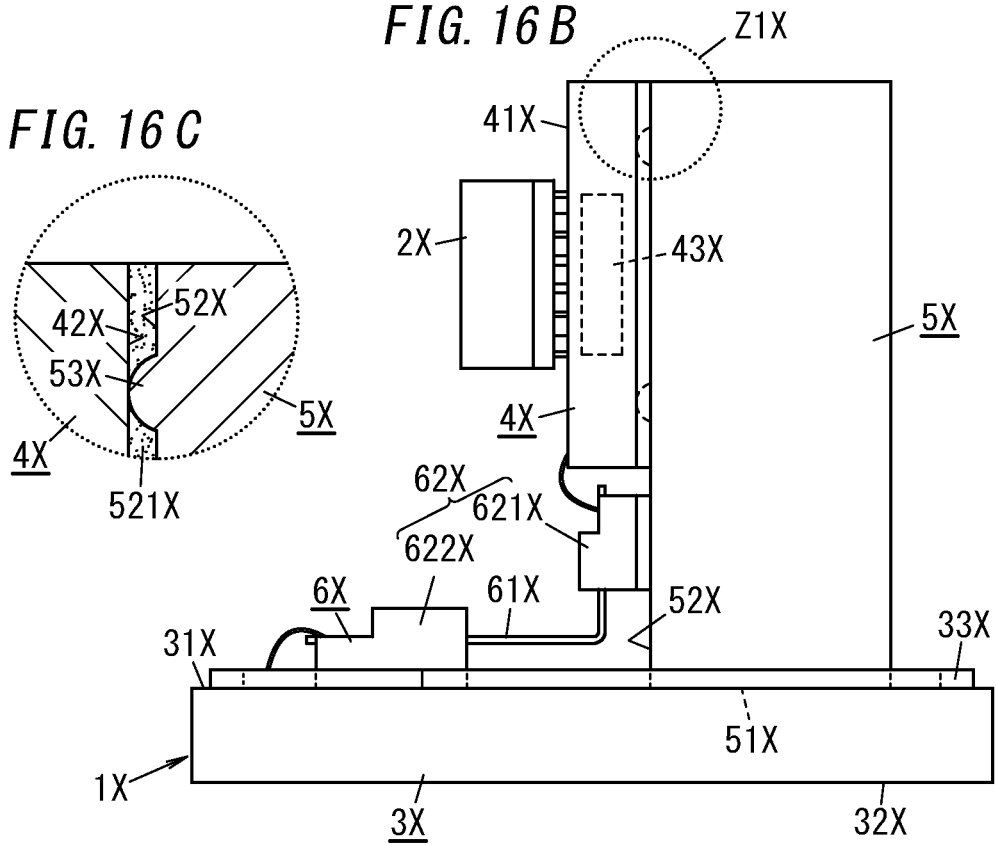

SENSOR DEVICE

CROSS-REFERENCE OF RELATED APPLICATIONS

This application is the U.S. National Phase under 35 U.S.C. § 371 of International Patent Application No. PCT/JP2020/004060, filed on Feb. 2, 2020, which in turn claims the benefit of Japanese Application No. 2019-019086, filed on Feb. 5, 2019, Japanese Application No. 2019-098036, filed on May 24, 2019, and International Patent Application No. PCT/JP2019/027805, filed Jul. 12, 2019, the entire disclosures of which Applications are incorporated by reference herein.

TECHNICAL FIELD

The present disclosure generally relates to a sensor device, and more particularly relates to a sensor device including a sensor element and a substrate supporting the sensor element.

BACKGROUND ART

Patent Literature 1 discloses a sensor device (gyro module) including a sensor element (gyrosensor), a substrate, and a supporting member (supporter) that bonds the sensor element and the substrate together with an adhesive. In this sensor device, a gap is left between the sensor element and the substrate around the supporting member.

In the sensor device of Patent Literature 1, a terminal (external terminal) provided on an outer bottom surface serving as a +Z surface of the sensor element is connected with a bonding wire to a terminal (relay terminal) provided on an adhesive surface serving as a +Z surface of the substrate.

In the sensor device with such a configuration, the bonding wire connects together the respective upper surfaces (i.e., the outer bottom surface and the adhesive surface), arranged to face the same direction (i.e., the +Z direction), of the substrate and the sensor element. Therefore, the bonding wire protrudes from the upper surface (outer bottom surface) of the sensor element, thus tending to increase the height dimension of the sensor device by the bonding wire.

CITATION LIST

Patent Literature

Patent Literature 1: JP 2016-170002 A

SUMMARY OF INVENTION

In view of the foregoing background, it is therefore an object of the present disclosure to provide a sensor device contributing to increasing the degree of freedom with respect to shape or dimensions.

A sensor device according to an aspect of the present disclosure includes a sensor element, a substrate, and a bonding wire. Over the substrate, provided is the sensor element. The bonding wire forms at least part of a connection path that electrically connects the sensor element and the substrate together. The bonding wire is provided to connect two connection surfaces that intersect with each other.

BRIEF DESCRIPTION OF DRAWINGS

FIG. 4A is a plan view of the sensor device;

FIG. 4B is a side view of the sensor device;

FIG. 4C is an enlarged view of a region Z1 shown in FIG. 4B;

FIG. 16A is a plan view of the sensor device;

FIG. 16B is a side view of the sensor device;

FIG. 16C is an enlarged view of a region Z1X shown in FIG. 16B;

DESCRIPTION OF EMBODIMENTS

First Embodiment

(1) Overview

Figure 1A:
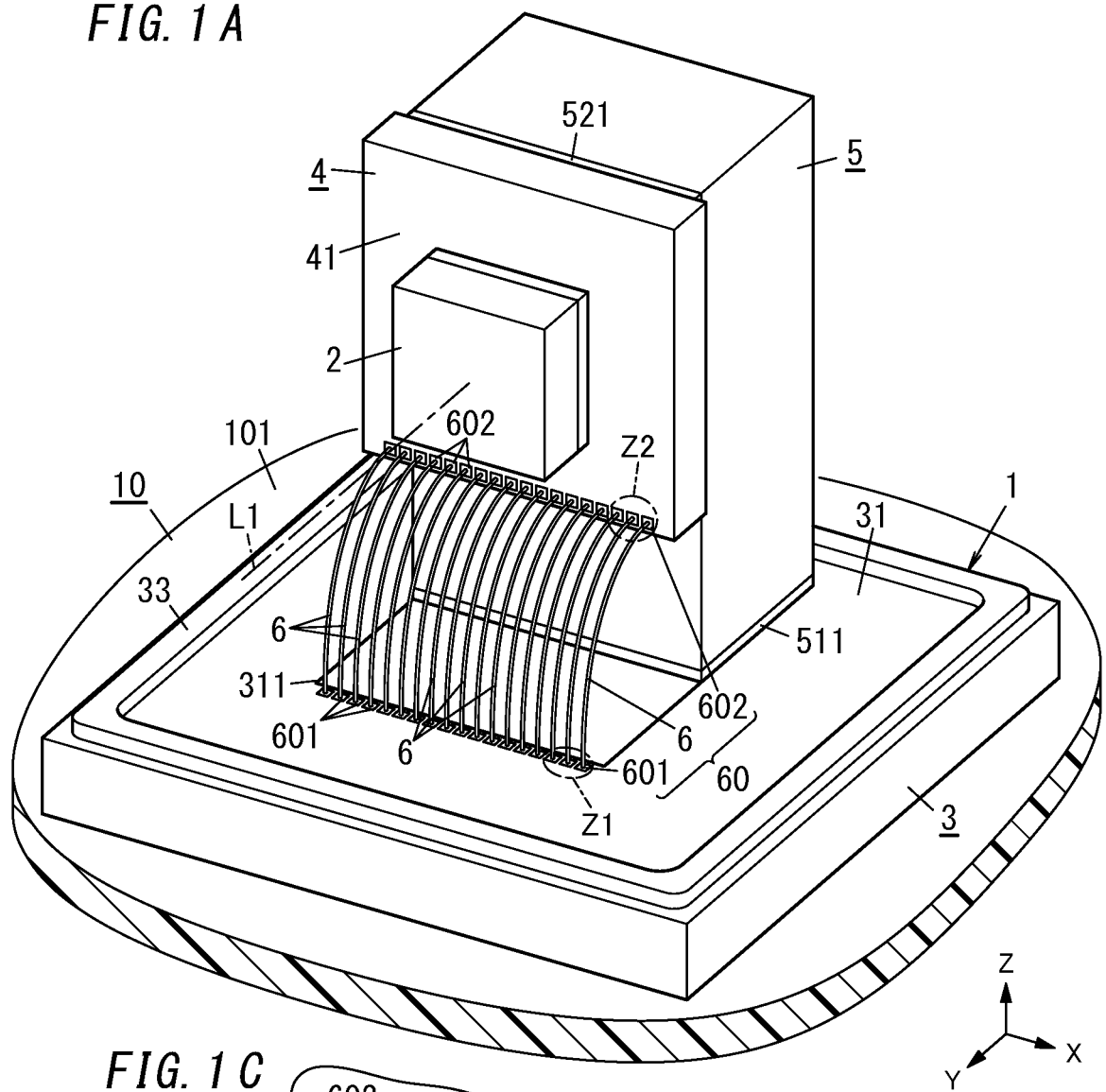
FIG. 1A is a perspective view illustrating a configuration for a sensor device according to a first embodiment, from which a case is removed.
Figure 1C:
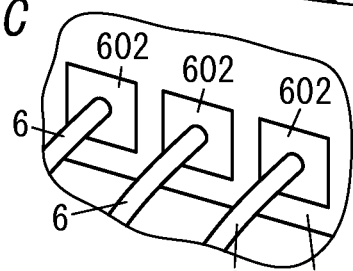
FIG. 1C is an enlarged view of a region Z2 shown in FIG. 1A.
Figure 1B:
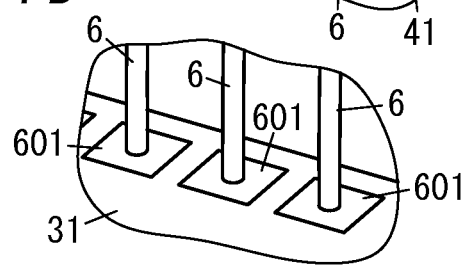
FIG. 1B is an enlarged view of a region Z1 shown in FIG. 1A.

A sensor device 1 according to this embodiment includes a sensor element 2 and a substrate 3 that supports the sensor element 2 as shown in FIGS. 1A-1C. FIG. 1B is an enlarged view of a region Z1 shown in FIG. 1A. FIG. 1C is an enlarged view of a region Z2 shown in FIG. 1A.

In this sensor device 1, the sensor element 2 transforms a physical quantity such as angular velocity, acceleration, angular acceleration, velocity, pressure, weight, length (distance), or temperature into an electrical signal. That is to say, the sensor element 2 functions as a transducer for transforming a physical quantity into an electrical signal. The sensor device 1 of this type may be used in various types of devices including consumer electronic appliances, mobile telecommunications devices, cameras, wearable terminals, and game consoles, and moving vehicles such as vehicles (including automobiles and motorcycles), drones, aircrafts, ships, and boats.

The sensor device 1 according to this embodiment includes not only the sensor element 2 and the substrate 3 but also bonding wires 6 as well as shown in FIGS. 1A-1C. That is to say, the sensor device 1 includes the sensor element 2, the substrate 3, and the bonding wires 6. Over the substrate 3, provided is the sensor element 2. The bonding wires 6 form at least part of a connection path 60 that electrically connects the sensor element 2 to the substrate 3. The bonding wires 6 are provided to connect two connection surfaces (namely, an installation surface 31 and a supporting surface 41) that intersect with each other.

According to this configuration, at least part of the connection path 60 that electrically connects the sensor element 2 and the substrate 3 together is implemented as the bonding wires 6 that connect the two connection surfaces (namely, the installation surface 31 and the supporting surface 41) intersecting with each other. This may reduce, compared to connecting, via the bonding wires 6, two connection surfaces arranged to face the same direction, an increase in the height dimension, for example, of the sensor device 1 due to protrusion of the bonding wires 6 from the connection surface, for example. Consequently, the sensor device 1 according to this embodiment contributes to increasing the degree of freedom with respect to shape or dimensions of the sensor device 1.

In addition, this sensor device 1 facilitates, compared to connecting, with a wiring member such as a lead frame or a flexible flat cable (FFC), two connection surfaces intersecting with each other, reducing the stress applied to the sensor element 2. That is to say, in the sensor device 1 according to this embodiment, the wiring member that connects the two connection surfaces intersecting with each other is the bonding wires 6, thus reducing the chances of the stress being transferred between the two connection surfaces via the wiring member (i.e., the bonding wires 6). This makes the stress much less easily transferrable from the substrate 3, for example, to the sensor element 2, thus reducing the chances of the result of detection by the sensor element 2 being affected by the stress. Furthermore, in the sensor device 1 according to this embodiment, the two connection surfaces intersecting with each other are directly connected together via the bonding wires 6, thus eliminating the need to provide any wiring members other than the bonding wires 6 in order to connect the two connection surfaces together and thereby reducing the number of seams of the connection path 60.

(2) Details

Next, a specific configuration for the sensor device 1 according to this embodiment will be described in detail with reference to FIGS. 1A-6B.

(2.1) Premise

In this embodiment, the sensor device 1 may be implemented as a gyro sensor designed to detect an "angular velocity" (i.e., an angular velocity sensor), for example. The sensor device 1 according to this embodiment is applicable particularly effectively to a situation where the angular velocity needs to be detected (measured) with relatively high accuracy (e.g., when applied to a technique for driving a vehicle). However, this is only an example of the present disclosure and should not be construed as limiting. Naturally, the sensor device 1 according to this embodiment is applicable to even a situation where the angular velocity does not have to be detected (measured) with high accuracy.

In the following description, X-, Y-, and Z-axes that intersect with each other at right angles are set as an example. In particular, an axis aligned with a normal L1 to the supporting surface 41 is supposed to be the Y-axis and an axis aligned with a normal to the installation surface 31 is supposed to be the Z-axis. The X-axis intersects at right angles with both of these Y- and Z-axes. Note that each of the X-, Y-, and Z-axes shown on the drawings is a virtual axis and the arrows designated by X, Y, and Z are shown there just for the sake of convenience of description and are insubstantial ones. It should also be noted that these directions do not define the directions in which the sensor device 1 should be used.

In this embodiment, the sensor device 1 is supposed to use the Y-axis as a detection axis and be designed to detect an angular velocity around the Y-axis as a target. The Y-axis is an axis aligned with a normal L1 to the supporting surface 41. Consequently, the sensor device 1 will detect, as a target, the angular velocity applied to the sensor device 1 itself as the sensor device 1 turns around the normal L1 to the supporting surface 41. That is to say, the sensor element 2 outputs an electrical signal representing the angular velocity around the normal L1 to the supporting surface 41 (i.e., around the Y-axis). This allows the magnitude of the angular velocity around the normal L1 to the supporting surface 41 (i.e., around the Y-axis) to be measured based on the output of the sensor device 1.

As used herein, the "bonding wire" refers to a wiring member for electrically connecting two electrodes together and includes various types of wiring members with different materials and/or wire diameters. For example, bonding wires may be classifiable, according to their material, gold bonding wires, gold-alloy bonding wires, copper bonding wires, aluminum bonding wires, aluminum-silicon bonding wires, silver-alloy bonding wires, and other bonding wires.

(2.2) Overall Configuration for Sensor Device

As described above, the sensor device 1 according to this embodiment includes the sensor element 2, the substrate 3, and the bonding wire(s) 6. The sensor device 1 includes at least one bonding wire 6. In this embodiment, a plurality of (e.g., eighteen in the example illustrated in FIG. 1A) bonding wires 6 are provided. That is to say, the sensor device 1 according to this embodiment includes a plurality of bonding wires 6.

Figure 2:
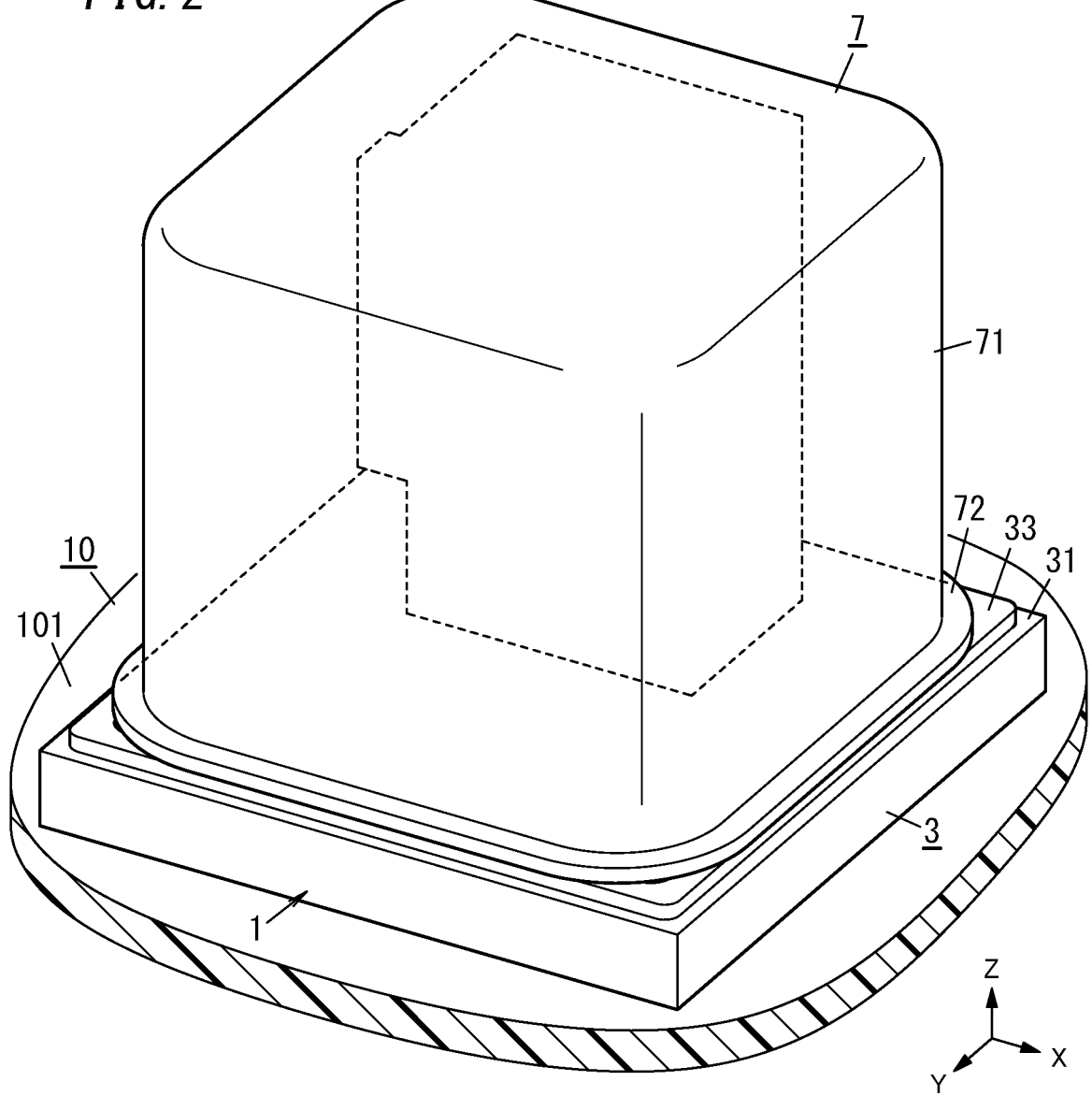
FIG. 2 is a perspective view illustrating a configuration for the sensor device.

Also, in this embodiment, the sensor device 1 includes not only the sensor element 2, the substrate 3, and the bonding wires 6 but also a supporting member 4, a coupling member 5, and a case 7 as well as shown in FIGS. 1A-4C. That is to say, the sensor device 1 includes the sensor element 2, the substrate 3, the supporting member 4, the coupling member 5, the bonding wires 6, and the case 7. In every drawing but FIG. 2, illustration of the case 7 is omitted.

Furthermore, in this embodiment, the sensor device 1 is supposed to be flip-chip bonded, while being used, to a mount board 10 such as a printed wiring board with a surface, opposite from the installation surface 31, of the substrate 3 (i.e., a mounting surface 32 of the substrate 3) facing toward the mount board 10 as shown in FIGS. 1A-2. In this embodiment, the mount board 10 to which the sensor device 1 is mounted is supposed to be a rigid board. However, this is only an example of the present disclosure and should not be construed as limiting. Alternatively, the mount board 10 may also be a flexible board, for example.

The sensor element 2 is an element that outputs an electrical signal representing a physical quantity to be detected. In this embodiment, the physical quantity to be detected is an angular velocity around the Y-axis (i.e., a normal L1 to the supporting surface 41) as described above. Thus, the sensor element 2 outputs an electrical signal representing an angular velocity around the Y-axis. The sensor element 2 may be implemented as, for example, a vibration-type gyro sensor and designed to detect an angular velocity around the Y-axis by using Coriolis force (deflecting force). That is to say, the sensor element 2 detects the angular velocity applied to the sensor element 2 by detecting the Coriolis force produced by external application of rotational force while vibrating a moving portion 21 (see FIG. 6A).

In this embodiment, the sensor element 2 may include, for example, a bare chip to which microelectromechanical systems (MEMS) technology is applied (i.e., a so-called "MEMS chip"). The sensor element 2 may further include, for example, a package such as a ceramic package, in which the bare chip is housed. This sensor element 2 includes the moving portion 21 in the bare chip and may detect the angular velocity by vibrating the moving portion 21. The configuration of the sensor element 2 will be described in further detail later in the "(2.4) Configuration of sensor element" section.

Figure 3:
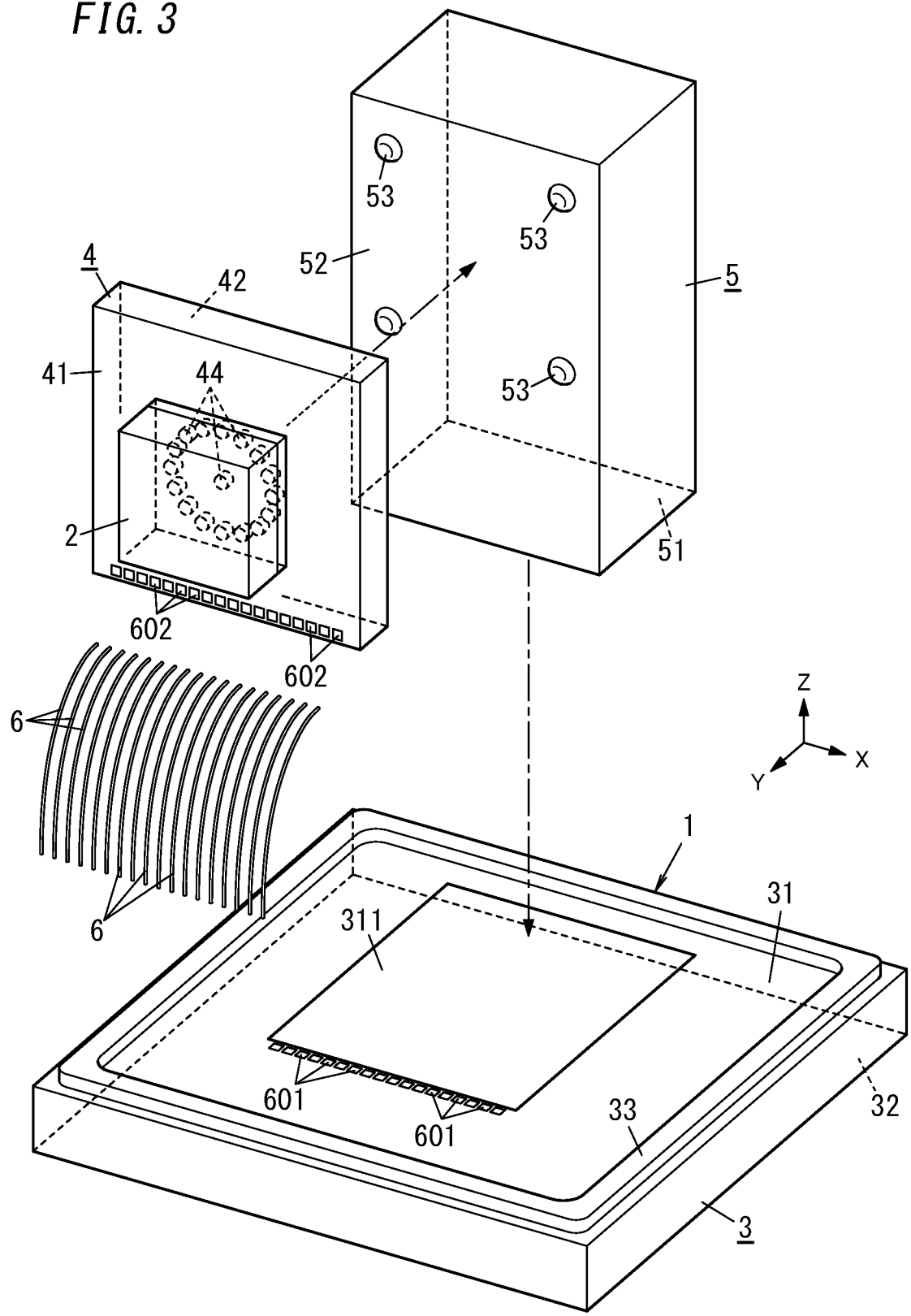
FIG. 3 is an exploded perspective view of the sensor device, from which a case is removed.

As shown in FIG. 3, the substrate 3 is formed in the shape of a flat plate and has thickness in the Z-axis direction. The substrate 3 has, on both sides along its thickness, the installation surface 31 and the mounting surface 32. Specifically, one surface along the thickness of the substrate 3 serves as the installation surface 31 over which the sensor element 2 is provided with the coupling member 5 and the supporting member 4 interposed between them. On the other hand, the other surface along the thickness of the substrate 3 serves as the mounting surface 32 that faces the mount board 10 with the sensor device 1 mounted onto the mount board 10.

In this embodiment, the substrate 3 may have a generally square shape in a plan view, for example. The substrate 3 may be a substrate made of a ceramic, for example, and has electrical insulation properties. The substrate 3 has a rib 33 protruding from the installation surface 31. The rib 33 is provided along outer peripheral edges of the installation surface 31 so as to surround a central area of the installation surface 31 along its circumference. Bonding a flange portion 72 (see FIG. 2) of the case 7 onto a tip surface of the rib 33 allows the case 7 to be bonded onto the substrate 3. Thus, a space for housing the sensor element 2 and other members is formed between an area, located inside the rib 33, of the installation surface 31 and the case 7.

In addition, the substrate 3 also has a metallic region 311 on the installation surface 31. The metallic region 311 may be implemented as a stack of metal layers in which an Ni plating layer and an Au plating layer are stacked in this order on an underlying electrode of aluminum (Al), for example. The metallic region 311 is provided around the central area of the installation surface 31 except the outer peripheral area thereof. The metallic region 311 has a generally rectangular shape in a plan view. Over the metallic region 311 of the installation surface 31, installed is the supporting member 4 via the coupling member 5.

Figure 5:
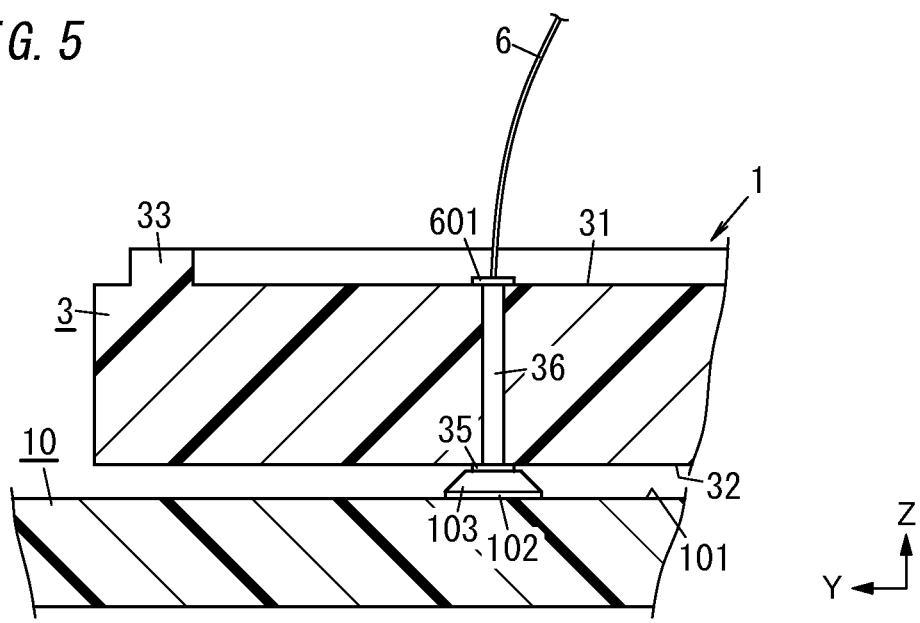
FIG. 5 is a schematic cross-sectional view illustrating a configuration for a principal part of the sensor device.

As will be described in detail later, the substrate 3 includes substrate-end electrodes 601 (see FIG. 1B), back surface electrodes 35 (see FIG. 5), and vias 36 (see FIG. 5). The substrate-end electrodes 601, the back surface electrodes 35, and the vias 36 are made of an electrically conductive material. The substrate-end electrodes 601 are electrodes, to which bonding wires 6 are electrically connected, and are provided on the installation surface 31. That is to say, the substrate 3 includes, on the installation surface 31, the substrate-end electrodes 601, to each of which an associated one of the bonding wires 6 has a one end portion thereof connected. The back surface electrodes 35 are electrodes, to which the mount board 10 is electrically connected, and are provided on the mounting surface 32. The vias 36 electrically connect the substrate-end electrodes 601 and the back surface electrodes 35 to each other. The vias 36 are implemented as through hole vias that run through both surfaces (namely, the installation surface 31 and the mounting surface 32) along the thickness of the substrate 3.

The supporting member 4 is formed in the shape of a flat plate and has thickness in the Y-axis direction as shown in FIG. 3. The supporting member 4 has, as both sides along its thickness, a supporting surface 41 and an attaching surface 42. That is to say, one surface along the thickness of the supporting member 4 serves as the supporting surface 41 on which the sensor element 2 is provided. On the other hand, the other surface, opposite from the supporting surface 41, along the thickness of the supporting member 4 serves as the attaching surface 42 facing the coupling member 5.

In this embodiment, the supporting member 4 may have, for example, a generally square shape in a plan view. In this case, the supporting member 4 is implemented as an application specific integrated circuit (ASIC). That is to say, the supporting member 4 has a configuration in which a semiconductor chip is built in a package with electrical insulation properties such as a resin package. Thus, in this embodiment, the sensor element 2 is mounted on one surface (i.e., the supporting surface 41) of an ASIC package serving as the supporting member 4. In this embodiment, the semiconductor chip functions as a processor circuit 43 (see FIG. 4A) to be described later.

In this embodiment, the supporting member 4 includes electrodes 81 (see FIG. 4A) and supporting-end electrodes 602 (see FIG. 1C). The electrodes 81 are electrodes, to which the sensor element 2 is electrically connected, and are formed on the supporting surface 41. The supporting-end electrodes 602 are electrodes, to which the bonding wires 6 are electrically connected, and are also formed on the supporting surface 41. That is to say, the supporting member 4 has, on the supporting surface 41 thereof, the supporting-end electrodes 602, to each of which one end of an associated one of the bonding wires 6 is connected. In this embodiment, the electrodes 81 and the supporting-end electrodes 602 are provided on the same surface (namely, the supporting surface 41) of the supporting member 4. This allows the sensor element 2 provided on the supporting surface 41 to be electrically connected to the supporting member 4 (processor circuit 43). The supporting member 4 (processor circuit 43) is further electrically connected to the substrate 3 (substrate-end electrodes 601) via the bonding wires 6.

On the supporting surface 41 of the supporting member 4, the sensor element 2 is fixed. As used herein, to "fix" means placing something at a certain position to immobilize it at that position by any of various means. That is to say, the sensor element 2 is immobilized with respect to the supporting surface 41 of the supporting member 4. As a means for fixing the sensor element 2 onto the (supporting surface 41 of the) supporting member 4, any appropriate means such as adhesion, pressure-sensitive adhesion, brazing, welding, or crimping may be adopted. In this embodiment, a means for fixing the sensor element 2 to the (supporting surface 41 of the) the supporting member 4 is adhesion with a silicone-based adhesive. The supporting member 4 is formed such that the sensor element 2 is located inside an outer periphery of the supporting member 4 and the sensor element 2 is fixed onto a central area of the supporting surface 41.

In this embodiment, one or more connection members 44 (see FIG. 3), which may be implemented as metallic bumps of gold (Au) or copper (Cu), for example, are suitably provided between the supporting member 4 and the sensor element 2. In this embodiment, solder bumps made of an AuSn alloy (AuSn solder bumps), for example, may be used as the connection members 44. Thus, supporting the sensor element 2 with the one or more connection members 44 reduces, even when the silicone-based adhesive is deformed, the tilt of the sensor element 2 with respect to the (supporting surface 41 of the) supporting member 4. Also, on the supporting surface 41, the plurality of connection members 44 are more suitably arranged in a circular ring pattern such that one connection member 44, placed on a center axis that passes through the center of the sensor element 2, is surrounded with a plurality of other connection members 44.

The coupling member 5 is formed in a cuboid shape as shown in FIG. 3. In this embodiment, a dimension measured along the Z-axis (i.e., the height) of the coupling member 5 is larger than a dimension measured along the X-axis (i.e., the width) thereof or a dimension measured along the Y-axis (i.e., the depth) thereof. That is to say, the coupling member 5 has a vertically elongated cuboid shape. The coupling member 5 is made of a resin, for example, and has electrical insulation properties. In this embodiment, the coupling member 5 may be made of a liquid crystal polymer (LCP) resin, for example.

The coupling member 5 is a member installed on the installation surface 31 of the substrate 3 to couple the supporting member 4 to the substrate 3. In other words, the supporting member 4 on which the sensor element 2 is provided (mounted) is fixed to the (installation surface 31 of the) substrate 3 via the coupling member 5. Thus, the relative position of the supporting member 4 with respect to the substrate 3 is defined by the coupling member 5. In the sensor device 1 according to this embodiment, the relative position of the supporting member 4 with respect to the substrate 3 is defined such that a normal L1 (see FIG. 1A) to the supporting surface 41 of the supporting member 4 is aligned with the installation surface 31. As used herein, if something "is aligned with" something else, it means that these two things are generally parallel to each other, i.e., these two things may naturally be exactly parallel to each other but may also be arranged to form an angle of at most several degrees (which may be less than 10 degrees, for example) between them. That is to say, the normal L1 to the supporting surface 41 is generally parallel to the installation surface 31 of the substrate 3 (i.e., the normal L1 may be exactly parallel to the installation surface 31 or may also form an angle of at most several degrees with respect to the installation surface 31). In this embodiment, the normal L1 to the supporting surface 41 may be exactly parallel to the installation surface 31 of the substrate 3, for example.

More specifically, the coupling member 5 has a first surface 51 and a second surface 52 as shown in FIG. 3. The first surface 51 is fixed to the installation surface 31 of the substrate 3. The second surface 52 intersects with the first surface 51. The supporting member 4 is fixed to the second surface 52. That is to say, the first surface 51 of the coupling member 5 is immobilized with respect to the installation surface 31 of the substrate 3. In this embodiment, the metallic region 311 is provided on the installation surface 31 as described above, and the coupling member 5 is fixed on the metallic region 311 of the installation surface 31. Likewise, the second surface 52 of the coupling member 5 is immobilized with respect to the attaching surface 42 of the supporting member 4.

As a means for fixing the (first surface 51 of the) coupling member 5 onto the (installation surface 31 of the) substrate 3, any appropriate means such as adhesion, pressure-sensitive adhesion, brazing, welding, or crimping may be adopted, for example. In this embodiment, a means for fixing the (first surface 51 of the) coupling member 5 to the substrate 3 is adhesion with an adhesive layer 511 (see FIG.

1A). Likewise, as a means for fixing the (second surface 52 of the) coupling member 5 onto the (attaching surface 42 of the) supporting member 4, any appropriate means such as adhesion, pressure-sensitive adhesion, brazing, welding, or crimping may be adopted, for example. In this embodiment, a means for fixing the (second surface 52 of the) coupling member 5 to the supporting member 4 is adhesion with an adhesive layer 521 (see FIG. 1A).

In this embodiment, the first surface 51 is one surface along the Z-axis of the coupling member 5 and the second surface 52 is one surface along the Y-axis of the coupling member 5. Since the coupling member 5 has a cuboid shape overall, the first surface 51 and the second surface 52 are generally perpendicular to each other and are adjacent to each other. As used herein, if something is "generally perpendicular to" something else, the two things may naturally be exactly perpendicular to each other (i.e., intersect with each other at right angles (90 degrees)) but may also form an angle of at most 90±several degrees (e.g., less than 10 degrees) between themselves. In this embodiment, the first surface 51 may be exactly perpendicular to the second surface 52, for example.

Thus, fixing the coupling member 5 with such a shape not only to the (installation surface 31 of the) substrate 3 on the first surface 51 but also to the (attaching surface 42 of the) supporting member 4 on the second surface 52 allows the supporting member 4 to be coupled to the substrate 3. In other words, the sensor element 2 provided on the supporting member 4 is indirectly supported by the substrate 3 via the supporting member 4 and the coupling member 5. In this case, the first surface 51 and the second surface 52 intersect with each other (at right angles in this embodiment), and therefore, the supporting member 4 is coupled to the substrate 3 via the coupling member 5 so that a normal L1 to the supporting surface 41 of the supporting member 4 is aligned with (e.g., parallel to in this embodiment) the installation surface 31.

In this embodiment, the adhesive layer 511 (hereinafter also referred to as a "first adhesive layer 511") bonding the coupling member 5 and the substrate 3 together has a larger Young's modulus than the adhesive layer 521 (hereinafter also referred to as a "second adhesive layer 521") bonding the coupling member 5 and the supporting member 4 together. As used herein, the "Young's modulus" refers to a factor of proportionality representing proportionality between stress and strain in an elasticity range where the Hook's law is satisfied and is also called a "vertical modulus of elasticity." Generally speaking, the larger the Young's modulus is, the higher the degree of rigidity of an object is (and the higher the "modulus of elasticity" indicating the degree to which the object is less deformable is). That is to say, as the Young's modulus increases, the object becomes less and less deformable.

That is to say, according to this embodiment, the sensor device 1 includes the coupling member 5 that couples the supporting member 4 to the substrate 3. Thus, the supporting member 4 is installed indirectly over the substrate 3 via the coupling member 5. In addition, the first adhesive layer 511 serving as a means for fixing the coupling member 5 to the substrate 3 has a larger Young's modulus than the second adhesive layer 521 serving as a means for fixing the supporting member 4 to the coupling member 5. In other words, the first adhesive layer 511 provided between the coupling member 5 and the substrate 3 has a higher degree of rigidity, and is less easily deformable, than the second adhesive layer 521 provided between the coupling member 5 and the supporting member 4. Stated otherwise, the second adhesive layer 521 provided between the coupling member 5 and the supporting member 4 has a lower degree of rigidity, and is more easily deformable, than the first adhesive layer 511 provided between the coupling member 5 and the substrate 3.

Providing the first adhesive layer 511 and the second adhesive layer 521 having such relationship allows the coupling member 5 to be firmly fixed onto the substrate 3, thus making stress less easily transferrable from the coupling member 5 to the supporting member 4. This reduces, even if external force produced by an ultrasonic wave, for example, is applied along the Y-axis to the supporting member 4 while the bonding wires 6 are being bonded to the supporting-end electrodes 602, for example, the chances of the coupling member 5 being tilted with respect to the substrate 3. This allows the external force produced by an ultrasonic wave and applied along the Y-axis to the supporting member 4 to be used efficiently for bonding the bonding wires 6 to the supporting-end electrodes 602. In addition, even if stress is applied from the substrate 3 to the coupling member 5, the stress is transferrable much less easily from the coupling member 5 to the supporting member 4, thus making the stress hardly applicable to the sensor element 2. This reduces the chances of the result of detection by the sensor element 2 being affected by the stress.

In addition, the coupling member 5 further includes at least one spacer 53 (see FIG. 3) protruding from a surface, facing the supporting member 4, (i.e., the second surface 52) of the coupling member 5 toward the supporting member 4. In this embodiment, the coupling member 5 includes a plurality of (e.g., four) spacers 53. Each of the spacers 53 may be formed in, for example, a dome shape (hemispherical shape). These (four) spacers 53 may be arranged at respective positions, facing the four corners of the attaching surface 42 of the supporting member 4, for example, on the second surface 52. Providing these spacers 53 allows a certain interval to be left between the second surface 52 of the coupling member 5 and the attaching surface 42 of the supporting member 4 as shown in FIG. 4C.

The height of each spacer 53, i.e., the protrusion height of the spacer 53 from the second surface 52, may fall within the range from 0.05 mm to 0.2 mm, for example. In this embodiment, each spacer 53 may have a height of 0.15 mm, for example. This allows an interval (gap) of 0.15 mm to be left between the second surface 52 of the coupling member 5 and the attaching surface 42 of the supporting member 4.

In this embodiment, as measured along the Z-axis (i.e., along the thickness of the substrate 3), the dimension of the coupling member 5 is larger than that of the supporting member 4 as shown in FIG. 4B. That is to say, the second surface 52 of the coupling member 5 has a larger Z-axis dimension than the attaching surface 42 of the supporting member 4. In addition, the supporting member 4 is arranged to be aligned with the other end, opposite from one end facing the substrate 3, of the second surface 52. This allows a gap G1 to be left between the installation surface 31 of the substrate 3 and the supporting member 4. That is to say, the supporting member 4 is fixed just indirectly to the substrate 3 via the coupling member 5 and is not directly in contact with the substrate 3.

The bonding wires 6 form at least part of a connection path 60 for electrically connecting the sensor element 2 to the substrate 3. In particular, in this embodiment, the bonding wires 6 electrically connects the supporting member 4 to the substrate 3. That is to say, in this embodiment, electrical connection between the (supporting-end electrodes 602 of the) supporting member 4 implemented as an ASIC and the (substrate-end electrodes 601 of the) substrate 3 is established via the bonding wires 6. Specifically, one end portion of each bonding wire 6 is connected to an associated one of the substrate-end electrodes 601 of the substrate 3 and the other end portion of each bonding wire 6 is connected to an associated one of the supporting-end electrodes 602 of the supporting member 4, thus allowing the bonding wires 6 to electrically connect the supporting member 4 to the substrate 3.

The bonding wires 6 are bonded to the substrate-end electrodes 601 and the supporting-end electrodes 602 by either wedge bonding or ball bonding. In this embodiment, the wedge bonding technique, by which the bonding wires 6 are bonded to the electrodes (namely, the substrate-end electrodes 601 and the supporting-end electrodes 602) by applying energy such as an ultrasonic wave or heat to bonding parts, may be adopted, for example.

The connection path 60 for electrically connecting the sensor element 2 to the substrate 3 includes the bonding wires 6, the substrate-end electrodes 601, and the supporting-end electrodes 602. That is to say, the substrate-end electrodes 601 of the substrate 3 are connected to the supporting-end electrodes 602 of the supporting member 4 via the bonding wires 6, and the supporting-end electrodes 602 are connected to an internal circuit (processor circuit 43) of the supporting member 4 implemented as an ASIC. Furthermore, the internal circuit (processor circuit 43) of the supporting member 4 implemented as an ASIC is connected to the sensor element 2 via the connection members 44 implemented as bumps. Thus, the connection path 60 includes not only the bonding wires 6, the substrate-end electrodes 601, and the supporting-end electrodes 602 but also the internal circuit (processor circuit 43) of the supporting member 4 implemented as an ASIC and the connection members 44 as well.

That is to say, in this embodiment, the bonding wires 6 form part of the connection path 60 for electrically connecting the sensor element 2 to the substrate 3 and constitute a path between the (supporting-end electrodes 602 of the) supporting member 4 and the (substrate-end electrodes 601 of the) substrate 3.

In this embodiment the bonding wires 6 are provided to connect together two connection surfaces that are one surface of the substrate 3 and one surface of the supporting member 4 and that intersect with each other. Specifically, the bonding wires 6 connect together the installation surface 31 that is the connection surface of the substrate 3 and the supporting surface 41 that is the connection surface of the supporting member 4.

As can be seen, the sensor device 1 according to this embodiment includes the supporting member 4, which is installed on the substrate 3 with the sensor element 2 provided on the supporting member 4. The sensor element 2 is electrically connected to the substrate 3 via the supporting member 4. One of the two connection surfaces that intersect with each other is one surface of the supporting member 4. Furthermore, in this embodiment, the substrate 3 has the installation surface 31 on which the supporting member 4 is installed as described above. The supporting member 4 has the supporting surface 41 on which the sensor element 2 is provided. In this embodiment, a normal L1 to the supporting surface 41 is aligned with (e.g., parallel to in this embodiment) the installation surface 31. In other words, the supporting surface 41 and the installation surface 31 intersect with each other (at right angles in this embodiment). One of the two connection surfaces intersecting with each other (i.e., one connection surface) is the supporting surface 41 that is one surface of the supporting member 4. The other of the two connection surfaces intersecting with each other (i.e., the other connection surface) is one surface (e.g., the installation surface 31 in this embodiment) of the substrate 3. That is to say, the two connection surfaces, which intersect with each other and which are connected together via the bonding wires 6, are the installation surface 31 that is one surface of the substrate 3 and the supporting surface 41 that is one surface of the supporting member 4.

More specifically, both end portions of each bonding wire 6 are respectively connected to an associated one of the substrate-end electrodes 601 provided on the installation surface 31 of the substrate 3 and an associated one of the supporting-end electrodes 602 provided on the supporting surface 41 of the supporting member 4. That is to say, the substrate 3 includes, on the installation surface 31 serving as one connection surface, the substrate-end electrodes 601, to each of which an associated one of the bonding wires 6 has one end portion thereof connected. The supporting member 4 includes, on the supporting surface 41 serving as the other connection surface, the supporting-end electrodes 602, to each of which an associated one of the bonding wires 6 has the other end portion thereof connected. Also, the two connection surfaces (namely, the installation surface 31 and the supporting surface 41) provided with the substrate-end electrodes 601 and the supporting-end electrodes 602, respectively, intersect with each other. In this embodiment, the two connection surfaces (namely, the installation surface 31 and the supporting surface 41) intersect with each other at generally right angles (e.g., at exactly right angles).

In short, in this embodiment, the two connection surfaces (namely, the installation surface 31 and the supporting surface 41) that intersect with each other (e.g., at right angles in this embodiment) are directly connected together via the bonding wires 6. This makes, compared to a situation where the two connection surfaces (namely, the installation surface 31 and the supporting surface 41) are connected together with a wiring member such as a lead frame or a flexible flat cable, the stress transferrable much less easily between the two connection surfaces. That is to say, in the sensor device 1 according to this embodiment, the wiring member that connects together the two connection surfaces intersecting with each other is the bonding wires 6. Thus, the stress applied from one connection surface is relaxed by the bonding wires 6, and therefore, is hardly transferrable to the other connection surface.

In addition, according to this embodiment, no additional wiring members but the bonding wires 6 are required to connect together the two connection surfaces (namely, the installation surface 31 and the supporting surface 41), thus reducing the number of seams of the connection path 60. That is to say, a configuration, in which each of two connection surfaces intersecting with each other is connected to a lead frame with bonding wires and the two connection surfaces are connected together with at least one pair of bonding wires and the lead frame, requires an additional wiring member other than the bonding wires. In contrast, according to this embodiment, the two connection surfaces are directly connected together via the bonding wires, thus requiring no additional wiring members but the bonding wires 6 and reducing the number of the seams of the connection path 60 as well.

Furthermore, in this embodiment, the supporting-end electrodes 602 are located closer to the substrate 3 than the sensor element 2 is, when viewed from the sensor element 2 on the supporting surface 41. In other words, the supporting-end electrodes 602 are located between an end portion, facing the substrate 3, of the supporting surface 41 (i.e., the lower end portion in FIG. 4B) and the sensor element 2. This makes one end portion of each bonding wire 6 connected to a region, located closer to the substrate 3 than the sensor element 2 is, of the supporting surface 41 as viewed from the sensor element 2. This allows the bonding wires 6 to have a relatively short length. In this case, the gap G1 is left between the supporting member 4 and the installation surface 31 of the substrate 3 as described above. Leaving this gap G1 makes, even though the supporting-end electrodes 602 are located closer to the substrate 3 than the sensor element 2 is, the distance between the supporting-end electrodes 602 and the substrate 3 long enough to avoid interference between the bonding wires 6 and the substrate 3.

In this embodiment, the sensor device 1 includes a plurality of (e.g., eighteen in the example illustrated in FIG. 1A) bonding wires 6 as described above. Each of the two connection surfaces is provided with a plurality of electrodes, to which the plurality of bonding wires 6 are connected. The plurality of electrodes are arranged in line that is parallel to both of the two connection surfaces. In this embodiment, the two connection surfaces to be connected together with the plurality of bonding wires 6 are the installation surface 31 and the supporting surface 41 as described above. Thus, each of the installation surface 31 and the supporting surface 41 is provided with a plurality of electrodes (namely, the substrate-end electrodes 601 or the supporting-end electrodes 602), to which the plurality of bonding wires 6 are connected as shown in FIG. 1A. That is to say, on the installation surface 31 as one connection surface, a plurality of (e.g., eighteen in the example illustrated in FIG. 1A) substrate-end electrodes 601 are provided and arranged along a line (i.e., X-axis) that is parallel to both of the two connection surfaces (namely, the installation surface 31 and the supporting surface 41). Likewise, on the supporting surface 41 as the other connection surface, a plurality of (e.g., eighteen in the example illustrated in FIG. 1A) supporting-end electrodes 602 are provided and arranged along a line (i.e., X-axis) that is parallel to both of the two connection surfaces (namely, the installation surface 31 and the supporting surface 41).

In this manner, the plurality of electrodes (i.e., the substrate-end electrodes 601 or the supporting-end electrodes 602) provided for each of the two connection surfaces (namely, the installation surface 31 and the supporting surface 41) are arranged in line along the X-axis that is parallel to both of the two connection surfaces. Therefore, the plurality of bonding wires 6 that electrically connect the substrate-end electrodes 601 and the supporting-end electrodes 602 are arranged along the X-axis as shown in FIG. 1A. This allows a dispersion in length between the plurality of bonding wires 6 to be reduced eventually.

In addition, on the installation surface 31 of the substrate 3, provided is the metallic region 311 as described above. The plurality of substrate-end electrodes 601 are arranged along one side of the metallic region 311. This allows the plurality of bonding wires 6 to connect, over the metallic region 311, the plurality of substrate-end electrodes 601 and the plurality of supporting-end electrodes 602 together as shown in FIG. 1A. This enables the metallic region 311 to serve as a shield for reducing noise radiated from the bonding wires 6 and noise affecting the bonding wires 6.

The case 7 (see FIG. 2) is bonded to the substrate 3. The case 7 houses at least the sensor element 2 between the installation surface 31 of the substrate 3 and the case 7 itself. The case 7 may be made of a metallic material, for example. The case 7 is fixed to the installation surface 31 of the substrate 3, thus forming, between the case 7 and the installation surface 31 of the substrate 3, a space to house the sensor element 2, the supporting member 4, the coupling member 5, and the bonding wires 6.

As shown in FIG. 2, the case 7 includes a case body 71 and a flange portion 72. The case body 71 is formed in the shape of a box, one surface along the Z-axis of which (i.e., one surface facing the substrate 3) is open. Each corner portion of the case body 71 has a rounded shape with curvature. The flange portion 72 is a portion protruding outward from an outer peripheral edge of the opening of the case body 71. Bonding the flange portion 72 onto the rib 33 of the substrate 3 allows the case 7 to be bonded onto the substrate 3. As a means for fixing (bonding) the case 7 onto the substrate 3, any appropriate means such as adhesion, pressure-sensitive adhesion, brazing, welding, or crimping may be adopted. In this embodiment, a means for fixing the case 7 to the substrate 3 is adhesion.

In this embodiment, the case 7 is hermetically bonded to the substrate 3, thereby forming a hermetically sealed space between the case 7 and the installation surface 31 of the substrate 3. Thus, the sensor element 2 and other members are housed in the hermetically sealed space, thus allowing the sensor device 1 to reduce the chances of the sensor element 2 being affected by humidity, for example.

The sensor device 1 according to this embodiment includes the processor circuit 43 as shown in FIGS. 4A and 4B. In this embodiment, the processor circuit 43 is provided for the ASIC serving as the supporting member 4. The processor circuit 43 performs processing on an electrical signal output from the sensor element 2. In this embodiment, the processor circuit 43 is provided for the supporting member 4. In other words, the supporting member 4 includes the processor circuit 43 for performing processing on the electrical signal output from the sensor element 2.

In this embodiment, the processor circuit 43 converts an analog electrical signal (analog signal) output from the sensor element 2 into a digital signal. The processor circuit 43 performs an appropriate type of processing such as noise reduction and temperature compensation. In addition, the processor circuit 43 further applies a drive signal for driving the sensor element 2 to the sensor element 2.

Optionally, the processor circuit 43 may also perform arithmetic processing such as integration process or differentiation process. For example, making the processor circuit 43 perform integration process on the electrical signal output from the sensor element 2 allows the sensor device 1 to obtain an integral value of the angular velocity around the Y-axis, i.e., the angle around the Y-axis. On the other hand, making the processor circuit 43 perform differentiation process on the electrical signal output from the sensor element 2 allows the sensor device 1 to obtain a differential value of the angular velocity around the Y-axis, i.e., the angular acceleration around the Y-axis.

(2.3) How to Mount to Mount Board

Next, it will be described with reference to FIG. 5 how to mount the sensor device 1 according to this embodiment onto the mount board 10.

As described above, in this embodiment, the sensor device 1 is supposed to be flip-chip bonded onto the mount board 10 with the surface, opposite from the installation surface 31, of the substrate 3 (i.e., the mounting surface 32 of the substrate 3) facing toward the mount board 10 such a printed wiring board. That is to say, the sensor device 1 is mounted onto the mount board 10 with the mounting surface 32 of the substrate 3 arranged to face the one surface 101 of the mount board 10 as shown in FIG. 5.

Specifically, the sensor device 1 is mounted onto the mount board 10 by bonding the back surface electrodes 35, provided on the mounting surface 32 of the substrate 3, onto substrate electrodes 102, provided on the one surface 101 of the mount board 10, with bonding members 103. The bonding members 103 are members with electrical conductivity, which may be gold (Au) bumps or solder, for example. Alternatively, the mounting surface 32 of the substrate 3 and the one surface 101 of the mount board 10 may be mechanically bonded together with an underfilling material, for example.

In this case, the back surface electrodes 35 connected to the mount board 10 (substrate electrodes 102) are continuous via the vias 36 with the substrate-end electrodes 601 provided on the installation surface 31 of the substrate 3. The substrate-end electrodes 601 are further continuous, via the bonding wires 6, with the supporting-end electrodes 602 of the supporting member 4 (see FIG. 1C). Thus, the back surface electrodes 35 connected to the mount board 10 (substrate electrodes 102) are electrically connected to the supporting-end electrodes 602 of the supporting member 4 via the vias 36, the substrate-end electrodes 601, and the bonding wires 6. The supporting member 4 is implemented in this embodiment as an ASIC including the processor circuit 43. Thus, this configuration allows electrical connection to be established between the mount board 10 and the processor circuit 43.

(2.4) Configuration for Sensor Element

Figure 6A:
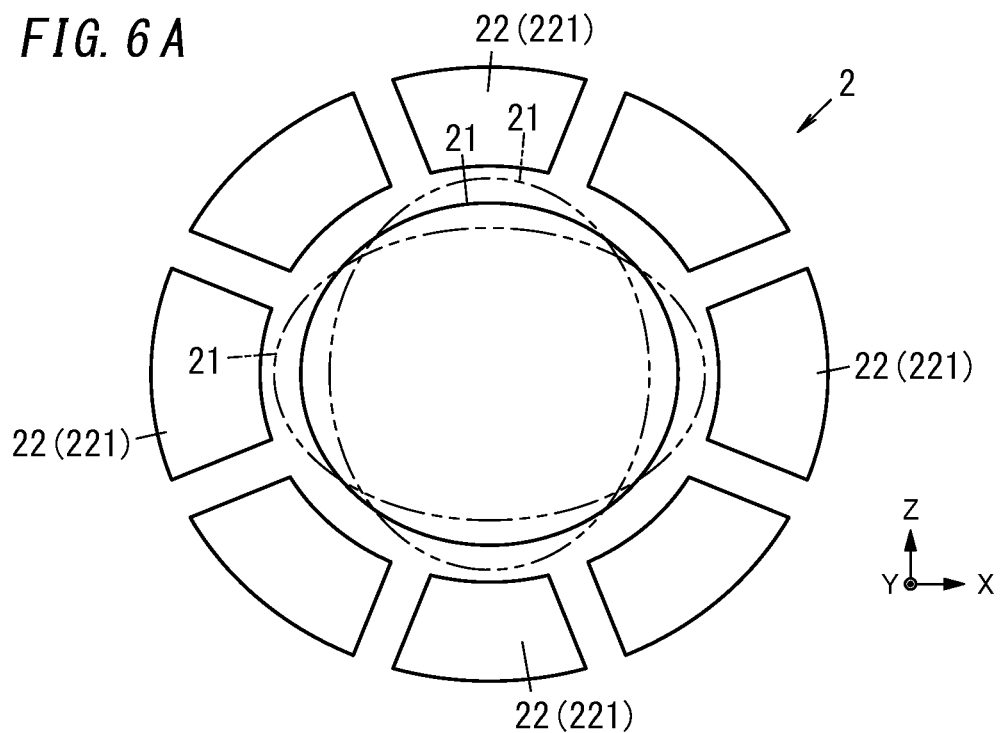
FIGS. 6A and 6B are conceptual diagrams illustrating the operating principle of a sensor element of the sensor device.
Figure 6B:
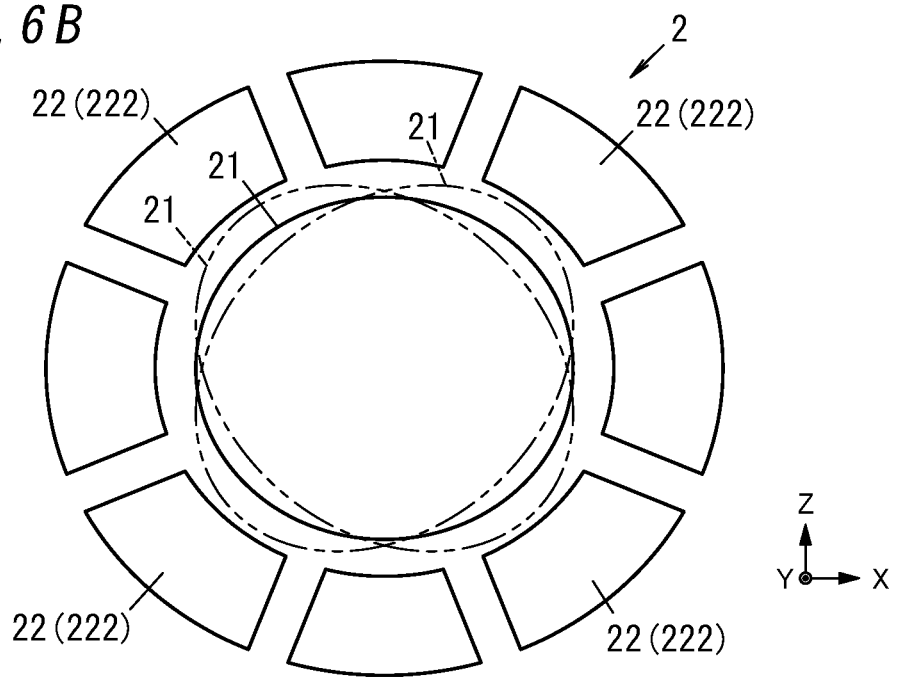

Next, a configuration for the sensor element 2 will be described with reference to FIGS. 6A and 6B. FIGS. 6A and 6B are conceptual diagrams illustrating the operating principle of the sensor element 2.

In this embodiment, the sensor element 2 may be implemented as, for example, a capacitive bulk ultrasonic disk gyroscope to be driven at radio frequencies (falling within the MHz band). This gyroscope (sensor element 2) includes a base plate, a moving portion 21, and a plurality of electrodes 22.

The moving portion 21 is supported over the base plate with an insulating layer interposed between them. The plurality of electrodes 22 are arranged around the moving portion 21 to surround the moving portion 21. A very narrow gap is left between each electrode 22 and the moving portion 21. These electrodes 22 may excite and detect at least two modified bulk ultrasonic resonance modes in the moving portion 21.

The moving portion 21 is a resonator, which is formed in a disk shape, which is circular in a plan view. In this embodiment, the moving portion 21 is made of a non-piezoelectric substance such as single crystalline or polycrystalline silicon and does not have to be made of a piezoelectric material. Alternatively, the moving portion 21 may also be made of a semiconductor such as silicon carbide, gallium nitride, aluminum nitride, or quartz or a metallic material.

The plurality of electrodes 22 includes driving electrodes 221 and detecting electrodes 222. The moving portion 21 is deformed, by precession movement, between the driving mode shown in FIG. 6A and the detection mode shown in FIG. 6B. That is to say, the disklike moving portion 21 vibrates, within a plane perpendicular to the center axis thereof (i.e., an axis parallel to the Y-axis), so as to repeat deformation including alternate expansion and contraction in two orthogonal directions. The sensor element 2 outputs, as an electrical signal, the magnitude of deformation (magnitude of movement) of the moving portion 21. That is to say, the magnitude of the deformation of the moving portion 21 manifests itself as a variation in capacitance between the moving portion 21 and the detecting electrode 222. Thus, the sensor element 2 outputs an electrical signal representing the variation in capacitance.

(2.5) Arrangement of Connection Members

Figure 7:
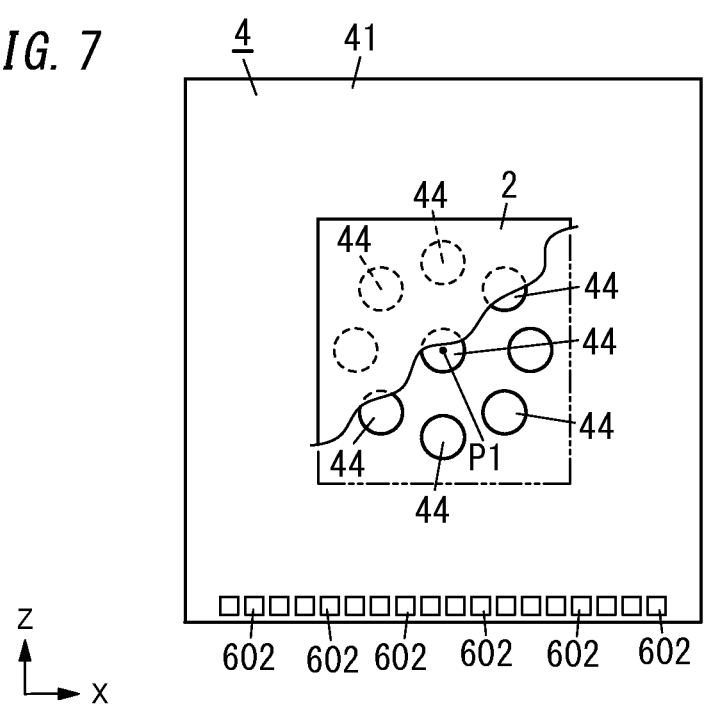
FIG. 7 is a schematic representation illustrating a supporting member of the sensor device as viewed from over a supporting surface thereof.

Next, an arrangement of connection members 44 for connecting the supporting member 4 and the sensor element 2 together will be described with reference to FIG. 7. FIG. 7 is a schematic representation illustrating the supporting member 4 as viewed from over the supporting surface 41 thereof. In FIG. 7, the sensor element 2 is illustrated in a partially cutaway form. In addition, FIG. 7 illustrates the arrangement of the connection members 44 just conceptually. For example, although nine connection members 44 are arranged in FIG. 7 on the supporting surface 41, this does not mean that the number of the connection members 44 has to be nine. Alternatively, seventeen connection members 44 may be arranged on the supporting surface 41 as shown in FIG. 3, for example.

In this embodiment, a plurality of AuSn solder bumps are provided as the connection members 44 between the supporting member 4 and the sensor element 2. In addition, the plurality of (e.g., nine in the example illustrated in FIG. 7) connection members 44 (AuSn solder bumps) are arranged to be point-symmetric at least with respect to the center point P1 of the sensor element 2. That is to say, the plurality of connection members 44 connecting the supporting member 4 and the sensor element 2 together are arranged within the supporting surface 41 to be point-symmetric with respect to the center point P1 of the sensor element 2 as a point of symmetry (i.e., the center of symmetry).

Specifically, when the supporting member 4 is viewed from over the supporting surface 41, one connection member 44 is placed on the center point P1 of the sensor element 2 and a plurality of (e.g., eight in the example illustrated in FIG. 7) connection members 44 are arranged along a circular ring, of which the center is defined by the center point P1. The plurality of connection members 44 are arranged around the center point P1 to form a circular ring pattern, of which the center is defined by the center point P1. Thus, the plurality of connection members 44 that forms the circular ring pattern are arranged to surround the one connection member 44 placed on the center point P1. In addition, the plurality of connection members 44 that forms the circular ring pattern are arranged at regular intervals along the circumference of a circle around the center point P1.

In this embodiment, when the supporting member 4 is viewed from over the supporting surface 41, each of the plurality of (e.g., nine in the example illustrated in FIG. 7) connection members 44 is formed to have a circular shape. In particular, the one connection member 44 placed on the center point P1 is formed to have the shape of a circle, of which the center is defined by the center point P1, such that its shape is also point-symmetric with respect to the center point P1 when the supporting member 4 is viewed from over the supporting surface 41.

Meanwhile, the center point P1 of the sensor element 2 is a point located at the center (or the center of gravity) of a surface, facing the supporting surface 41, of the sensor element 2 (i.e., the surface to be bonded to the supporting member 4). The sensor element 2 outputs an electrical signal representing an angular velocity around a normal L1 (Y-axis), passing through this center point P1, to the supporting surface 41. That is to say, the normal L1 (Y-axis), passing through this center point P1 of the sensor element 2, to the supporting surface 41 is the detection axis of the sensor element 2.

As described above, the sensor device 1 further includes the plurality of connection members 44 that connect the supporting member 4 and the sensor element 2 together. The plurality of connection members 44 are arranged to be point-symmetric with respect to the center point P1 of the sensor element 2. This makes the distribution of the stress transferred from the supporting member 4 to the sensor element 2 via the plurality of connection members 44 point-symmetric with respect to the center point P1. This reduces, even if stress is applied from the mount board 10 to the supporting member 4 via the substrate 3 and the coupling member 5 due to, for example, a difference in coefficient of thermal expansion between the mount board 10 and the substrate 3 (or the supporting member 4 or the coupling member 5), the chances of the result of detection by the sensor element 2 being affected by the stress. That is to say, even if stress is applied from the supporting member 4 to the sensor element 2, the distribution of the stress becomes point-symmetric with respect to the center point P1, thus making the stress applied to the sensor element 2 biased much less significantly with respect to the center point P1 and thereby reducing the chances of the result of detection by the sensor element 2 being affected by the stress.

Furthermore, the plurality of connection members 44 have only to be arranged to be point-symmetric with respect to at least the center point P1 of the sensor element 2. Thus, the plurality of connection members 44 may also be arranged, for example, so as to form at least double circular ring patterns (i.e., two or more concentric ring patterns), of which the center is defined by the center point P1. Furthermore, the connection member 44 does not have to be placed on, but may be omitted from, the center point P1.

(2.6) Electrode Structure

Figure 8A:
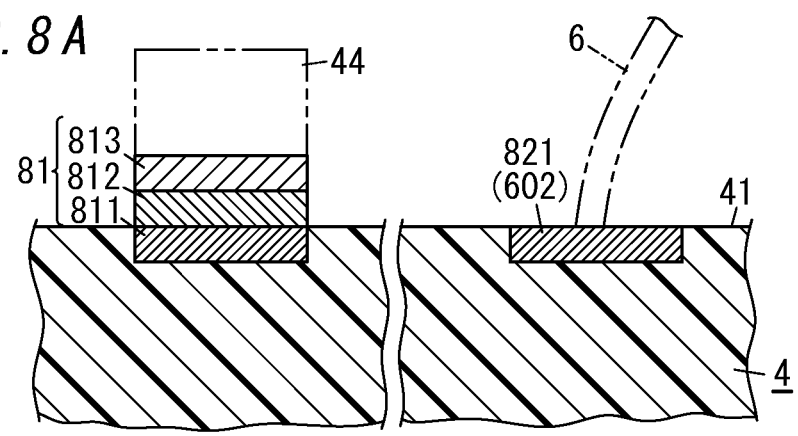
FIG. 8A is a schematic cross-sectional view illustrating a first implementation of an electrode of the supporting member in the sensor device.
Figure 8B:
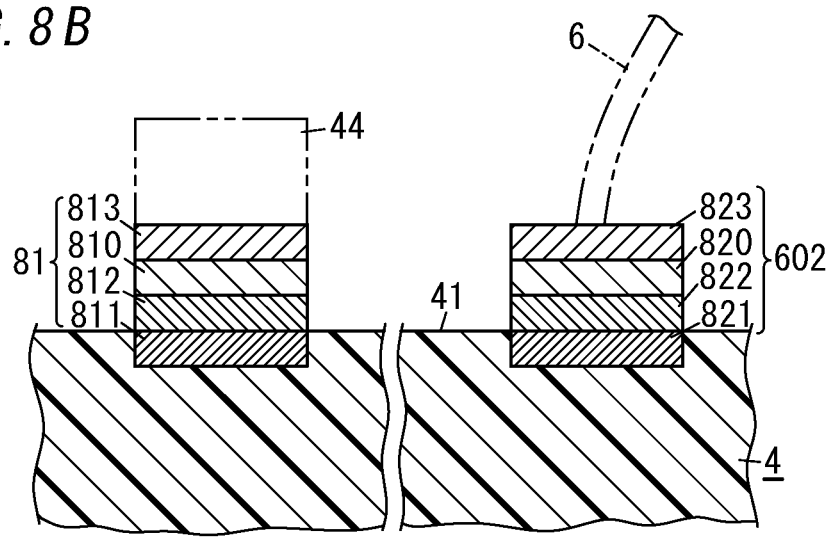
FIG. 8B is a schematic cross-sectional view illustrating a second implementation of an electrode of the supporting member in the sensor device.

Next, the structure of electrodes 81 and supporting-end electrodes 602 provided for the supporting member 4 will be described with reference to FIGS. 8A and 8B. FIG. 8A is a schematic cross-sectional view of a principal part illustrating the structure of one of the electrodes 81 and one of the supporting-end electrodes 602 according to a first implementation. FIG. 8B is a schematic cross-sectional view of a principal part illustrating the structure of one of the electrodes 81 and one of the supporting-end electrodes 602 according to a second implementation. Note that FIGS. 8A and 8B illustrate the schematic structure of the electrode 81 and the supporting-end electrode 602 just conceptually and that the ratio of the dimensions (including thicknesses) of respective constituent elements illustrated on these drawings does not always reflect their actual dimensional ratio.

In this embodiment, the supporting member 4 includes the electrodes 81 for electrically connecting the sensor element 2 to the supporting member 4 (hereinafter referred to as a "sensor-connecting electrodes"); and the supporting-end electrodes 602 for electrically connecting the substrate 3 to the supporting member 4 via the bonding wires 6. All of these electrodes 81 and supporting-end electrodes 602 are arranged on the supporting surface 41 of the supporting member 4. In particular, in this embodiment, the supporting member 4 is implemented as an ASIC including the processor circuit 43. Thus, to electrically connect the sensor element 2 and the substrate 3 to the processor circuit 43, the electrodes 81 and the supporting-end electrodes 602 are provided for the supporting member 4.

The sensor-connecting electrodes 81 are connected to the sensor element 2 via the connection members 44. The supporting-end electrodes 602 are connected to the substrate-end electrodes 601 via the bonding wires 6. That is to say, AuSn solder bumps serving as the connection members 44 are connected to the sensor-connecting electrodes 81 and the bonding wires 6 are connected to the supporting-end electrodes 602. A plurality of sensor-connecting electrodes 81 are provided to be associated one to one with the plurality of connection members 44. A plurality of supporting-end electrodes 602 are provided to be associated one to one with the plurality of bonding wires 6 (see FIG. 7). That is to say, a plurality of electrodes 81 and a plurality of supporting-end electrodes 602 are provided for the supporting member 4.

For this type of electrodes 81 and supporting-end electrodes 602 (in particular, the electrodes 81 serving as the sensor-connecting electrodes), an electrode having a structure in which an Ni plating layer and an Au plating layer are stacked in this order on an underlying electrode of aluminum (Al), for example, is sometimes adopted. Thus, for the sensing-connecting electrodes 81, under bump metal (UBM) for forming an AuSn solder bump is provided on an underlying electrode 811.

In this case, the step of connecting the supporting member 4 to the sensor element 2 includes a heating process step of heating the connection members 44 to melt AuSn solder bumps serving as the connection members 44. In this heating process step, to melt the AuSn solder bumps, the electrodes 81 and the supporting-end electrodes 602 are also heated to a high temperature (of about 350° C., for example). At this time, nickel (Ni) in the Ni plating layer of the supporting-end electrodes 602 could precipitate and be oxidized on the surface of the Au plating layer. The nickel oxidized on the surface of the Au plating layer could obstruct connection of the bonding wires 6, thus possibly causing a decrease in the bond strength between the bonding wires 6 and the supporting-end electrodes 602. More specifically, if the bonding wires 6 are connected to the supporting-end electrodes 602 by ball bonding, then the bond strength between a ball (Au ball) provided at the tip of each bonding wire 6 and an associated one of the supporting-end electrodes 602 decreases. If the bonding wires 6 are connected to the supporting-end electrodes 602 by wedge bonding, then the bond strength between each bonding wire 6 and an associated one of the supporting-end electrodes 602 decreases.

The sensor device 1 according to this embodiment adopts the configurations shown in FIGS. 8A and 8B for the electrodes 81 and the supporting-end electrodes 602 to reduce the chances of causing such a decrease in bond strength between the bonding wires 6 and the (supporting-end electrodes 602 of the) supporting member 4.

According to the first implementation, each supporting-end electrode 602 includes an underlying electrode 821 alone as shown in FIG. 8A. That is to say, the supporting-end electrode 602 for electrically connecting the substrate 3 to the supporting member 4 via the bonding wire 6 has no plating layers and includes the underlying electrode 821 alone. On the other hand, each sensor-connecting electrode 81 includes an underlying electrode 811, an Ni plating layer 812, and an Au plating layer 813. In this embodiment, both the underlying electrode 821 and the underlying electrode 811 may be made of aluminum (Al), for example. In the sensor-connecting electrode 81, the Ni plating layer 812 and the Au plating layer 813 are stacked in this order on the underlying electrode 811. That is to say, the Ni plating layer 812 is formed on the underlying electrode 811 and the Au plating layer 813 is formed on the Ni plating layer 812.

That is to say, according to the first implementation shown in FIG. 8A, the supporting member 4 includes the sensor-connecting electrodes 81, to which the sensor element 2 is electrically connected, and the supporting-end electrodes 602, to which the substrate 3 is electrically connected. Each sensor-connecting electrode 81 includes the underlying electrode 811 and the plating layers (namely, the Ni plating layer 812 and the Au plating layer 813). Each supporting-end electrode 602 includes the underlying electrode 821 alone. As can be seen, the plating layers (including the Ni plating layer 812 and the Au plating layer 813) are formed on the underlying electrode 811 in only one type of electrodes (namely, the electrodes 81), out of the electrodes 81 and supporting-end electrodes 602 of the supporting member 4, and no plating layers are provided on the underlying electrode 821 for the other type of electrodes (namely, the supporting-end electrodes 602). This prevents, even if the electrodes 81 and the supporting-end electrodes 602 are heated in the heating process step described above, nickel (Ni) in the Ni plating layer from precipitating on the surface of any supporting-end electrode 602 with no plating layers. Thus, the first implementation reduces the chances of causing a decrease in bond strength between the bonding wires 6 and the supporting-end electrodes 602. In addition, forming the plating layers (including the Ni plating layer 812 and the Au plating layer 813) on the underlying electrode 811 allows UBM for forming AuSn solder bumps (connection members 44) to be provided for the sensor-connecting electrodes 81.

According to the second implementation, each sensor-connecting electrode 81 and each supporting-end electrode 602 both include a barrier layer 810, 820 as shown in FIG. 8B.

In the second implementation, the sensor-connecting electrode 81 includes not only the underlying electrode 811, the Ni plating layer 812, and the Au plating layer 813 but also the barrier layer 810 as well. The barrier layer 810 is arranged between the Ni plating layer 812 and the Au plating layer 813. In the sensor-connecting electrode 81, the Ni plating layer 812, the barrier layer 810, the Au plating layer 813 are stacked in this order on the underlying electrode 811. That is to say, the Ni plating layer 812 is formed on the underlying electrode 811 of aluminum (Al), and the Au plating layer 813 is formed over the Ni plating layer 812 with the barrier layer 810 interposed between them. The barrier layer 810 arranged between the Ni plating layer 812 and the Au plating layer 813 reduces diffusion of nickel (Ni) from the Ni plating layer 812 to the Au plating layer 813. In this embodiment, the barrier layer 810 may be made of, for example, palladium (Pd) or a palladium alloy.

According to the second implementation, the same configuration as that of the sensor-connecting electrode 81 is adopted for the supporting-end electrode 602. Specifically, the supporting-end electrode 602 includes not only the underlying electrode 821, an Ni plating layer 822, and an Au plating layer 823 but also the barrier layer 820 as well. The barrier layer 820 is arranged between the Ni plating layer 822 and the Au plating layer 823. In the supporting-end electrode 602, the Ni plating layer 822, the barrier layer 820, the Au plating layer 823 are stacked in this order on the underlying electrode 821. That is to say, the Ni plating layer 822 is formed on the underlying electrode 821 of aluminum (Al), and the Au plating layer 823 is formed over the Ni plating layer 822 with the barrier layer 820 interposed between them. The barrier layer 820 arranged between the Ni plating layer 822 and the Au plating layer 823 reduces diffusion of nickel (Ni) from the Ni plating layer 822 to the Au plating layer 823. In this embodiment, the barrier layer 820 may be made of, for example, palladium (Pd) or a palladium alloy.

In this embodiment, the Ni plating layer 812 may have a thickness falling within the range from 1 μm to 10 μm, for example. The Ni plating layer 812 suitably has a thickness equal to or greater than 3 μm but equal to or less than 8 μm. In this embodiment, the Ni plating layer 812 has a thickness of 5 μm, for example. The barrier layer 810 may have a thickness falling within the range from 0.01 μm to 1.0 μm, for example. The barrier layer 810 suitably has a thickness equal to or greater than 0.05 μm but equal to or less than 0.5 μm. In this embodiment, the barrier layer 810 has a thickness of 0.2 μm, for example. The Au plating layer 813 may have a thickness falling within the range from 0.01 μm to 1.0 μm, for example. The Au plating layer 813 suitably has a thickness equal to or greater than 0.05 μm but equal to or less than 0.5 μm. In this embodiment, the Au plating layer 813 has a thickness of 0.15 μm, for example. The Ni plating layer 822, barrier layer 820, and Au plating layer 823 of the supporting-end electrode 602 may have the same thicknesses as the Ni plating layer 812, barrier layer 810, and Au plating layer 813, respectively, of the sensor-connecting electrode 81.

That is to say, according to the second implementation shown in FIG. 8B, the supporting member 4 includes the sensor-connecting electrodes 81, to which the sensor element 2 is electrically connected, and the supporting-end electrodes 602, to which the substrate 3 is electrically connected. Each of the sensor-connecting electrodes 81 and supporting-end electrodes 602 includes the underlying electrode 811, 821, the Ni plating layer 812, 822, the Au plating layer 813, 823, and the barrier layer 810, 820. On the underlying electrode 811 812, the Ni plating layer 812, 822, the barrier layer 810, 820, and the Au plating layer 813, 823 are stacked one on top of another in this order. As can be seen, each electrode 81 (or 602) of the supporting member 4 includes the barrier layer 810 (or 820) between the Ni plating layer 812 (or 822) and the Au plating layer 813 (or 823). Thus, the barrier layer 810 (or 820) reduces diffusion of nickel (Ni) from the Ni plating layer 812 (or 822) toward the Au plating layer 813 (or 823). This allows, even when the electrodes 81 and the supporting-end electrodes 602 are heated in the heating process step, the barrier layer 810 (or 820) to reduce the diffusion of nickel (Ni), thus reducing the chances of nickel (Ni) precipitating on the surface of the Au plating layer 813 (or 823). Thus, the second implementation reduces the chances of causing a decrease in bond strength between the bonding wires 6 and the supporting-end electrodes 602. Furthermore, forming the plating layers (including the Ni plating layer 812 and the Au plating layer 813) on the underlying electrode 811 allows UBM for forming AuSn solder bumps (connection members 44) to be provided for the sensor-connecting electrodes 81 as well.

(2.7) Electrode Structure of Sensor Element

Figure 9A:
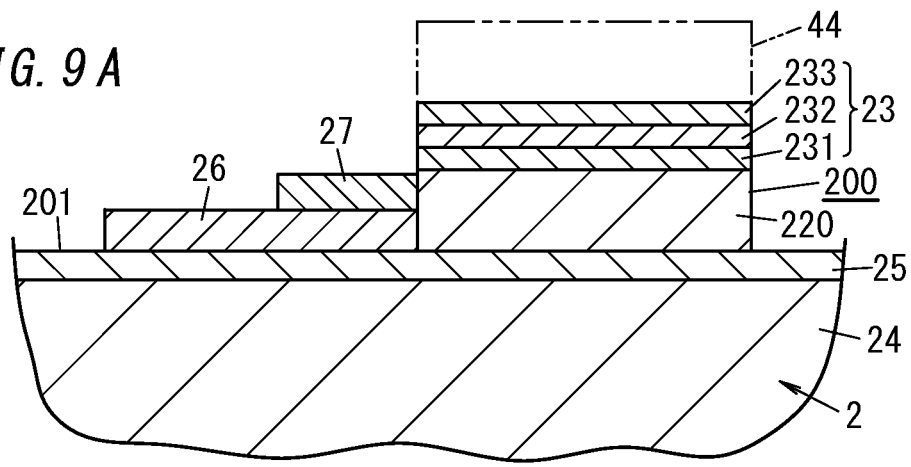
FIG. 9A is a schematic cross-sectional view illustrating an element electrode of the sensor element of the sensor device.
Figure 9B:
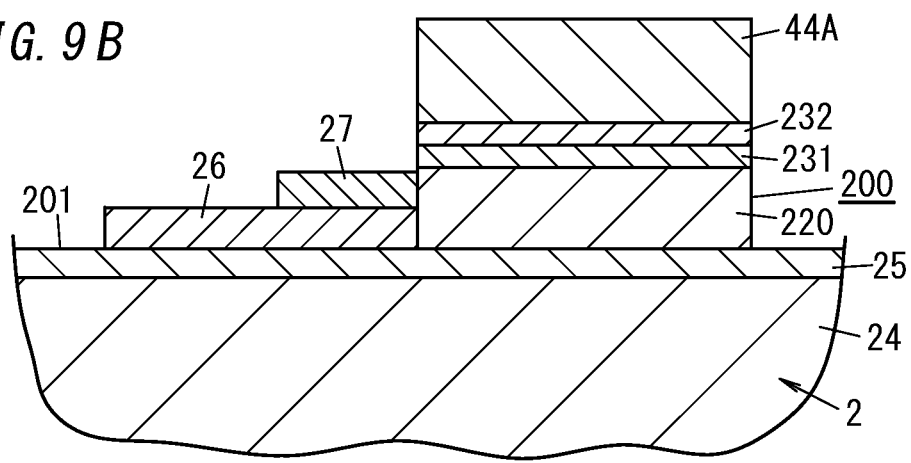
FIG. 9B is a schematic cross-sectional view illustrating the element electrode of the sensor element of the sensor device that has been subjected to a heating process step.
Figure 9C:
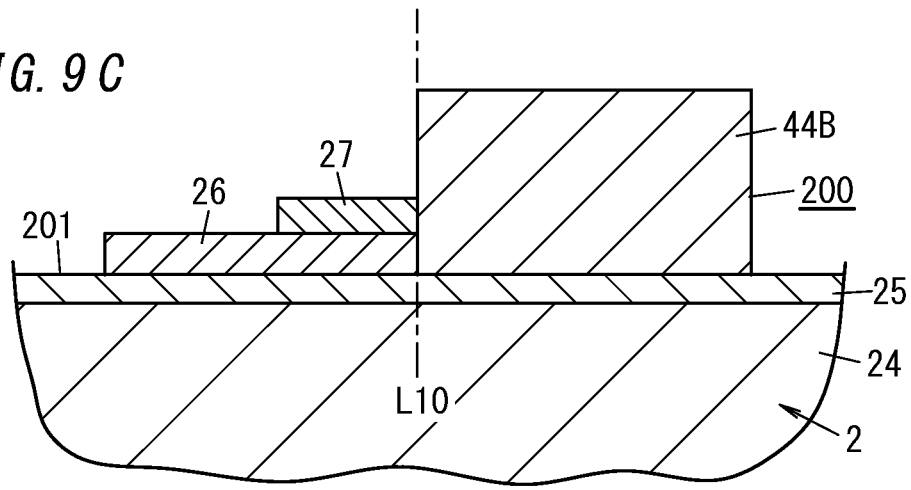
FIG. 9C is a schematic cross-sectional view illustrating an element electrode of a sensor element according to a comparative example that has been subjected to the heating process step.

Next, the structure of an element electrode 200 provided for the sensor element 2 will be described with reference to FIGS. 9A-9C. FIG. 9A is a schematic cross-sectional view of a principal part of the sensor element 2 according to this embodiment, illustrating the structure of the element electrode 200 before the sensor element 2 is connected to the supporting member 4. FIG. 9B is a schematic cross-sectional view of a principal part of the sensor element 2 according to this embodiment, illustrating the structure of the element electrode 200 after the sensor element 2 is connected to the supporting member 4. FIG. 9C is a schematic cross-sectional view of a principal part of a sensor element 2 according to a comparative example, illustrating the structure of the element electrode 200 thereof. Note that FIGS. 9A-9C illustrate the schematic structures of the element electrode 200 just conceptually and that the ratio of the dimensions (including thicknesses) of respective constituent elements illustrated on these drawings does not always reflect their actual dimensional ratio.

In this embodiment, the sensor element 2 is formed in a flat plate shape and has thickness in the Y-axis direction. The sensor element 2 has an electrode surface 201 on one surface (facing the supporting member 4) along the thickness thereof. That is to say, the sensor element 2 is connected to the supporting member 4 with the electrode surface 201 facing the supporting member 4.

The element electrode 200 is connected to one of the sensor-connecting electrodes 81 of the supporting member 4 via one of the connection members 44. That is to say, an AuSn solder bump serving as the connection member 44 is connected to the element electrode 200. A plurality of element electrodes 200 are provided to be associated one to one with the plurality of connection members 44 (see FIG. 7). That is to say, the sensor element 2 is provided with a plurality of element electrodes 200.

Meanwhile, the sensor element 2 according to this embodiment includes a so-called "MEMS chip," which is a bare chip that utilizes the MEMS technology. As shown in FIG. 9A, the sensor element 2 includes a substrate 24 of silicon (Si) and a first oxide film 25 of $SiO_2$ formed in a surface region of the substrate 24. The sensor element 2 uses the surface of the first oxide film 25 as the electrode surface 201 and includes a plurality of element electrodes 200 on the electrode surface 201. The sensor element 2 further includes: a second oxide film 26 of $SiO_2$, which is provided on the electrode surface 201 to be adjacent to the element electrode 200; and a nitride film 27 of SiN stacked on the second oxide film 26.

In this embodiment, the element electrode 200 of the sensor element 2 includes: an Au electrode layer 220 formed on the electrode surface 201; and a UBM layer 23 stacked on the Au electrode layer 220 as shown in FIG. 9A. The UBM layer 23 is an under bump metal (UBM) for use to form the connection member 44 as an AuSn solder bump over the Au electrode layer 220. According to this configuration, in the element electrode 200 of the sensor element 2, the connection member 44 is not stacked directly on the Au electrode layer 220 but is stacked indirectly via the UBM layer 23.

The UBM layer 23 may include, for example, an Ni plating layer 231, a barrier layer 232, and an Au plating layer 233. The barrier layer 232 is arranged between the Ni plating layer 231 and the Au plating layer 233. In the element electrode 200, the Ni plating layer 231, the barrier layer 232, and the Au plating layer 233 are stacked in this order on the Au electrode layer 220. That is to say, the Ni plating layer 231 is formed on the Au electrode layer 220 of gold (Au), and the Au plating layer 233 is formed over the Ni plating layer 231 with the barrier layer 232 interposed between them. The barrier layer 232 interposed between the Ni plating layer 231 and the Au plating layer 233 reduces diffusion of nickel (Ni) from the Ni plating layer 231 toward the Au plating layer 233. In this embodiment, the barrier layer 232 may be made of, for example, palladium (Pd) or a palladium alloy. Nevertheless, the UBM layer 23 serving as the barrier layer 232 is not an essential constituent element but may be omitted as appropriate.

In this embodiment, the coefficient of thermal expansion (coefficient of linear expansion) of the UBM layer 23 has a value between the coefficient of thermal expansion (coefficient of linear expansion) of the connection members 44 of AuSn and the coefficient of thermal expansion (coefficient of linear expansion) of the second oxide film 26 of $SiO_2$. For example, suppose AuSn (connection member 44) has a coefficient of thermal expansion of 17.5 ppm/° C. and $SiO_2$ (second oxide film 26) has a coefficient of thermal expansion of 0.5 ppm/° C. In that case, the coefficient of thermal expansion of the UBM layer 23 is greater than 0.5 ppm/° C. but less than 17.5 ppm/° C. Specifically, the Ni plating layer 231 as a constituent member of the UBM layer 23 has a coefficient of thermal expansion of 12 ppm/° C. and the Au plating layer 233 as another constituent member of the UBM layer 23 has a coefficient of thermal expansion of 14.2 ppm/° C.

Also, the Ni plating layer 231 may have a thickness falling within the range from 1 μm to 10 μm, for example. The Ni plating layer 231 suitably has a thickness equal to or greater than 3 μm but equal to or less than 8 μm. In this embodiment, the Ni plating layer 231 may have a thickness of, for example, 5 μm. The barrier layer 232 may have a thickness falling within the range from 0.01 μm to 1.0 μm, for example. The barrier layer 232 suitably has a thickness equal to or greater than 0.05 μm but equal to or less than 0.5 μm. In this embodiment, the barrier layer 232 may have a thickness of, for example, 0.2 μm. The Au plating layer 233 may have a thickness falling within the range from 0.01 μm to 1.0 μm, for example. The Au plating layer 233 suitably has a thickness equal to or greater than 0.05 μm but equal to or less than 0.5 μm. In this embodiment, the Au plating layer 233 may have a thickness of, for example, 0.15 μm.

Adopting such an element electrode 200 structure including the UBM layer 23 for the sensor element 2 would achieve the advantage of reducing the stress applied to the first oxide film 25. In the following description, with a configuration in which the element electrode 200 includes no UBM layer 23 regarded as a comparative example (see FIG. 9C), the advantage to be achieved by the structure of the element electrode 200 for the sensor element 2 according to this embodiment will be described in comparison with the comparative example. The comparative example shown in FIG. 9C is supposed to have the same configuration as the sensor element 2 according to this embodiment except that the element electrode 200 includes no UBM layer 23.

Specifically, as already described in the "(2.6) Electrode structure" section, the step of connecting the supporting member 4 to the sensor element 2 includes a heating process step of heating the connection members 44 to melt AuSn solder bumps serving as the connection members 44. In this heating process step, to melt the AuSn solder bumps, the element electrodes 200 is also heated to a high temperature (of about 350° C., for example).

In the comparative example, no UBM layer 23 is provided and the connection members 44 of AuSn are stacked directly on the Au electrode layer 220. Thus, in the heating process step, Au in the Au electrode layer 220 diffuses to join AuSn in the connection members 44 to form an AuSn layer 44B (see FIG. 9C). Therefore, in the comparative example, after the heating process step, no Au electrode layer 220 appears to be present in the element electrode 200 but only the AuSn layer 44B is present as shown in FIG. 9C. Then, on the surface, serving as the electrode surface 201, of the first oxide film 25, the second oxide film 26 of $SiO_2$ and the AuSn layer 44B will be formed adjacent to each other. In this case, since there is a relative significant difference in coefficient of thermal expansion between the second oxide film 26 having a coefficient of thermal expansion of 0.5 ppm/° C. and the AuSn layer 44B having a coefficient of thermal expansion of 17.5 ppm/° C., stress is applied to the first oxide film 25. That is to say, stress tends to be concentrated on a region, located around the boundary L10 between the second oxide film 26 and the AuSn layer 44B, of the first oxide film 25 of SiO$_2$. This could cause a crack depending on the condition.

On the other hand, in the sensor element 2 according to this embodiment, the connection member 44 of AuSn is stacked indirectly over the Au electrode layer 220 with the UBM layer 23 interposed between them as shown in FIG. 9A. Thus, in the heating process step, Au in the Au plating layer 233 of the UBM layer 23 diffuses to join AuSn in the connection member 44 to form an AuSn layer 44A (see FIG. 9B). Thus, in this embodiment, after the heating process step, no Au plating layer 233 appears to be present on the element electrode 200 but the Au electrode layer 220, the Ni plating layer 231, the barrier layer 232, and the AuSn layer 44A are present as shown in FIG. 9B. Then, on the surface, serving as the electrode surface 201, of the first oxide film 25, the second oxide film 26 of SiO$_2$ and the Au electrode layer 220 will be formed adjacent to each other. In this case, there is a difference in coefficient of thermal expansion between the second oxide film 26 having a coefficient of thermal expansion of 0.5 ppm/° C. and the Au electrode layer 220 with a coefficient of thermal expansion of 14.2 ppm/° C. However, the difference is less significant than in the comparative example. Furthermore, the Ni plating layer 231 having a coefficient of thermal expansion of 12 ppm/° C. is present on the Au electrode layer 220 having a coefficient of thermal expansion of 14.2 ppm/° C., and the AuSn layer 44A having a coefficient of thermal expansion of 17.5 ppm/° C. is present over the Ni plating layer 231. Consequently, the difference in coefficient of thermal expansion on the electrode surface 201 is less significant than in the comparative example, thus reducing the stress applied to the first oxide film 25 and thereby reducing the chances of causing a crack or any other defects in the first oxide film 25 of SiO$_2$.

Optionally, an underlying electrode of aluminum (Al) or copper (Cu), for example, may be interposed between the electrode surface 201 and the Au electrode layer 220. That is to say, in the element electrode 200, the Au electrode layer 220 does not have to be stacked directly on the electrode surface 201 but may be stacked indirectly over the electrode surface 201 with an underlying electrode interposed between them.

(3) Variations

Note that the first embodiment described above is only an exemplary one of various embodiments of the present disclosure and should not be construed as limiting. The drawings that have been referred to in the foregoing description of the first embodiment are all schematic representations. That is to say, the ratio of the dimensions (including thicknesses) of respective constituent elements illustrated on the drawings does not always reflect their actual dimensional ratio. Rather, the first embodiment may be readily modified in various manners depending on a design choice or any other factor without departing from the scope of the present disclosure. Note that the variations to be described below may be adopted in combination as appropriate.

(3.1) First Variation

Figure 10:
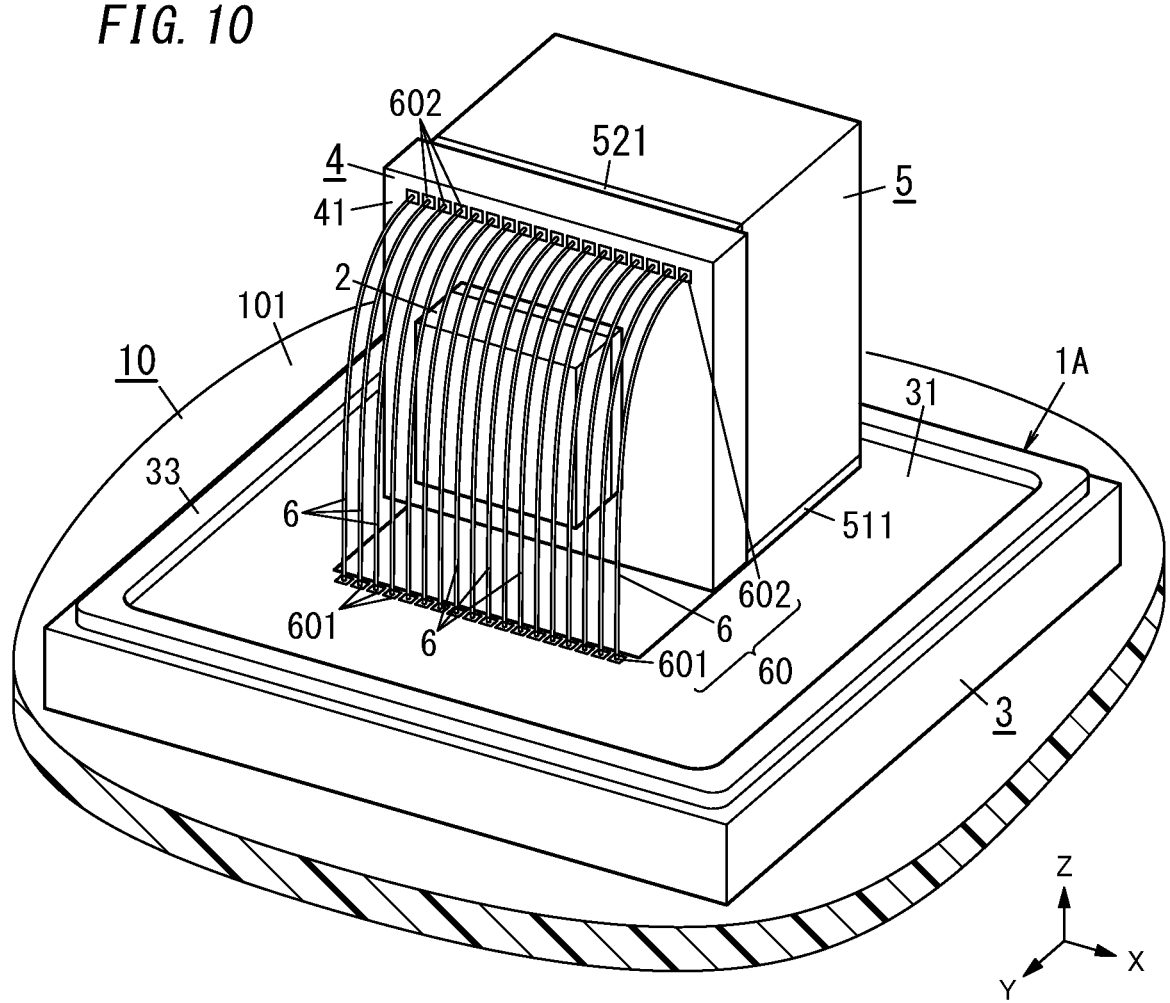
FIG. 10 is a perspective view illustrating a configuration for a sensor device according to a first variation of the first embodiment, from which a case is removed.

In a sensor device 1A according to a first variation of the first embodiment, the supporting-end electrodes 602 are provided at a different position on the supporting surface 41 as shown in FIG. 10 from the sensor device 1 according to the first embodiment. Specifically, in the sensor device 1 according to the first embodiment, the supporting-end electrodes 602 are located closer to the substrate 3 with respect to the sensor element 2 as viewed from the sensor element 2 on the supporting surface 41. In this variation, the supporting-end electrodes 602 are located opposite from the substrate 3 with respect to the sensor element 2 on the supporting surface 41.

In this variation, the supporting-end electrodes 602 are located between the other end portion (i.e., the upper end portion in FIG. 10), opposite from the substrate 3, of the supporting surface 41 and the sensor element 2. Thus, one end portion of each bonding wire 6 is connected to the other end portion, located opposite from the substrate 3, of the supporting surface 41 as viewed from the sensor element 2. That is to say, the sensor element 2 is arranged in the space surrounded with the bonding wires 6 and the two connection surfaces (namely, the installation surface 31 and the supporting surface 41).

In the sensor device 1A according to this variation, the sensor element 2 ensures a sufficient distance between the supporting-end electrodes 602 and the substrate 3, thus facilitating avoiding interference between the bonding wires 6 and the substrate 3 even without leaving the gap G1 (see FIG. 4B) between the supporting member 4 and the substrate 3. This allows the supporting member 4 to be arranged to have the lower end portion thereof aligned with the end portion, located adjacent to the substrate 3, on the second surface 52, thus allowing the coupling member 5 to have a relatively small Z-axis dimension. Consequently, this makes the protrusion height of the supporting member 4 and the coupling member 5 from the installation surface 31 of the substrate 3 relatively low and eventually makes the overall Z-axis dimension (height) of the sensor device 1A relatively low as well, thus contributing to reducing the height of the sensor device 1A.

(3.2) Other Variations

Next, variations other than the first variation will be enumerated one after another.

In the first embodiment described above, the sensor element 2 detects an angular velocity around the Y-axis. However, this configuration is only an example and should not be construed as limiting. Alternatively, the sensor element 2 may also detect an angular velocity around the X-axis or around the Z-axis. Still alternatively, the sensor element 2 may also be configured to detect angular velocities around two or more axes, not just the angular velocity around a single axis. For example, the sensor element 2 may also be implemented as a triaxial angular velocity sensor for detecting angular velocities around the X-, Y-, and Z-axes, respectively.

The sensor element 2 may also be configured to detect any physical quantity other than angular velocity. For example, the sensor element 2 may also be configured to detect any other physical quantity such as acceleration, angular acceleration, velocity, pressure, weight, length (distance), or temperature. Furthermore, the sensor element 2 does not have to detect a single physical quantity but may also be configured to detect a plurality of physical quantities. For example, the sensor element 2 may detect angular velocity and acceleration.

Furthermore, the sensor element 2 does not have to be an element that utilizes the MEMS technology but may also be any other type of element.

Furthermore, the number of the spacers 53 provided for the coupling member 5 does not have to be four but may also be one, two, three, or five or more. Furthermore, each spacer 53 does not have to have a dome shape but may also have a circular columnar, polygonal prismatic, conical, polygonal pyramidal, spherical, or any other appropriate shape.

Furthermore, in the first embodiment described above, the sensor device 1 is supposed to be flip-chip bonded onto the mount board 10. However, the sensor device 1 does not have to be flip-chip bonded. For example, the sensor device 1 may also be configured to be surface-mounted (such as wire-bonded) instead of being flip-chip bonded or insertion-mounted onto the mount board 10 by providing lead terminals for the substrate 3.

Furthermore, the substrate 3 does not have to have the shape, or be made of the material, described for the first embodiment. For example, the substrate 3 may also have a rectangular or circular plate shape in a plan view. Furthermore, the substrate 3 does not have to be made of a ceramic but may also be made of a resin or silicon, for example.

Furthermore, the supporting member 4 implemented as an ASIC including the processor circuit 43 is not an essential constituent element for the sensor device 1. Alternatively, any other appropriate configuration may be adopted for the supporting member 4. That is to say, the supporting member 4 does not have to be an electronic component but may also be a structure such as a simple plate member. Furthermore, the supporting member 4 does not have to have the shape, or be made of the material, described for the first embodiment. For example, the supporting member 4 may also have a rectangular or circular shape in a plan view. Furthermore, the supporting member 4 may also be a member made of a resin, silicon, or a ceramic, for example.

Furthermore, the coupling member 5 does not have to have the shape, or be made of the material, described for the first embodiment. For example, the coupling member 5 may also have a cubic shape or a polygonal prismatic shape (such as a triangular prismatic shape or a hexagonal prismatic shape). Alternatively, the coupling member 5 may also be configured as a stay with an L-shape in a side view. Furthermore, the coupling member 5 does not have to be made of an LCP resin but may also be made of silicon, a metal, or a ceramic, for example.

Optionally, the connection path 60 may include an electrically conductive path formed on the surface of the coupling member 5 or an electrically conductive path embedded in the coupling member 5.

Furthermore, the coupling member 5 may have a hollow structure. This allows the shock applied to the coupling member 5 to be absorbed more easily compared to the coupling member 5 with a solid structure. This contributes to improving the shock absorbance of the sensor device 1.

Second Embodiment

Figure 11A:
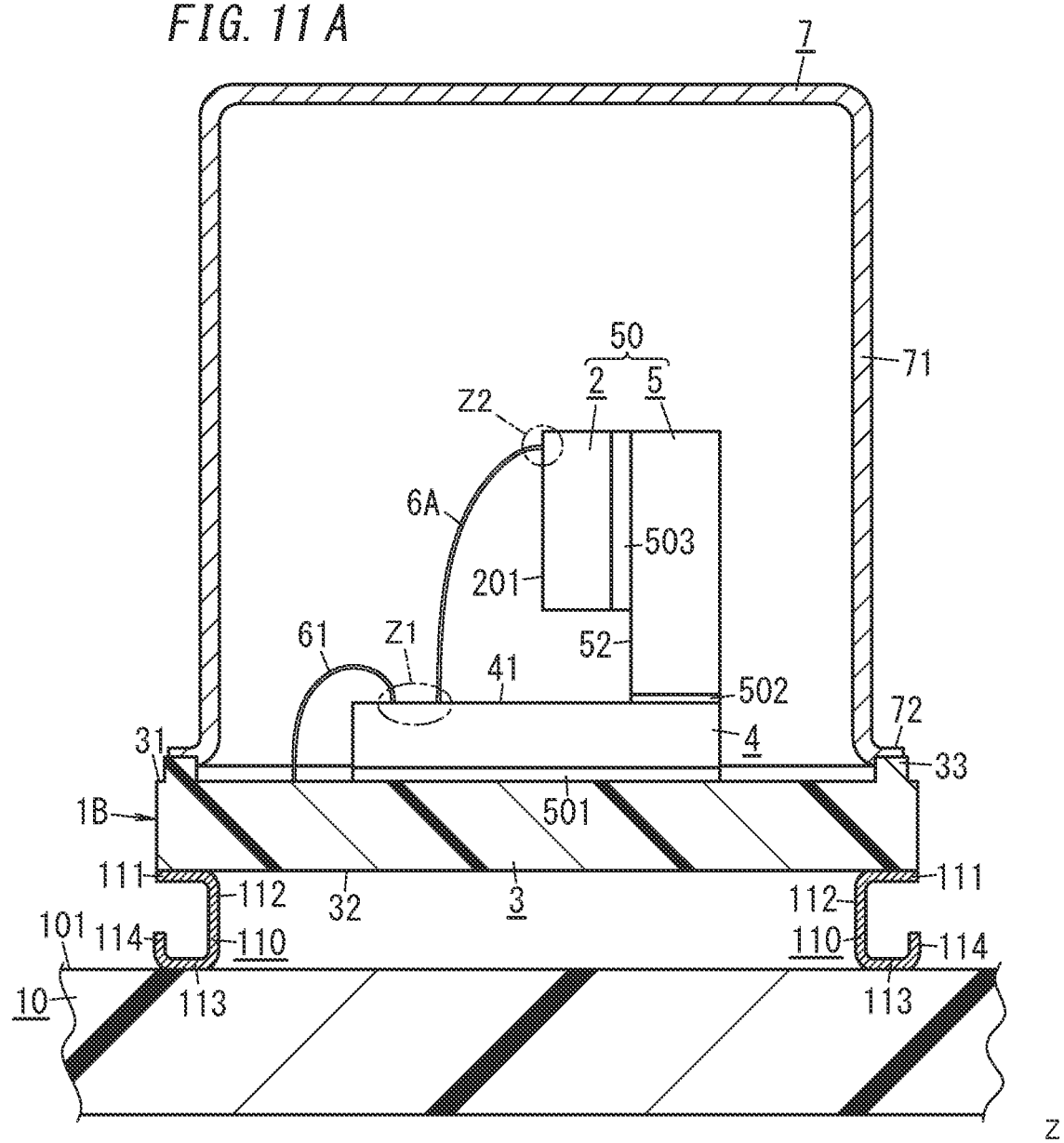
FIG. 11A is a partially cutaway side view of a sensor device according to a second embodiment.
Figure 11B:
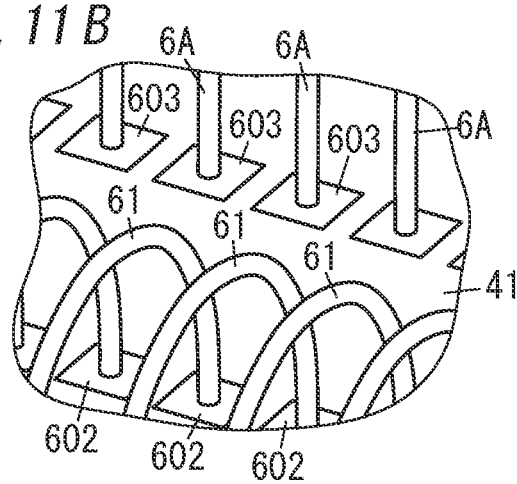
FIG. 11B is an enlarged perspective view of a region Z1 shown in FIG. 11A.
Figure 11C:
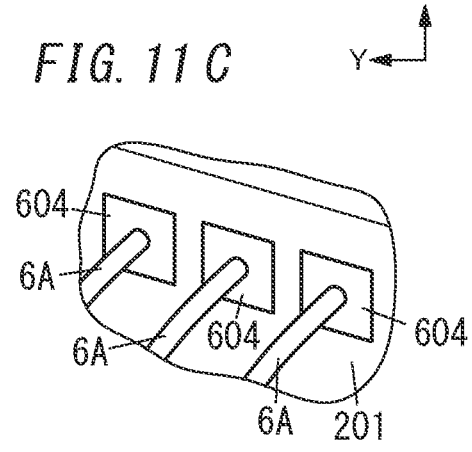
FIG. 11C is an enlarged perspective view of a region Z2 shown in FIG. 11A.

In a sensor device 1B according to a second embodiment, the relative position of the supporting member 4 with respect to the substrate 3 is different as shown in FIGS. 11A-11C from the sensor device 1 according to the first embodiment. In the following description, any constituent element of this second embodiment, having the same function as a counterpart of the first embodiment described above, will be designated by the same reference numeral as that counterpart's, and description thereof will be omitted herein as appropriate. FIG. 11B is an enlarged perspective view corresponding to a region Z1 shown in FIG. 11A. FIG. 11C is an enlarged perspective view corresponding to a region Z2 shown in FIG. 11A.

In this embodiment, the substrate 3 and the supporting member 4 are bonded together to have such a positional relationship that the supporting surface 41 is aligned with the installation surface 31 as shown in FIG. 11A. In particular, in the example illustrated in FIG. 11A, the supporting surface 41 and the installation surface 31 are generally parallel to each other. Also, in this embodiment, the sensor element 2 is supported over the supporting surface 41 via the coupling member 5. The sensor element 2 is fixed on the second surface 52 of the coupling member 5. The sensor element 2 is formed in a flat plate shape and has thickness in the Y-axis direction. The sensor element 2 has an electrode surface 201 on one surface (opposite from the coupling member 5) along the thickness thereof. That is to say, the other surface, opposite from the electrode surface 201, of the sensor element 2 along the thickness thereof faces the coupling member 5.

More specifically, the coupling member 5 is provided on the supporting surface 41 of the supporting member 4 to couple the supporting member 4 to the sensor element 2. In other words, the supporting member 4 over which the sensor element 2 is provided (mounted) via the coupling member 5 is fixed on the (installation surface 31 of the) substrate 3. Thus, the relative positions of the supporting member 4 and the sensor element 2 are defined by the coupling member 5. In the sensor device 1B according to this embodiment, the positional relationship between the supporting member 4 and the sensor element 2 is defined such that a normal to the electrode surface 201 of the sensor element 2 is aligned with the supporting surface 41. That is to say, the normal to the electrode surface 201 is generally parallel to the supporting surface 41 of the supporting member 4 (i.e., may be exactly parallel to the supporting surface 41 or to form an angle of about several degrees with respect to the supporting surface 41). In this embodiment, the normal to the electrode surface 201 may be, for example, exactly parallel to the supporting surface 41 of the supporting member 4 and the installation surface 31 of the substrate 3.

In addition, the configuration described above allows the coupling member 5 and the sensor element 2 to be fixed to stand upright on the supporting surface 41 of the supporting member 4. In other words, a vertical member 50 including the sensor element 2 is provided to stand upright on the supporting surface 41. In this embodiment, the vertical member 50 provided on the supporting surface 41 includes the sensor element 2 and the coupling member 5. That is to say, the supporting member 4 has the supporting surface 41 on which the vertical member 50 including the sensor element 2 is provided. The vertical member 50 is fixed on the supporting surface 41 to have such a positional relationship that a normal to the electrode surface 201 of the sensor element 2 is aligned with the supporting surface 41. In this embodiment, the vertical member 50 includes the coupling member 5 that couples the sensor element 2 to the supporting member 4. The sensor element 2 is provided indirectly over the supporting member 4 via the coupling member 5.

As a means for fixing the supporting member 4 onto the (installation surface 31 of the) substrate 3, any appropriate means such as adhesion, pressure-sensitive adhesion, brazing, welding, or crimping may be adopted, for example. In this embodiment, a means for fixing the supporting member 4 to the substrate 3 is adhesion with an adhesive layer 501. Likewise, as a means for fixing the coupling member 5 onto the (supporting surface 41 of the) supporting member 4, any appropriate means such as adhesion, pressure-sensitive adhesion, brazing, welding, or crimping may be adopted, for example. In this embodiment, a means for fixing the supporting member 4 to the coupling member 5 is adhesion with an adhesive layer 502. Likewise, as a means for fixing the sensor element 2 to the (second surface 52 of the) coupling member 5, any appropriate means such as adhesion, pressure-sensitive adhesion, brazing, welding, or crimping may be adopted, for example. In this embodiment, a means for fixing the sensor element 2 to the (second surface 52 of the) coupling member 5 is adhesion with an adhesive layer 503.

In addition, the supporting member 4 further includes a plurality of supporting-end electrodes 602 and a plurality of feed electrodes 603 as shown in FIG. 11B. The feed electrodes 603 are provided in place of the electrodes 81 (see FIG. 8A) and are made of an electrically conductive material. The feed electrodes 603 are electrodes, to which the bonding wires 6A are electrically connected, and are formed on the supporting surface 41. That is to say, the supporting member 4 includes, on the supporting surface 41, the feed electrodes 603, to each of which one end portion of an associated one of the bonding wires 6A is connected. In this embodiment, the supporting-end electrodes 602 and the feed electrodes 603 are provided on the same surface (supporting surface 41) of the supporting member 4.

In addition, the sensor element 2 further includes a plurality of sensor-end electrodes 604 as shown in FIG. 11C. The sensor-end electrodes 604 are made of an electrically conductive material. The sensor-end electrodes 604 are electrodes, to which the bonding wires 6A are electrically connected, and are formed on the electrode surface 201. That is to say, the sensor element 2 includes, on the electrode surface 201, the sensor-end electrodes 604, to each of which one end portion of an associated one of the bonding wires 6A is connected.

The bonding wires 6A form at least part of a connection path 60 that electrically connects the sensor element 2 to the substrate 3 (see FIG. 1A). In particular, in this embodiment, the bonding wires 6A electrically connect the sensor element 2 and the supporting member 4 together. That is to say, in this embodiment, electrical connection between the (sensor-end electrodes 604 of the) sensor element 2 and the (feed electrodes 603 of the) supporting member 4 implemented as an ASIC is established by the bonding wires 6A. Specifically, connecting one end portion of each bonding wire 6A to an associated one of the feed electrodes 603 of the supporting member 4 and the other end portion of the bonding wire 6A to an associated one of the sensor-end electrodes 604 of the sensor element 2 allows the bonding wires 6A to electrically connect the supporting member 4 and the sensor element 2 together.

The connection path 60 that electrically connects the sensor element 2 and the substrate 3 together includes not only the bonding wires 6A serving as "first bonding wires" but also bonding wires 61 serving as "second bonding wires." The second bonding wires 61 electrically connect the supporting member 4 and the substrate 3 together. That is to say, in this embodiment, electrical connection between the (feed electrodes 603 of the) supporting member 4 implemented as an ASIC and the substrate 3 is established by the second bonding wires 61. Specifically, connecting one end portion of each bonding wire 61 to an associated one of the substrate-end electrodes 601 of the substrate 3 and the other end portion of the bonding wire 61 to an associated one of the supporting-end electrodes 602 of the supporting member 4 allows the bonding wires 61 to electrically connect the substrate 3 and the supporting member 4 together.

The (first) bonding wires 6A are bonded to the feed electrodes 603 and the sensor-end electrode 604 by either wedge bonding or ball bonding. In this embodiment, the wedge bonding technique, by which the bonding wires 6A are bonded to the electrodes (namely, the feed electrodes 603 or the sensor-end electrodes 604) by applying energy such as an ultrasonic wave or heat to bonding parts, may be adopted, for example. In the same way, the second bonding wires 61 may also be bonded by either wedge bonding or ball bonding.

In this embodiment the (first) bonding wires 6A are provided to connect together two connection surfaces that are one surface of the supporting member 4 and one surface of the sensor element 2 and that intersect with each other. Specifically, the bonding wires 6A connect together the supporting surface 41 that is the connection surface of the supporting member 4 and the electrode surface 201 that is the connection surface of the sensor element 2.

As can be seen, the sensor device 1B according to this embodiment includes the supporting member 4, which is installed on the substrate 3 with the sensor element 2 provided over the supporting member 4. The sensor element 2 is electrically connected to the substrate 3 via the supporting member 4. One of the two connection surfaces that intersect with each other is one surface of the supporting member 4. Furthermore, in this embodiment, the sensor element 2 has the electrode surface 201 that is the other one of the two connection surfaces. In other words, the supporting surface 41 and the electrode surface 201 intersect with each other (at right angles in this embodiment). One of the two connection surfaces intersecting with each other (i.e., one connection surface) is the supporting surface 41 that is one surface of the supporting member 4. The other of the two connection surfaces intersecting with each other (i.e., the other connection surface) is the electrode surface 201 that is one surface of the sensor element 2. That is to say, the two connection surfaces, which intersect with each other and which are connected together via the bonding wires 6A, are the electrode surface 201 that is one surface of the sensor element 2 and the supporting surface 41 that is one surface of the supporting member 4.

In this embodiment, the adhesive layer 502 (hereinafter also referred to as a "second adhesive layer 502") bonding the vertical member 50 and the supporting member 4 together has a larger Young's modulus than the adhesive layer 501 (hereinafter also referred to as a "first adhesive layer 501") bonding the supporting member 4 and the substrate 3 together. That is to say, in this embodiment, the Young's modulus of the second adhesive layer 502 serving as a fixing means between the coupling member 5 included in the vertical member 50 and the supporting member 4 is larger than the Young's modulus of the first adhesive layer 501 serving as a fixing means between the supporting member 4 and the substrate 3. In other words, the second adhesive layer 502 between the coupling member 5 and the supporting member 4 is more rigid and less deformable than the first adhesive layer 501 between the supporting member 4 and the substrate 3. Stated otherwise, the first adhesive layer 501 between the supporting member 4 and the substrate 3 is less rigid and more deformable than the second adhesive layer 502 between the coupling member 5 and the supporting member 4.

Providing the first adhesive layer 501 and the second adhesive layer 502 having such relationship allows the coupling member 5 (vertical member 50) to be firmly fixed onto the supporting member 4, thus making stress less easily transferrable from the substrate 3 to the supporting member 4. This reduces, even if external force produced by an ultrasonic wave, for example, is applied along the Y-axis to the vertical member 50 while the bonding wires 6A are being bonded to the sensor-end electrodes 604, for example, the chances of the vertical member 50 (coupling member 5) being tilted with respect to the supporting member 4. This allows the external force produced by an ultrasonic wave, for example, and applied along the Y-axis to the vertical member 50 to be used efficiently for bonding the bonding wires 6A to the sensor-end electrodes 604. In addition, the stress is transferrable much less easily from the substrate 3 to the supporting member 4, thus making the stress hardly applicable to the sensor element 2. This reduces the chances of the result of detection by the sensor element 2 being affected by the stress.

Also, the second adhesive layer 502 bonding the coupling member 5 and the supporting member 4 together has a larger Young's modulus than the adhesive layer 503 (hereinafter also referred to as a "third adhesive layer 503") bonding the coupling member 5 and the sensor element 2 together. That is to say, in this embodiment, the Young's modulus of the second adhesive layer 502 serving as a fixing means between the coupling member 5 included in the vertical member 50 and the supporting member 4 is larger than the Young's modulus of the third adhesive layer 503 serving as a fixing means between the coupling member 5 and the sensor element 2. In other words, the second adhesive layer 502 between the coupling member 5 and the supporting member 4 is more rigid and less deformable than the third adhesive layer 503 between the coupling member 5 and the sensor element 2. Stated otherwise, the third adhesive layer 503 between the coupling member 5 and the sensor element 2 is less rigid and more deformable than the second adhesive layer 502 between the coupling member 5 and the supporting member 4.

Providing the third adhesive layer 503 and the second adhesive layer 502 having such relationship allows the coupling member 5 (vertical member 50) to be firmly fixed onto the supporting member 4, thus making stress less easily transferrable from the coupling member 5 to the supporting member 4. This reduces, even if external force produced by an ultrasonic wave, for example, is applied along the Y-axis to the vertical member 50 while the bonding wires 6A are being bonded to the sensor-end electrodes 604, for example, the chances of the vertical member 50 (coupling member 5) being tilted with respect to the supporting member 4. This allows the external force produced by an ultrasonic wave, for example, and applied along the Y-axis to the vertical member 50 to be used efficiently for bonding the bonding wires 6A to the sensor-end electrodes 604. In addition, even if stress is applied from the substrate 3 to the coupling member 5, the stress is transferrable much less easily from the coupling member 5 to the supporting member 4, thus making the stress hardly applicable to the sensor element 2. This reduces the chances of the result of detection by the sensor element 2 being affected by the stress.

In addition, the sensor device 1B according to this embodiment is also mounted onto the mount board 10 differently from the sensor device 1 according to the first embodiment. Specifically, the sensor device 1 according to the first embodiment is bonded onto the mount board 10 via the bonding member 103 (see FIG. 5) such as gold (Au) bumps or solder, for example. On the other hand, the sensor device 1B according to this embodiment is bonded onto the mount board 10 via terminal members 110.

In this embodiment, the sensor device 1B is mounted onto the mount board 10 with mounting surface 32 of the substrate 3 facing the one surface 101 of the mount board 10 as shown in FIG. 11A. Each of the terminal members 110 is a member with spring properties (i.e., elasticity) and part of the terminal member 110 is fixed to the substrate 3. In this embodiment, the terminal member 110 may be, for example, a lead terminal made of a metal with electrical conductivity (such as copper or a copper alloy). The sensor device 1B includes a plurality of terminal members 110 along the outer peripheral edges of the mounting surface 32 of the substrate 3. That is to say, the plurality of terminal members 110 are arranged along the outer peripheral edges of the mounting surface 32.

As shown in FIG. 11A, each terminal member 110 includes a first terminal piece 111, a second terminal piece 112, a third terminal piece 113, and a fourth terminal piece 114, and is formed in a generally C-shape overall. The first terminal piece 111 and the third terminal piece 113 are parallel to each other. The second terminal piece 112 couples one end of the first terminal piece 111 and one end of the third terminal piece 113 together. The fourth terminal piece 114 protrudes, from the other end, opposite from the second terminal piece 112, of the third terminal piece 113, toward the first terminal piece 111. In the terminal member 110 having such a shape, the first terminal piece 111 is connected to the mounting surface 32 of the substrate 3 with solder, for example. Meanwhile, the third terminal piece 113 is connected to the one surface of the mount board 10 with solder, for example. In this manner, the terminal member 110 has one part thereof fixed to the substrate 3 and another part thereof fixed to the mount board 10.

According to the configuration described above, to say the least, part (around the middle) of the second terminal piece 112 is connected directly to neither the substrate 3 nor the mount board 10. Thus, letting the second terminal piece 112 flex itself due to the spring properties (elasticity) of at least the second terminal piece 112 allows the terminal member 110 to reduce the stress transferred between the mount board 10 and the substrate 3. Thus, even if stress is applied from the mount board 10 to the terminal member 110 due to, for example, a difference in coefficient of thermal expansion between the mount board 10 and the substrate 3, the stress may be reduced by the terminal member 110 and hardly transferrable to the substrate 3, thus reducing the chances of the result of detection by the sensor element 2 being affected by the stress.

Alternatively, in this embodiment, the mounting surface 32 of the substrate 3 and the one surface 101 of the mount board 10 may also be mechanically bonded together with an underfilling material, for example.

Figure 12:
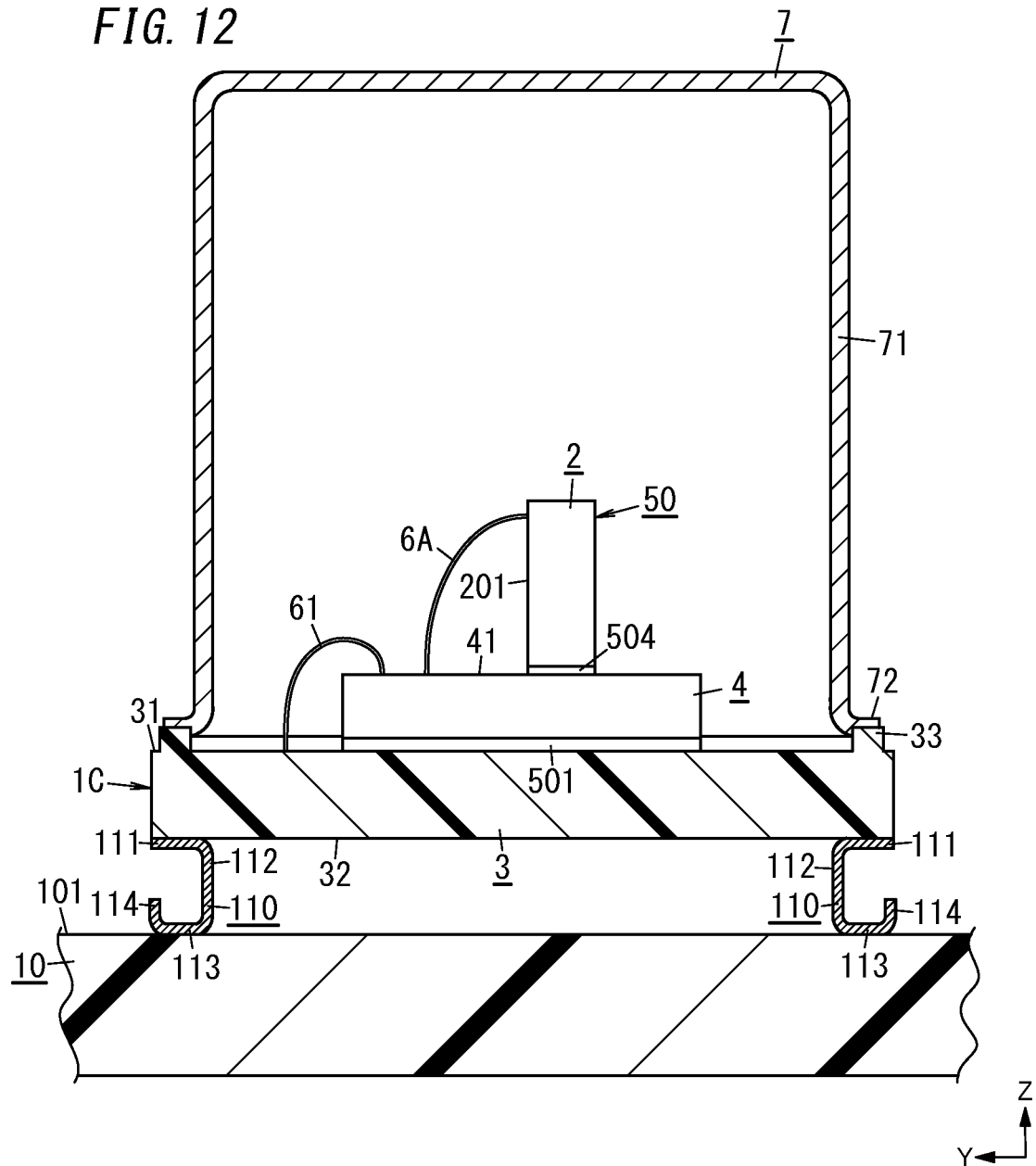
FIG. 12 is a partially cutaway side view of a sensor device according to a variation of the second embodiment.

FIG. 12 illustrates a sensor device 1C according to a variation of the second embodiment. In the sensor device 1C according to this variation, the coupling member 5 is omitted. Thus, the vertical member 50 provided on the supporting surface 41 includes the sensor element 2 alone. In the following description, any constituent element of this variation, having the same function as a counterpart of the second embodiment described above, will be designated by the same reference numeral as that counterpart's, and description thereof will be omitted as appropriate herein.

In this sensor device 1C, the vertical member 50 (sensor element 2) is fixed on the supporting surface 41 to have such a positional relationship that a normal to the electrode surface 201 of the sensor element 2 is aligned with the supporting surface 41. In this variation, the sensor element 2 is provided directly on the supporting surface 41 of the supporting member 4. As a means for fixing the sensor element 2 onto the (supporting surface 41 of the) supporting member 4, any appropriate means such as adhesion, pressure-sensitive adhesion, brazing, welding, or crimping may be adopted, for example. In this variation, a means for fixing the sensor element 2 to the supporting member 4 is adhesion with an adhesive layer 504.

The adhesive layer 504 (hereinafter referred to as a "fourth adhesive layer 504") bonding the vertical member 50 (sensor element 2) and the supporting member 4 together has a larger Young's modulus than the first adhesive layer 501 bonding the supporting member 4 and the substrate 3 together. That is to say, in this variation, the Young's modulus of the fourth adhesive layer 504 serving as a fixing means between the sensor element 2 included in the vertical member 50 and the supporting member 4 is larger than the Young's modulus of the first adhesive layer 501 serving as a fixing means between the supporting member 4 and the substrate 3. In other words, the fourth adhesive layer 504 between the sensor element 2 and the supporting member 4 is more rigid and less deformable than the first adhesive layer 501 between the supporting member 4 and the substrate 3.

The configuration that has been described for the second embodiment (including the variation thereof) may be adopted as appropriate in combination with various configurations described for the first embodiment (including the variations thereof).

Third Embodiment (1) Overview

Figure 13:
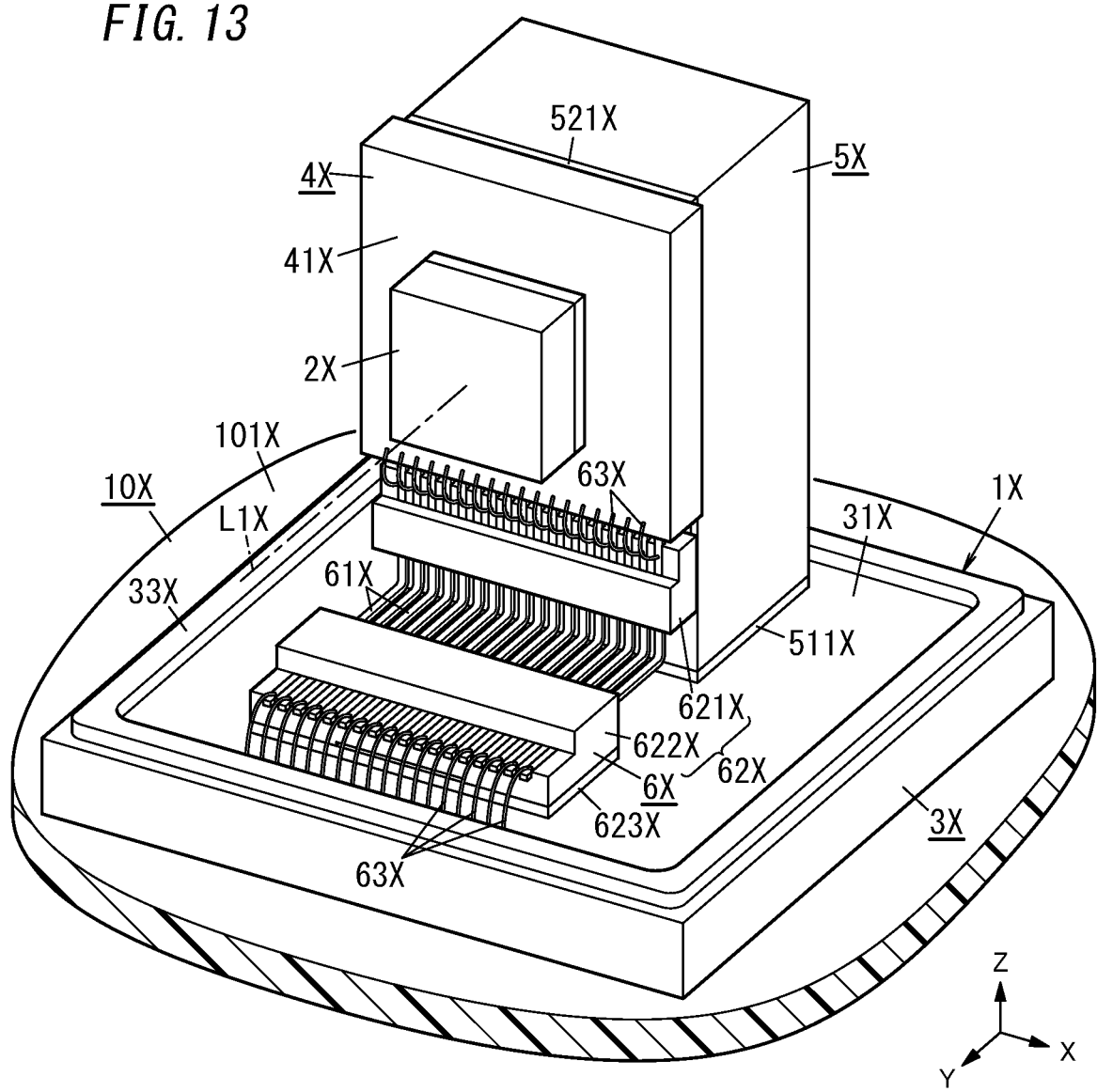
FIG. 13 is a perspective view illustrating a configuration for a sensor device according to a third embodiment, from which a case is removed.

A sensor device 1X according to this embodiment includes a sensor element 2X and a substrate 3X that supports the sensor element 2X as shown in FIG. 13.

In this sensor device 1X, the sensor element 2X transforms a physical quantity such as angular velocity, acceleration, angular acceleration, velocity, pressure, weight, length (distance), or temperature into an electrical signal. That is to say, the sensor element 2X functions as a transducer for transforming a physical quantity into an electrical signal. The sensor device 1X of this type may be used in various types of devices including consumer electronic appliances, mobile telecommunications devices, cameras, wearable terminals, and game consoles, and moving vehicles such as vehicles (including automobiles and motorcycles), drones, aircrafts, and watercrafts.

The sensor device 1X according to this embodiment includes not only the sensor element 2X and the substrate 3X but also a supporting member 4X and a coupling member 5X as shown in FIG. 13. That is to say, the sensor device 1X includes the sensor element 2X, the substrate 3X, the supporting member 4X, and the coupling member 5X. The substrate 3X has an installation surface 31X. The supporting member 4X has a supporting surface 41X. The sensor element 2X is provided on the supporting surface 41X. The coupling member 5X is installed on the installation surface 31X. The coupling member 5X couples the supporting member 4X to the substrate 3X such that a normal L1X to the supporting surface 41X is aligned with the installation surface 31X.

According to this configuration, the supporting member 4X on which the sensor element 2X is provided is supported over the installation surface 31X of the substrate 3X via the coupling member 5X, thus allowing the sensor element 2X with the supporting member 4X to be installed over the installation surface 31X of the substrate 3X. In other words, the substrate 3X supports the sensor element 2X indirectly via the coupling member 5X and the supporting member 4X. In this embodiment, the coupling member 5X couples the supporting member 4X to the substrate 3X such that the normal L1X to the supporting surface 41X is aligned with the installation surface 31X. Thus, the supporting surface 41X of the supporting member 4X on which the sensor element 2X is provided is generally perpendicular to the installation surface 31X of the substrate 3X. That is to say, the orientation of the surface (i.e., the supporting surface 41X) on which the sensor element 2X is provided is converted by the coupling member 5X to stand upright (i.e., define an angle of approximately 90 degrees) with respect to the installation surface 31X of the substrate 3X. Thus, even if the sensor device 1X is mounted onto the mount board 10X with the other surface, opposite from the installation surface 31X, of the substrate 3X facing the mount board 10X such as a printed wiring board (see FIG. 13), the orientation of the sensor element 2X with respect to the mount board 10 is still adjustable. That is to say, the sensor device 1X according to this embodiment allows the surface (i.e., the supporting surface 41X) on which the sensor element 2X is mounted to have its orientation changed by rotating the substrate 3X within a plane aligned with one surface 101X of a mount board 10X, thus contributing to increasing the degree of freedom of the detection target.

(2) Details

Next, a specific configuration for the sensor device 1X according to this embodiment will be described in detail with reference to FIGS. 13-18B.

In this embodiment, the sensor device 1X may be implemented as a gyro sensor designed to detect an "angular velocity" (i.e., an angular velocity sensor), for example. The sensor device 1X according to this embodiment is applicable particularly effectively to a situation where the angular velocity needs to be detected (measured) with relatively high accuracy (e.g., when applied to a technique for driving a vehicle). However, this is only an example of the present disclosure and should not be construed as limiting. Naturally, the sensor device 1X according to this embodiment is applicable to even a situation where the angular velocity does not have to be detected (measured) with high accuracy.

In the following description, X-, Y-, and Z-axes that intersect with each other at right angles are set as an example. In particular, an axis aligned with the normal L1X to the supporting surface 41X is supposed to be the Y-axis and an axis aligned with a normal to the installation surface 31X is supposed to be the Z-axis. The X-axis intersects at right angles with both of these Y- and Z-axes. Note that each of the X-, Y-, and Z-axes shown on the drawings is a virtual axis and the arrows designated by X, Y, and Z are shown there just for the sake of convenience of description and are insubstantial ones. It should also be noted that these directions do not define the directions in which the sensor device 1X should be used.

In this embodiment, the sensor device 1X is supposed to use the Y-axis as a detection axis and be designed to detect an angular velocity around the Y-axis as a target. The Y-axis is an axis aligned with the normal L1X to the supporting surface 41. Consequently, the sensor device 1X will detect, as a target, the angular velocity applied to the sensor device 1X itself as the sensor device 1X turns around the normal L1X to the supporting surface 41X. That is to say, the sensor element 2X outputs an electrical signal representing the angular velocity around the normal L1X to the supporting surface 41X (i.e., around the Y-axis). This allows the magnitude of the angular velocity around the normal L1X to the supporting surface 41X (i.e., around the Y-axis) to be measured based on the output of the sensor device 1X.

(2.1) Overall Configuration for Sensor Device

Figure 14:
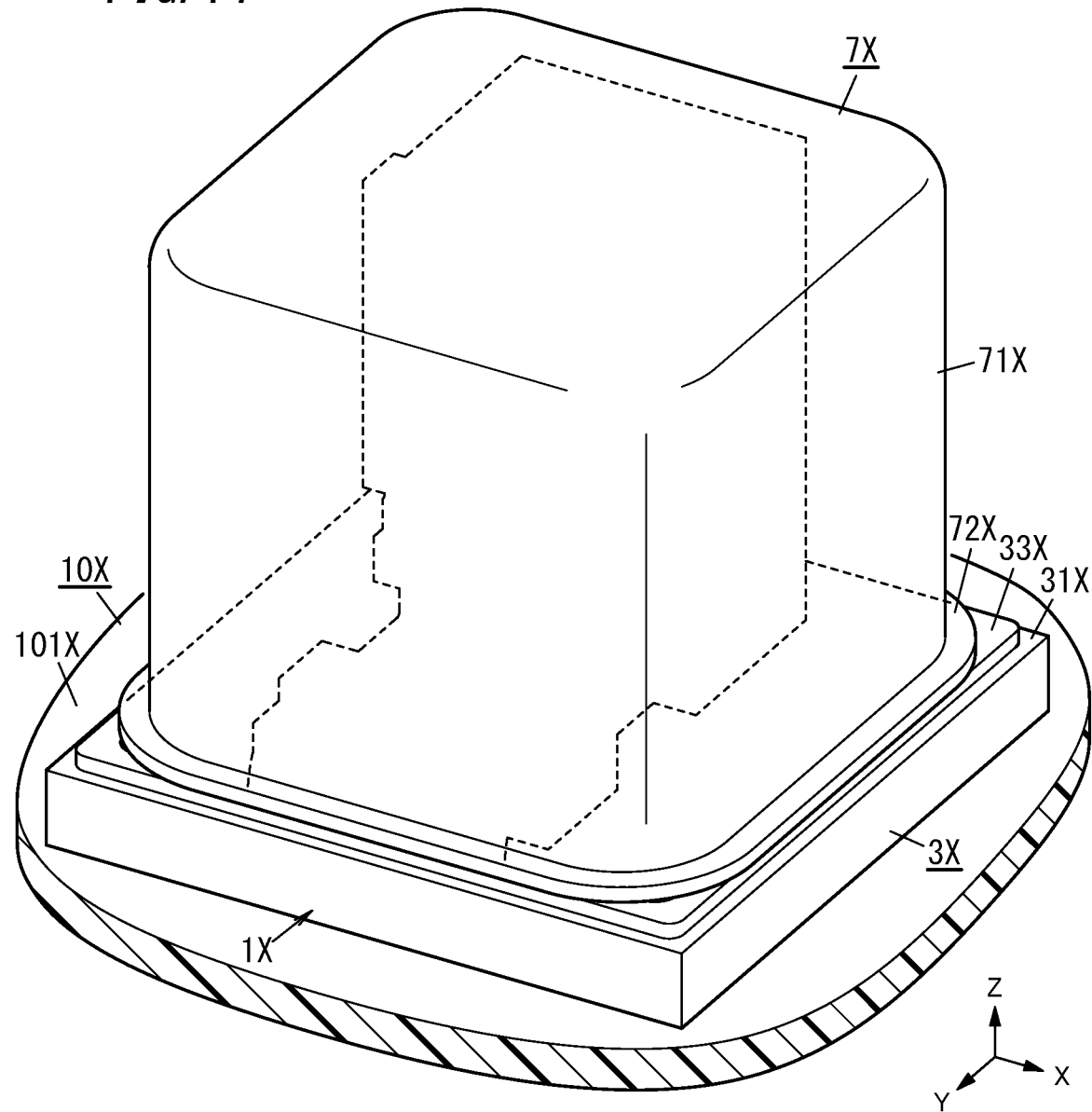
FIG. 14 is a perspective view illustrating a configuration for the sensor device.

The sensor device 1X according to this embodiment includes the sensor element 2X, the substrate 3X, the supporting member 4X, and the coupling member 5X as described above. In addition, in this embodiment, the sensor device 1X includes not only the sensor element 2X, the substrate 3X, the supporting member 4X, and the coupling member 5X but also a wiring member 6X and a case 7X as well as shown in FIGS. 13-16C. That is to say, the sensor device 1X includes the sensor element 2X, the substrate 3X, the supporting member 4X, the coupling member 5X, the wiring member 6X, and the case 7X. Note that in every drawing but FIG. 14, illustration of the case 7X is omitted.

Furthermore, in this embodiment, the sensor device 1X is supposed to be flip-chip bonded, while being used, to a mount board 10X such as a printed wiring board with a surface, opposite from the installation surface 31X, of the substrate 3X (i.e., a mounting surface 32X of the substrate 3X) facing the mount board 10 as shown in FIGS. 13 and 14. In this embodiment, the mount board 10X to which the sensor device 1 is mounted is supposed to be a rigid board. However, this is only an example of the present disclosure and should not be construed as limiting. Alternatively, the mount board 10X may also be a flexible board, for example.

The sensor element 2X is an element that outputs an electrical signal representing a physical quantity to be detected. In this embodiment, the physical quantity to be detected is an angular velocity around the Y-axis (i.e., the normal L1X to the supporting surface 41X) as described above. Thus, the sensor element 2X outputs an electrical signal representing an angular velocity around the Y-axis. The sensor element 2X may be implemented as, for example, a vibration-type gyro sensor and designed to detect an angular velocity around the Y-axis by using Coriolis force (deflecting force). That is to say, the sensor element 2X detects the angular velocity applied to the sensor element 2X by detecting the Coriolis force produced by external application of rotational force while vibrating a moving portion 21X (see FIG. 18A).

In this embodiment, the sensor element 2X may include, for example, a bare chip to which microelectromechanical systems (MEMS) technology is applied (i.e., a so-called "MEMS chip"). The sensor element 2X may further include, for example, a package such as a ceramic package, in which the bare chip is housed. This sensor element 2X includes the moving portion 21X in the bare chip and may detect the angular velocity by vibrating the moving portion 21X. The configuration of the sensor element 2X will be described in further detail later in the "(2.3) Configuration of sensor element" section.

Figure 15:
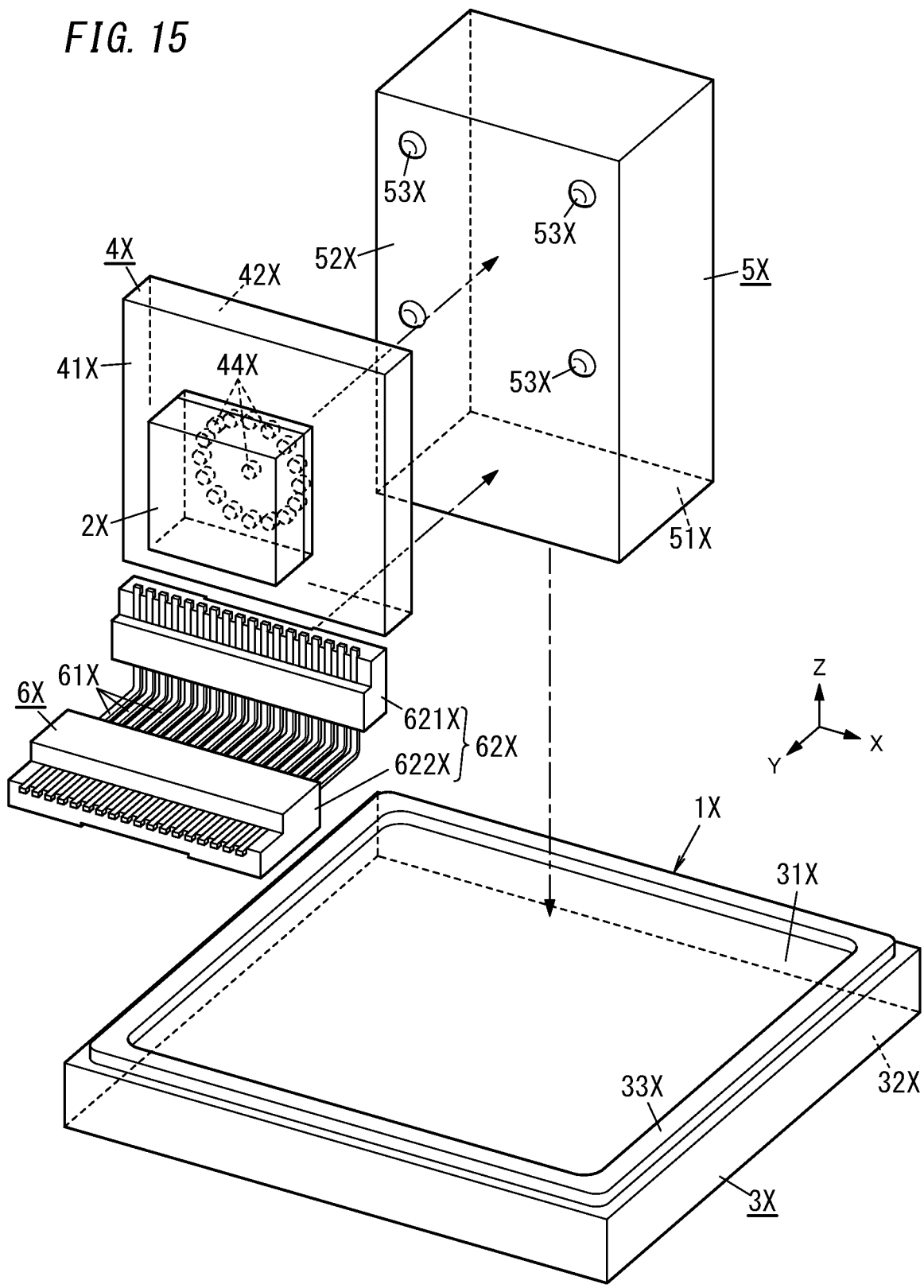
FIG. 15 is an exploded perspective view of the sensor device, from which a case is removed.

As shown in FIG. 15, the substrate 3X is formed in the shape of a flat plate and has thickness in the Z-axis direction. The substrate 3X has, on both sides along its thickness, the installation surface 31X and the mounting surface 32X. Specifically, one surface along the thickness of the substrate 3X serves as the installation surface 31X over which the sensor element 2X is provided with the coupling member 5X and the supporting member 4X interposed between them. On the other hand, the other surface, opposite from the installation surface 31X, along the thickness of the substrate 3X serves as the mounting surface 32X that faces the mount board 10X with the sensor device 1X mounted onto the mount board 10X.

In this embodiment, the substrate 3X may have a generally square shape in a plan view, for example. The substrate 3X may be a substrate made of a ceramic, for example, and has electrical insulation properties. The substrate 3X has a rib 33X protruding from the installation surface 31X. The rib 33X is provided along outer peripheral edges of the installation surface 31X so as to surround a central area of the installation surface 31X along its circumference. Bonding a flange portion 72X (see FIG. 14) of the case 7X onto a tip surface of the rib 33X allows the case 7X to be bonded onto the substrate 3X. Thus, a space for housing the sensor element 2X and other members is formed between an area, located inside the rib 33X, of the installation surface 31X and the case 7X.

As will be described in detail later, the substrate 3X includes first electrodes 34X (see FIG. 17), second electrodes 35X (see FIG. 17), and vias 36X (see FIG. 5). The first electrodes 34X, the second electrodes 35X, and the vias 36X are made of an electrically conductive material. The first electrodes 34X are electrodes, to which the wiring member 6X is electrically connected, and are provided on the installation surface 31X. The second electrodes 35X are electrodes, to which the mount board 10X is electrically connected, and are provided on the mounting surface 32X. The vias 36X electrically connect the first electrodes 34X and the second electrodes 35X to each other. The vias 36X are implemented as through hole vias that run through both surfaces (namely, the installation surface 31X and the mounting surface 32X) along the thickness of the substrate 3X. Note that illustration of the first electrodes 34X, the second electrodes 35X, and the vias 36X is omitted from all drawings but FIG. 17.

The supporting member 4X is formed in the shape of a flat plate and has thickness in the Y-axis direction as shown in FIG. 15. The supporting member 4X has, as both sides along its thickness, the supporting surface 41X and an attaching surface 42X. That is to say, one surface along the thickness of the supporting member 4X serves as the supporting surface 41X on which the sensor element 2X is provided. On the other hand, the other surface, opposite from the supporting surface 41X, along the thickness of the supporting member 4X serves as the attaching surface 42X facing the coupling member 5X.

In this embodiment, the supporting member 4X may have, for example, a generally square shape in a plan view. In this case, the supporting member 4X is implemented as an application specific integrated circuit (ASIC). That is to say, the supporting member 4X has a configuration in which a semiconductor chip is encapsulated in a package with electrical insulation properties such as a resin package. Thus, in this embodiment, the sensor element 2X is mounted on one surface (i.e., the supporting surface 41X) of an ASIC package serving as the supporting member 4X. In this embodiment, the semiconductor chip functions as a processor circuit 43X (see FIG. 16A) to be described later.

In this embodiment, the supporting member 4X includes electrodes 81 (see FIG. 20A), to which the sensor element 2X is electrically connected, and electrodes 82X (see FIG. 20A), to which the wiring member 6X is electrically connected. This allows the sensor element 2X provided on the supporting surface 41X to be electrically connected to the supporting member 4X (processor circuit 43X) and also allows the supporting member 4X (processor circuit 43X) to be electrically connected to (the first electrodes 34X of) the substrate 3X via the wiring member 6X. Note that illustration of the electrodes of the supporting member 4X is omitted in FIGS. 13-16C.

On the supporting surface 41X of the supporting member 4X, the sensor element 2X is fixed. As used herein, to "fix" means placing something at a certain position to immobilize it at that position by any of various means. That is to say, the sensor element 2X is immobilized with respect to the supporting surface 41X of the supporting member 4X. As a means for fixing the sensor element 2X onto the (supporting surface 41X of the) supporting member 4X, any appropriate means such as adhesion, pressure-sensitive adhesion, brazing, welding, or crimping may be adopted, for example. In this embodiment, a means for fixing the sensor element 2X to (the supporting surface 41X of) the supporting member 4X is adhesion with a silicone-based adhesive. The supporting member 4X is formed to be one step larger than the sensor element 2X and the sensor element 2X is fixed onto a central area of the supporting surface 41X.

In this embodiment, one or more connection members 44X (see FIG. 15), which may be implemented as metallic bumps of gold (Au) or copper (Cu), for example, are suitably provided between the supporting member 4X and the sensor element 2X. In this embodiment, solder bumps made of an AuSn alloy (AuSn solder bumps), for example, may be used as the connection members 44X. Thus, supporting the sensor element 2X with the one or more connection members 44X reduces, even when the silicone-based adhesive is deformed, the tilt of the sensor element 2X with respect to (the supporting surface 41X of) the supporting member 4X. Also, on the supporting surface 41X, the plurality of connection members 44X are more suitably arranged in a circular ring pattern such that one connection member 44X, placed on a center axis that passes through the center of the sensor element 2X, is surrounded with a plurality of other connection members 44X.

The coupling member 5X is formed in a cuboid shape as shown in FIG. 15. In this embodiment, a dimension measured along the Z-axis (i.e., the height) of the coupling member 5X is larger than a dimension measured along the X-axis (i.e., the width) thereof or a dimension measured along the Y-axis (i.e., the depth) thereof. That is to say, the coupling member 5X has a vertically elongated cuboid shape. The coupling member 5X is made of a resin, for example, and has electrical insulation properties. In this embodiment, the coupling member 5X may be made of a liquid crystal polymer (LCP) resin, for example.

The coupling member 5X is a member installed on the installation surface 31X of the substrate 3X to couple the supporting member 4X to the substrate 3X. In other words, the supporting member 4X on which the sensor element 2X is provided (mounted) is fixed to (the installation surface 31X of) the substrate 3X via the coupling member 5X. Thus, the relative position of the supporting member 4X with respect to the substrate 3X is defined by the coupling member 5X. In the sensor device 1X according to this embodiment, the relative position of the supporting member 4X with respect to the substrate 3X is defined such that the normal L1X (see FIG. 13) to the supporting surface 41X of the supporting member 4X is aligned with the installation surface 31X. As used herein, if something "is aligned with" something else, it means that these two things are generally parallel to each other, i.e., these two things may naturally be exactly parallel to each other but may also be arranged to form an angle of at most several degrees (which may be less than 10 degrees, for example) between them. That is to say, the normal L1X to the supporting surface 41X is generally parallel to the installation surface 31X of the substrate 3X (i.e., the normal L1X may be exactly parallel to the installation surface 31X or may also form an angle of at most several degrees with respect to the installation surface 31X). In this embodiment, the normal L1X to the supporting surface 41X may be exactly parallel to the installation surface 31X of the substrate 3X, for example.

More specifically, the coupling member 5X has a first surface 51X and a second surface 52X as shown in FIG. 15. The first surface 51X is fixed to the installation surface 31X of the substrate 3X. The second surface 52X intersects with the first surface 51X. The supporting member 4X is fixed to the second surface 52X. That is to say, the first surface 51X of the coupling member 5X is immobilized with respect to the installation surface 31X of the substrate 3X. Likewise, the second surface 52X of the coupling member 5X is also immobilized with respect to the attaching surface 42X of the supporting member 4X.

As a means for fixing (the first surface 51X of) the coupling member 5X onto (the installation surface 31X of) the substrate 3X, any appropriate means such as adhesion, pressure-sensitive adhesion, brazing, welding, or crimping may be adopted, for example. In this embodiment, a means for fixing (the first surface 51X of) the coupling member 5X to the substrate 3X is adhesion with an adhesive layer 511X (see FIG. 13). Likewise, as a means for fixing (the second surface 52X of) the coupling member 5X onto (the attaching surface 42X of) the supporting member 4X, any appropriate means such as adhesion, pressure-sensitive adhesion, brazing, welding, or crimping may be adopted, for example. In this embodiment, a means for fixing (the second surface 52X of) the coupling member 5X to the supporting member 4X is adhesion with an adhesive layer 521X (see FIG. 13).

In this embodiment, the first surface 51X is one surface along the Z-axis of the coupling member 5X and the second surface 52X is one surface along the Y-axis of the coupling member 5X. Since the coupling member 5X has a cuboid shape overall, the first surface 51X and the second surface 52X are generally perpendicular to each other and are adjacent to each other. As used herein, if something is "generally perpendicular to" something else, the two things may naturally be exactly perpendicular to each other (i.e., intersect with each other at right angles (90 degrees)) but may also form an angle of at most 90±several degrees (e.g., less than 10 degrees) between themselves. In this embodiment, the first surface 51X may be exactly perpendicular to the second surface 52X, for example.

Thus, fixing the coupling member 5X with such a shape not only to (the installation surface 31X of) the substrate 3X on the first surface 51X but also to (the attaching surface 42X of) the supporting member 4X on the second surface 52X allows the supporting member 4X to be coupled to the substrate 3X. In other words, the sensor element 2X provided on the supporting member 4X is indirectly supported by the substrate 3X via the supporting member 4X and the coupling member 5X. In this case, the first surface 51X and the second surface 52X intersect with each other (at right angles in this embodiment), and therefore, the supporting member 4X is coupled to the substrate 3X via the coupling member 5X so that the normal L1X to the supporting surface 41X of the supporting member 4X is aligned with (e.g., parallel to in this embodiment) the installation surface 31X.

In addition, the coupling member 5X further includes at least one spacer 53X (see FIG. 15) protruding from a surface, facing the supporting member 4X, (i.e., the second surface 52X) of the coupling member 5X toward the supporting member 4X. In this embodiment, the coupling member 5X includes a plurality of (e.g., four) spacers 53X. Each of the spacers 53X may be formed in, for example, a dome shape (hemispherical shape). These (four) spacers 53X may be arranged at respective positions, facing the four corners of the attaching surface 42X of the supporting member 4X, for example, on the second surface 52X. Providing these spacers 53X allows a certain interval to be left between the second surface 52X of the coupling member 5X and the attaching surface 42X of the supporting member 4X as shown in FIG. 16C.

The height of each spacer 53X, i.e., the protrusion height of the spacer 53X from the second surface 52X, may fall within the range from 0.05 mm to 0.2 mm, for example. In this embodiment, each spacer 53X may have a height of 0.15 mm, for example. This allows an interval (gap) of 0.15 mm to be left between the second surface 52X of the coupling member 5X and the attaching surface 42X of the supporting member 4X.

In this embodiment, as measured along the Z-axis (i.e., along the thickness of the substrate 3X), the dimension of the coupling member 5X is larger than that of the supporting member 4X as shown in FIG. 16B. That is to say, the second surface 52X of the coupling member 5X has a larger Z-axis dimension than the attaching surface 42X of the supporting member 4X. In addition, the supporting member 4X is arranged to be aligned with the other end, opposite from one end facing the substrate 3X, of the second surface 52X. This allows a gap to be left between the installation surface 31X of the substrate 3X and the supporting member 4X. That is to say, the supporting member 4X is fixed just indirectly to the substrate 3X via the coupling member 5X and is not directly in contact with the substrate 3X.

The wiring member 6X is a member for electrically connecting the supporting member 4X to the substrate 3X. That is to say, in this embodiment, electrical connection between the supporting member 4X (processor circuit 43X) implemented as an ASIC and (the first electrodes 34X of) the substrate 3X is established by the wiring member 6X.

In this embodiment, the wiring member 6X is fixed to the installation surface 31X. That is to say, the wiring member 6X is immobilized with respect to the installation surface 31X of the substrate 3X. As a means for fixing the wiring member 6X onto (the installation surface 31X of) the substrate 3X, any appropriate means such as adhesion, pressure-sensitive adhesion, brazing, welding, or crimping may be adopted, for example. In this embodiment, a means for fixing the wiring member 6X to (the installation surface 31X of) the substrate 3X is adhesion with an adhesive layer 623X (see FIG. 13), for example.

In addition, in this embodiment, the wiring member 6X is also fixed to the coupling member 5X. In this case, the wiring member 6X is immobilized with respect to the second surface 52X of the coupling member 5X. As a means for fixing the wiring member 6X onto (the second surface 52X of) the coupling member 5X, any appropriate means such as adhesion, pressure-sensitive adhesion, brazing, welding, or crimping may be adopted, for example. In this embodiment, a means for fixing the wiring member 6X to (the second surface 52 of) the coupling member 5X is adhesion with an adhesive layer 521X (see FIG. 13), for example. That is to say, the adhesive layer 521X is used both to fix the supporting member 4X to the coupling member 5X and to fix the wiring member 6X to the coupling member 5X. Specifically, the adhesive layer 521 is formed over almost the entire second surface 52X of the coupling member 5X. The wiring member 6X (i.e., a first holding piece 621X to be described later) is fixed to a region, serving as a gap between the supporting member 4X and (the installation surface 31X of) the substrate 3X, of the second surface 52X.

In addition, the wiring member 6X further includes a plurality of lead terminals 61X and a holding member 62X. The holding member 62X holds the plurality of lead terminals 61X. In this embodiment, the wiring member 6X includes not only the plurality of lead terminals 61X and the holding member 62X but also a plurality of bonding wires 63X as well.

The holding member 62X may be made of a resin, for example, and has electrical insulation properties. In this embodiment, the holding member 62X may be made of an LCP resin, for example. In this embodiment, the wiring member 6X may include eighteen lead terminals 61X, for example. Each of the plurality of (eighteen) lead terminals 61X is made of a metal with electrical conductivity (such as copper or a copper alloy). The bonding wires 63X electrically connect both end portions of the lead terminals 61X to the supporting member 4X (processor circuit 43X) and the substrate 3X (first electrodes 34), respectively. Thus, the bonding wires 63X (including 36 bonding wires 63X, for example) of the wiring member 6X may be each configured as a gold wire or any other appropriate wire, which is sufficiently finer than the lead terminals 61X.

More specifically, the holding member 62X includes a first holding piece 621X and a second holding piece 622X. Each lead terminal 61X includes a portion extending along the installation surface 31X of the substrate 3X and a portion extending along the second surface 52X of the coupling member 5X and is formed in a generally L-shape as a whole. In this case, the first holding piece 621X and the second holding piece 622X are provided separately from each other. The first holding piece 621X holds one end portion of each lead terminal 61X and the second holding piece 622X holds the other end portion of the lead terminal 61X. The first holding piece 621X and the second holding piece 622X are mechanically connected together via the plurality of lead terminals 61X. In this case, the lead terminals 61X have higher rigidity than the bonding wires 63X to say the least. Thus, the relative positional relationship between the first holding piece 621X and the second holding piece 622X is maintained by the plurality of lead terminals 61X.

In addition, the wiring member 6X is fixed to (the second surface 52X of) the coupling member 5X via the first holding piece 621X and to (the installation surface 31X of) the substrate 3X via the second holding piece 622X. Furthermore, the tip portion of each lead terminal 61X running through the first holding piece 621X is electrically connected to an associated one of the electrodes 82X (see FIG. 20A) of the supporting member 4X via an associated one of the bonding wires 63X. Meanwhile, the tip portion of each lead terminal 61X running through the second holding piece 622X is electrically connected to an associated one of the first electrodes 34X of the substrate 3X via an associated one of the bonding wires 63X.

The case 7X (see FIG. 14) is bonded to the substrate 3X. The case 7X houses at least the sensor element 2X between the installation surface 31X of the substrate 3X and the case 7X itself. The case 7X may be made of a metallic material, for example. The case 7X is fixed to the installation surface 31X of the substrate 3X, thus forming, between the case 7X and the installation surface 31X of the substrate 3X, a space to house the sensor element 2X, the supporting member 4X, the coupling member 5X, and the wiring member 6X.

As shown in FIG. 14, the case 7X includes a case body 71X and a flange portion 72X. The case body 71X is formed in the shape of a box, one surface along the Z-axis of which (i.e., one surface facing the substrate 3X) is open. Each corner portion of the case body 71X has a rounded shape with curvature. The flange portion 72X is a portion protruding outward from an outer peripheral edge of the opening of the case body 71X. Bonding the flange portion 72X onto the rib 33 of the substrate 3X allows the case 7X to be bonded onto the substrate 3X. As a means for fixing (bonding) the case 7X onto the substrate 3X, any appropriate means such as adhesion, pressure-sensitive adhesion, brazing, welding, or crimping may be adopted, for example. In this embodiment, a means for fixing the case 7X to the substrate 3X is adhesion, for example.

In this embodiment, the case 7X is hermetically bonded to the substrate 3X, thereby forming a hermetically sealed space between the case 7X and the installation surface 31X of the substrate 3X. Therefore, the sensor element 2X and other members are housed in the hermetically sealed space, thus allowing the sensor device 1X to reduce the chances of the sensor element 2X being affected by humidity, for example.

The sensor device 1X according to this embodiment includes the processor circuit 43X as shown in FIGS. 16A and 16B. In this embodiment, the processor circuit 43X is provided for the ASIC serving as the supporting member 4X. The processor circuit 43X performs processing on an electrical signal output from the sensor element 2X. In this embodiment, the processor circuit 43X is provided for the supporting member 4X. In other words, the supporting member 4X includes the processor circuit 43X for performing processing on the electrical signal output from the sensor element 2X.

In this embodiment, the processor circuit 43X converts an analog electrical signal (analog signal) output from the sensor element 2X into a digital signal. The processor circuit 43X performs an appropriate type of processing such as noise reduction and temperature compensation. In addition, the processor circuit 43X further applies a drive signal for driving the sensor element 2X to the sensor element 2X.

Optionally, the processor circuit 43X may also perform arithmetic processing such as integration process or differentiation process. For example, making the processor circuit 43X perform integration process on the electrical signal output from the sensor element 2X allows the sensor device 1X to obtain an integral value of the angular velocity around the Y-axis, i.e., the angle around the Y-axis. On the other hand, making the processor circuit 43X perform differentiation process on the electrical signal output from the sensor element 2X allows the sensor device 1X to obtain a differential value of the angular velocity around the Y-axis, i.e., the angular acceleration around the Y-axis.

(2.2) How to Mount to Mount Board

Figure 17:
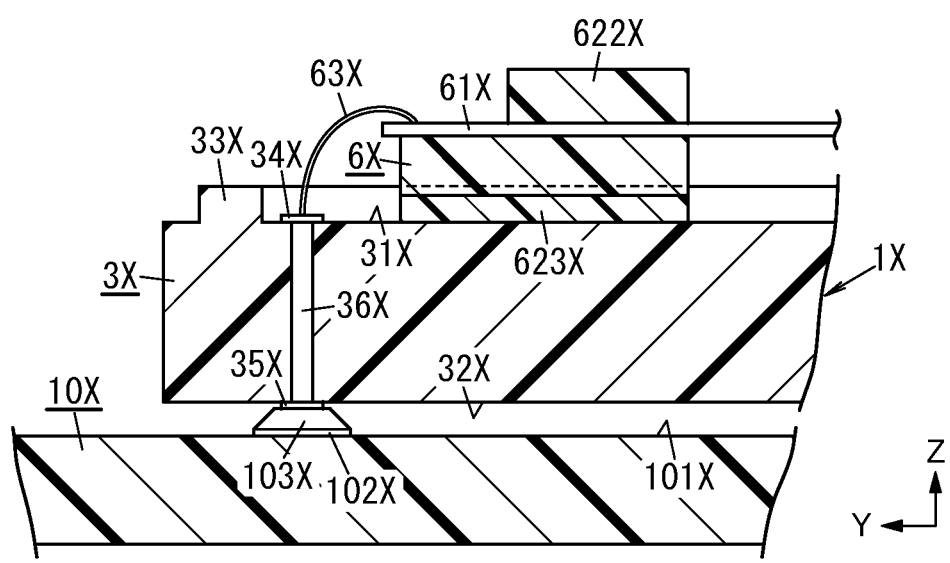
FIG. 17 is a schematic cross-sectional view illustrating a configuration for a principal part of the sensor device.

Next, it will be described with reference to FIG. 17 how to mount the sensor device 1X according to this embodiment onto the mount board 10X.

As described above, in this embodiment, the sensor device 1X is supposed to be flip-chip bonded onto the mount board 10X with the surface, opposite from the installation surface 31X, of the substrate 3X (i.e., the mounting surface 32X of the substrate 3X) facing toward the mount board 10X such a printed wiring board. That is to say, the sensor device 1X is mounted onto the mount board 10X with the mounting surface 32X of the substrate 3X arranged to face one surface 101X of the mount board 10X as shown in FIG. 17.

Specifically, the sensor device 1X is mounted onto the mount board 10X by bonding the second electrodes 35X, provided on the mounting surface 32X of the substrate 3X, onto substrate electrodes 102X, provided on the one surface 101X of the mount board 10X, with bonding members 103X. The bonding members 103X are members with electrical conductivity, which may be gold (Au) bumps or solder, for example. Alternatively, the mounting surface 32X of the substrate 3X and the one surface 101X of the mount board 10X may be mechanically bonded together with an underfilling material, for example.

In this case, the second electrodes 35X connected to (the substrate electrodes 102X of) the mount board 10X are continuous via the vias 36X with the first electrodes 34X provided on the installation surface 31X of the substrate 3X. Each of the first electrodes 34X is further continuous, via the bonding wire 63X, with one end portion of an associated lead terminal 61X of the wiring member 6X, while the other end portion of each lead terminal 61X is continuous, via a bonding wire 63X, with an associated electrode 82X of the supporting member 4X (see FIG. 20A). Thus, the second electrodes 35X connected to (the substrate electrodes 102 of) the mount board 10 are electrically connected to the supporting member 4X via the vias 36X, the first electrodes 34X, the bonding wires 63X, the lead terminals 61X, and the bonding wires 63X. The supporting member 4X is implemented in this embodiment as an ASIC including the processor circuit 43X. Thus, this configuration allows electrical connection to be established between the mount board 10X and the processor circuit 43X.

(2.3) Configuration for Sensor Element

Figure 18A:
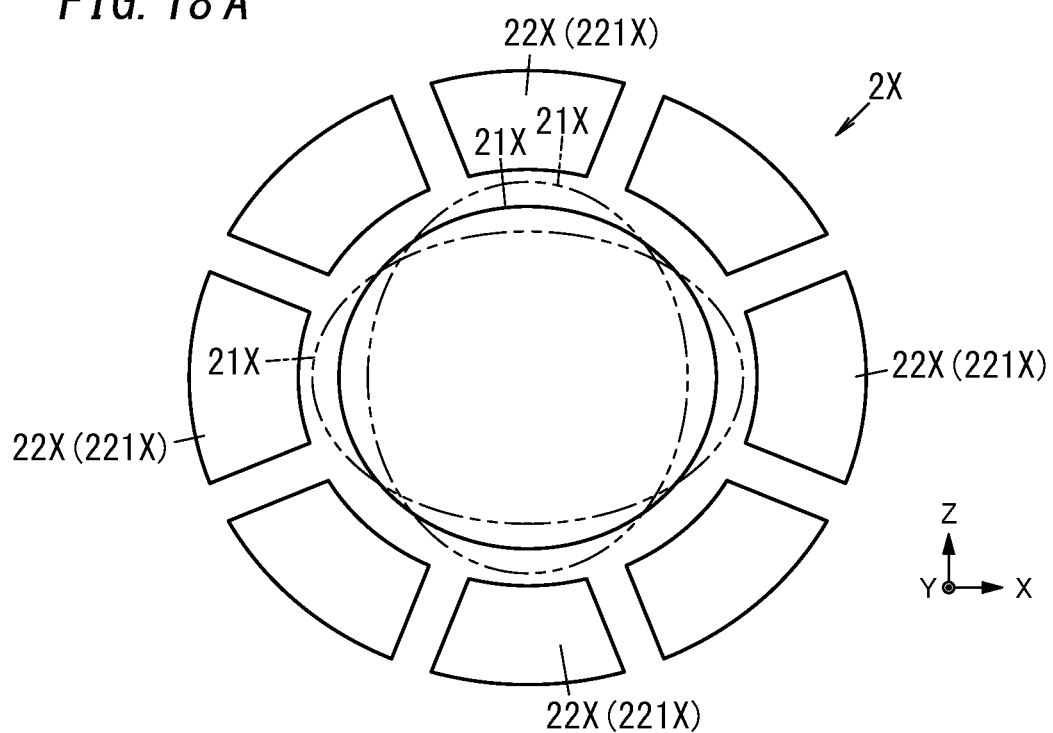
FIGS. 18A and 18B are conceptual diagrams illustrating the operating principle of a sensor element of the sensor device.
Figure 18B:
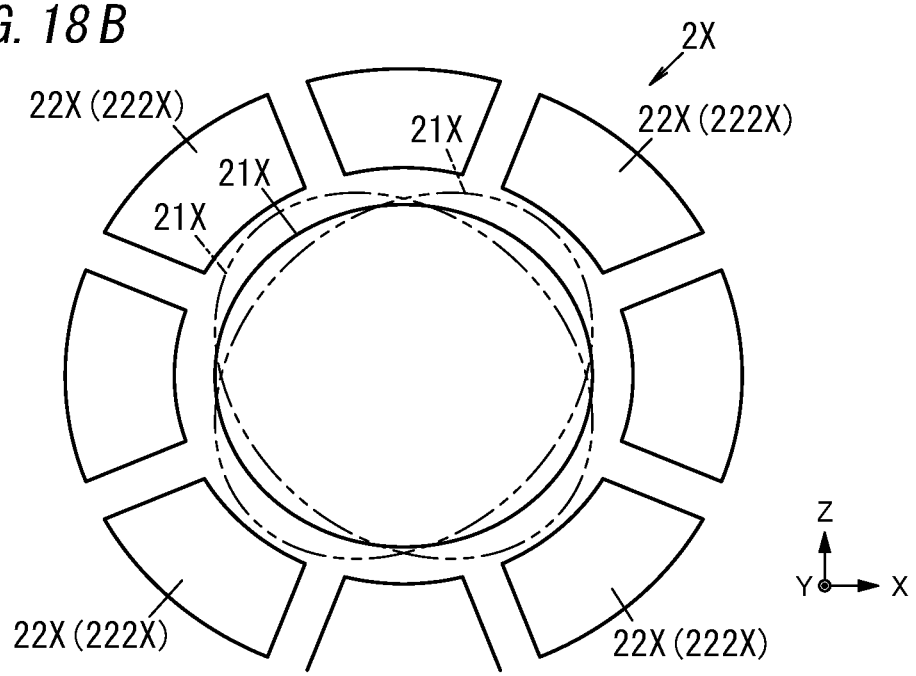

Next, a configuration for the sensor element 2X will be described with reference to FIGS. 18A and 18B. FIGS. 18A and 18B are conceptual diagrams illustrating the operating principle of the sensor element 2X.

In this embodiment, the sensor element 2X may be implemented as, for example, a capacitive bulk ultrasonic disk gyroscope to be driven at radio frequencies (falling within the MHz band). This gyroscope (sensor element 2X) includes a base plate, a moving portion 21X, and a plurality of electrodes 22X.

The moving portion 21X is supported over the base plate with an insulating layer interposed between them. The plurality of electrodes 22X are arranged around the moving portion 21X to surround the moving portion 21X. A very narrow gap is left between each electrode 22X and the moving portion 21X. These electrodes 22X may excite and detect at least two modified bulk ultrasonic resonance modes in the moving portion 21X.

The moving portion 21X is a resonator, which is formed in a disk shape which is circular in a plan view. In this embodiment, the moving portion 21X is made of a non-piezoelectric substance such as single crystalline or polycrystalline silicon and does not have to be made of a piezoelectric material. Alternatively, the moving portion 21X may also be made of a semiconductor such as silicon carbide, gallium nitride, aluminum nitride, or quartz or a metallic material.

The plurality of electrodes 22X includes driving electrodes 221X and detecting electrodes 222X. The moving portion 21X is deformed, by precession movement, between the driving mode shown in FIG. 18A and the detection mode shown in FIG. 18B. That is to say, the disklike moving portion 21X vibrates, within a plane perpendicular to the center axis thereof (i.e., an axis parallel to the Y-axis), so as to repeat deformation including alternate expansion and contraction in two orthogonal directions. The sensor element 2X outputs, as an electrical signal, the magnitude of deformation (magnitude of movement) of the moving portion 21X. That is to say, the magnitude of the deformation of the moving portion 21X manifests itself as a variation in capacitance between the moving portion 21X and the detecting electrodes 222X. Thus, the sensor element 2X outputs an electrical signal representing the variation in capacitance.

(2.4) Arrangement of Connection Members

Figure 19:
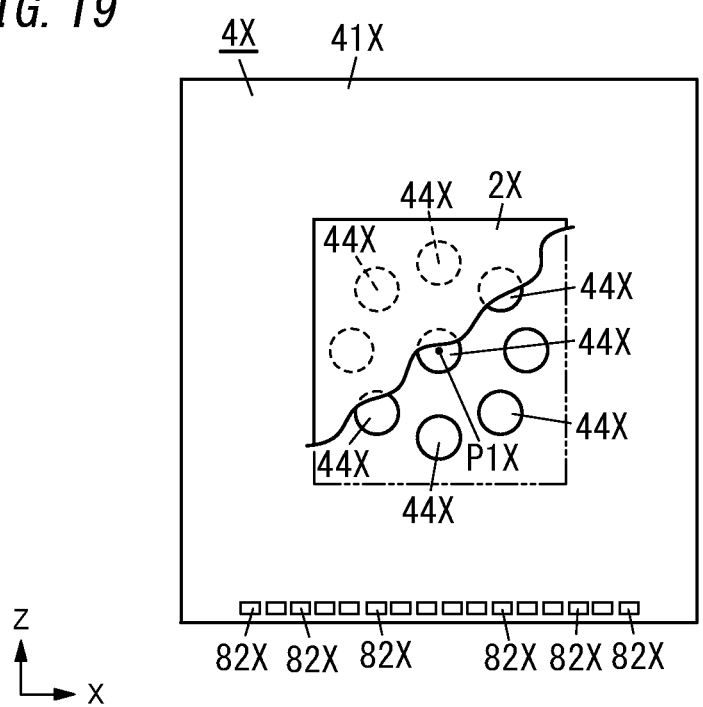
FIG. 19 is a schematic representation illustrating a supporting member of the sensor device as viewed from over a supporting surface thereof.

Next, an arrangement of connection members 44X for connecting the supporting member 4X and the sensor element 2X together will be described with reference to FIG. 19. FIG. 19 is a schematic representation illustrating the supporting member 4X as viewed from over the supporting surface 41X thereof. In FIG. 19, the sensor element 2X is illustrated in a partially cutaway form. In addition, FIG. 19 illustrates the arrangement of the connection members 44X just conceptually. For example, although nine connection members 44X are arranged in FIG. 19 on the supporting surface 41X, this does not mean that the number of the connection members 44X has to be nine. Alternatively, seventeen connection members 44X may be arranged on the supporting surface 41X as shown in FIG. 15, for example.

In this embodiment, a plurality of AuSn solder bumps are provided as the connection members 44X between the supporting member 4X and the sensor element 2X. In addition, the plurality of (e.g., nine in the example illustrated in FIG. 19) connection members 44X (AuSn solder bumps) are arranged to be point-symmetric at least with respect to the center point P1X of the sensor element 2X. That is to say, the plurality of connection members 44X connecting the supporting member 4X and the sensor element 2X together are arranged within the supporting surface 41X to be point-symmetric with respect to the center point P1X of the sensor element 2X as a point of symmetry (i.e., the center of symmetry).

Specifically, when the supporting member 4X is viewed from over the supporting surface 41X, one connection member 4X is placed on the center point P1X of the sensor element 2X and a plurality of (e.g., eight in the example illustrated in FIG. 19) connection members 44X are arranged along a circular ring, of which the center is defined by the center point P1X. The plurality of connection members 44X arranged around the center point P1X are arranged to form a circular ring pattern, of which the center is defined by the center point P1X. Thus, the plurality of connection members 44X that forms the circular ring pattern are arranged to surround the one connection member 4X placed on the center point P1X. In addition, the plurality of connection members 44X that forms the circular ring pattern are arranged at regular intervals along the circumference of the center point P1X.

In this embodiment, when the supporting member 4X is viewed from over the supporting surface 41X, each of the plurality of (e.g., nine in the example illustrated in FIG. 19) connection members 44X is formed to have a circular shape. In particular, the one connection member 4X placed on the center point P1X is formed to have the shape of a circle, of which the center is defined by the center point P1X, such that its shape is also point-symmetric with respect to the center point P1X when the supporting member 4X is viewed from over the supporting surface 41X.

Meanwhile, the center point P1X of the sensor element 2X is a point located at the center (or the center of gravity) of a surface, facing the supporting surface 41X, of the sensor element 2X (i.e., the surface to be bonded to the supporting member 4X). The sensor element 2X outputs an electrical signal representing an angular velocity around a normal L1X (Y-axis), passing through this center point P1X, to the supporting surface 41X. That is to say, the normal L1X (Y-axis), passing through this center point P1X of the sensor element 2X, to the supporting surface 41X is the detection axis of the sensor element 2X.

As described above, the sensor device 1X further includes the plurality of connection members 44X that connect the supporting member 4X and the sensor element 2X together. The plurality of connection members 44X are arranged to be point-symmetric with respect to the center point P1X of the sensor element 2X. This makes the distribution of the stress transferred from the supporting member 4X to the sensor element 2X via the plurality of connection members 44X point-symmetric with respect to the center point P1X. This reduces, even if stress is applied from the mount board 10X to the supporting member 4X through the substrate 3X and the coupling member 5X due to, for example, a difference in coefficient of thermal expansion between the mount board 10X and the substrate 3X (or the supporting member 4X or the coupling member 5X), the chances of the result of detection by the sensor element 2X being affected by the stress. That is to say, even if stress is applied from the supporting member 4X to the sensor element 2X, the distribution of the stress becomes point-symmetric with respect to the center point P1X, thus making the stress applied to the sensor element 2X biased much less significantly with respect to the center point P1X and thereby reducing the chances of the result of detection by the sensor element 2X being affected by the stress.

Furthermore, the plurality of connection members 44X have only to be arranged to be point-symmetric with respect to at least the center point P1X of the sensor element 2X. Thus, the plurality of connection members 44X may also be arranged, for example, so as to form at least double circular ring patterns (i.e., two or more concentric ring patterns), of which the center is defined by the center point P1X. Furthermore, the connection member 44X does not have to be placed on, but may be omitted from, the center point P1X.

(2.6) Electrode Structure

Figure 20A:
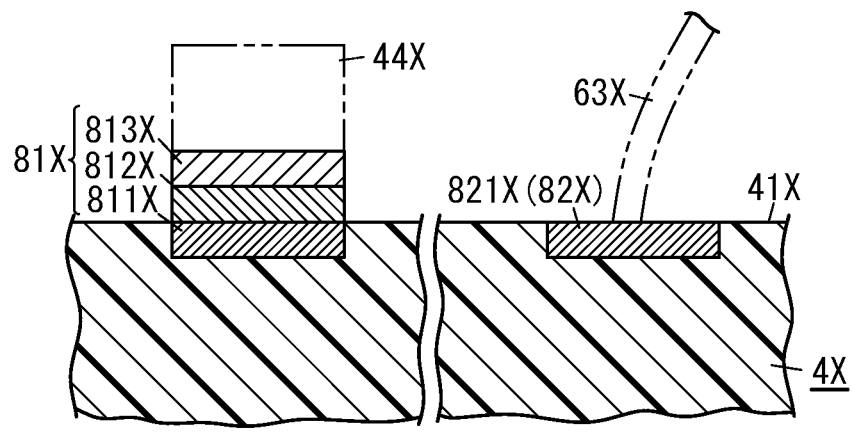
FIG. 20A is a schematic cross-sectional view illustrating a first implementation of an electrode of the supporting member in the sensor device.
Figure 20B:
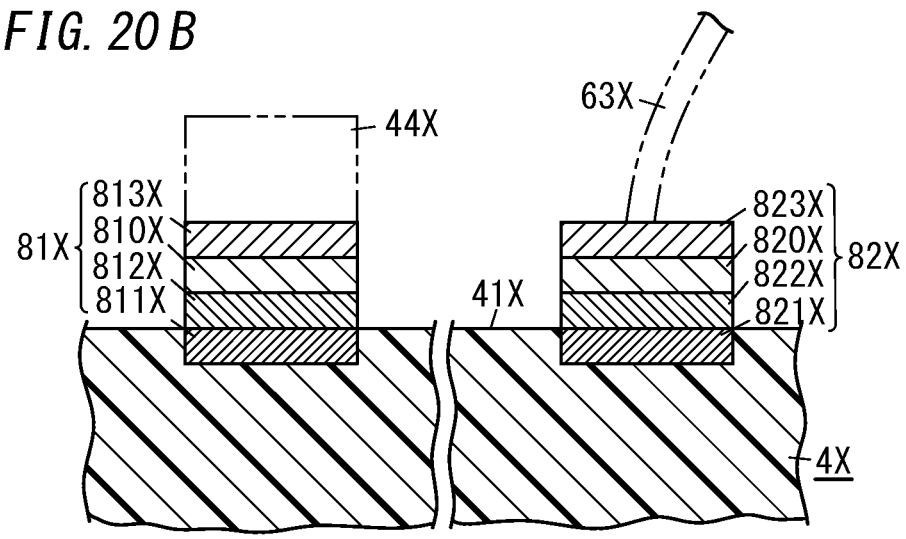
FIG. 20B is a schematic cross-sectional view illustrating a second implementation of an electrode of the supporting member in the sensor device.

Next, the structure of electrodes 81X, 82X provided for the supporting member 4X will be described with reference to FIGS. 20A and 20B. FIG. 20A is a schematic cross-sectional view of a principal part illustrating the structure of one of the electrodes 81X and one of the electrodes 82X according to a first implementation. FIG. 20B is a schematic cross-sectional view of a principal part illustrating the structure of one of the electrodes 81X and one of the electrodes 82X according to a second implementation. Note that FIGS. 20A and 20B illustrate the schematic structure of the electrodes 81X, 82X just conceptually and that the ratio of the dimensions (including thicknesses) of respective constituent elements illustrated on these drawings does not always reflect their actual dimensional ratio.

In this embodiment, the supporting member 4X includes the electrodes 81X for electrically connecting the sensor element 2X to the supporting member 4X (hereinafter referred to as "sensor-connecting electrodes"); and the electrodes 82X for electrically connecting the substrate 3X to the supporting member 4X via the wiring member 6X (hereinafter referred to as "substrate-connecting electrodes"). All of these electrodes 81X, 82X are arranged on the supporting surface 41X of the supporting member 4X. In particular, in this embodiment, the supporting member 4X is implemented as an ASIC including the processor circuit 43X. Thus, to electrically connect the sensor element 2X and the substrate 3X to the processor circuit 43X, the electrodes 81X and the electrodes 82X are provided for the supporting member 4X.

The sensor-connecting electrodes 81X are connected to the sensor element 2X via the connection members 44. Each of the substrate-connecting electrodes 82X is connected to one end portion of a lead terminal 61X via a bonding wire 63X. That is to say, AuSn solder bumps serving as the connection members 44 are connected to the sensor-connecting electrodes 81X and the bonding wires 63X are connected to the substrate-connecting electrodes 82X. A plurality of sensor-connecting electrodes 81X are provided to be associated one to one with the plurality of connection members 44. A plurality of substrate-connecting electrodes 82X are provided to be associated one to one with the plurality of bonding wires 63X (see FIG. 19). That is to say, a plurality of electrodes 81X and a plurality of electrodes 82X are provided for the supporting member 4X.

For this type of electrodes 81X, 82X (in particular, the sensor-connecting electrodes 81X), an electrode having a structure in which an Ni plating layer and an Au plating layer are stacked in this order on an underlying electrode of aluminum (Al), for example, is sometimes adopted. Thus, for the sensing-connecting electrodes 81X, under bump metal (UBM) for forming an AuSn solder bump on an underlying electrode 811X is provided.

In this case, the step of connecting the supporting member 4X to the sensor element 2X includes a heating process step of heating the connection members 44 to melt AuSn solder bumps serving as the connection members 44. In this heating process step, to melt the AuSn solder bumps, the electrodes 81X, 82X are also heated to a high temperature (of about 350° C., for example). At this time, nickel (Ni) in the Ni plating layer of the substrate-connecting electrodes 82X could precipitate and be oxidized on the surface of the Au plating layer. The nickel oxidized on the surface of the Au plating layer could obstruct connection of the bonding wires 63X, thus possibly causing a decrease in the bond strength between the bonding wires 63X and the substrate-connecting electrodes 82X. More specifically, if the bonding wires 63X are connected to the electrodes 82X by ball bonding, then the bond strength between a ball (Au ball) provided at the tip of each bonding wire 63X and an associated one of the electrodes 82X decreases. If the bonding wires 63X are connected to the electrodes 82X by wedge bonding, then the bond strength between each bonding wire 63X and an associated one of the electrodes 82X decreases.

The sensor device 1X according to this embodiment adopts the configurations shown in FIGS. 20A and 20B for the electrodes 81X, 82X to reduce the chances of causing such a decrease in bond strength between the bonding wires 63X and (the substrate-connecting electrodes 82X of) the supporting member 4X.

According to the first implementation, each substrate-connecting electrode 82X includes an underlying electrode 821X alone as shown in FIG. 20A. That is to say, the substrate-connecting electrode 82X for electrically connecting the substrate 3X to the supporting member 4X via the wiring member 6X has no plating layers and includes the underlying electrode 821X alone. On the other hand, each sensor-connecting electrode 81X includes an underlying electrode 811X, an Ni plating layer 812X, and an Au plating layer 813X. In this embodiment, both the underlying electrode 821X and the underlying electrode 811X may be made of aluminum (Al), for example. In the sensor-connecting electrode 81X, the Ni plating layer 812X and the Au plating layer 813X are stacked in this order on the underlying electrode 811X. That is to say, the Ni plating layer 812X is formed on the underlying electrode 811X and the Au plating layer 813X is formed on the Ni plating layer 812X.

That is to say, according to the first implementation shown in FIG. 20A, the supporting member 4X includes the sensor-connecting electrodes 81X, to which the sensor element 2X is electrically connected, and the substrate-connecting electrodes 82X, to which the substrate 3X is electrically connected. Each sensor-connecting electrode 81X includes the underlying electrode 811X and the plating layers (namely, the Ni plating layer 812 and the Au plating layer 813X). Each substrate-connecting electrode 82X includes the underlying electrode 821X alone. As can be seen, the plating layers (including the Ni plating layer 812X and the Au plating layer 813X) are formed on the underlying electrode 811X in only one type of electrodes (namely, the electrodes 81X), out of the electrodes 81X, 82X of the supporting member 4X, and no plating layers are provided on the underlying electrode 821X for the other type of electrodes (namely, the electrodes 82X). This prevents, even if the electrodes 81X, 82X are heated in the heating process step described above, nickel (Ni) in the Ni plating layer from precipitating on the surface of any electrode 82X (substrate-connecting electrode) with no plating layers. Thus, the first implementation reduces the chances of causing a decrease in bond strength between the bonding wires 63X and the substrate-connecting electrodes 82X. In addition, forming the plating layers (including the Ni plating layer 812 and the Au plating layer 813X) on the underlying electrode 811X allows UBM for forming AuSn solder bumps (connection members 44X) to be provided for the sensor-connecting electrodes 81X.

According to the second implementation, each sensor-connecting electrode 81X and each substrate-connecting electrode 82X both include a barrier layer 810X, 820X as shown in FIG. 20B.

In the second implementation, the sensor-connecting electrode 81X includes not only the underlying electrode 811X, the Ni plating layer 812, and the Au plating layer 813X but also the barrier layer 810X as well. The barrier layer 810X is arranged between the Ni plating layer 812 and the Au plating layer 813X. In the sensor-connecting electrode 81X, the Ni plating layer 812X, the barrier layer 810X, the Au plating layer 813X are stacked in this order on the underlying electrode 811X. That is to say, the Ni plating layer 812X is formed on the underlying electrode 811X of aluminum (Al), and the Au plating layer 813X is formed over the Ni plating layer 812X with the barrier layer 810X interposed between them. The barrier layer 810X arranged between the Ni plating layer 812X and the Au plating layer 813X reduces diffusion of nickel (Ni) from the Ni plating layer 812X to the Au plating layer 813X. In this embodiment, the barrier layer 810X may be made of, for example, palladium (Pd) or a palladium alloy.

According to the second implementation, the same configuration as that of the sensor-connecting electrode 81X is adopted for the substrate-connecting electrode 82X. Specifically, the substrate-connecting electrode 82X includes not only the underlying electrode 821X, an Ni plating layer 822X, and an Au plating layer 823X but also the barrier layer 820X as well. The barrier layer 820X is arranged between the Ni plating layer 822X and the Au plating layer 823X. In the substrate-connecting electrode 82X, the Ni plating layer 822X, the barrier layer 820X, the Au plating layer 823X are stacked in this order on the underlying electrode 821X. That is to say, the Ni plating layer 822X is formed on the underlying electrode 821X of aluminum (Al), and the Au plating layer 823X is formed over the Ni plating layer 822X with the barrier layer 820X interposed between them. The barrier layer 820X arranged between the Ni plating layer 822X and the Au plating layer 823X reduces diffusion of nickel (Ni) from the Ni plating layer 822X to the Au plating layer 823X. In this embodiment, the barrier layer 820X may be made of, for example, palladium (Pd) or a palladium alloy.

In this embodiment, the Ni plating layer 812X may have a thickness falling within the range from 1 μm to 10 μm, for example. The Ni plating layer 812X suitably has a thickness equal to or greater than 3 μm but equal to or less than 8 μm. In this embodiment, the Ni plating layer 812X has a thickness of 5 μm, for example. The barrier layer 810X may have a thickness falling within the range from 0.01 μm to 1.0 μm, for example. The barrier layer 810X suitably has a thickness equal to or greater than 0.05 μm but equal to or less than 0.5 μm. In this embodiment, the barrier layer 810X has a thickness of 0.2 µm, for example. The Au plating layer 813X may have a thickness falling within the range from 0.01 µm to 1.0 µm, for example. The Au plating layer 813X suitably has a thickness equal to or greater than 0.05 µm but equal to or less than 0.5 µm. In this embodiment, the Au plating layer 813X has a thickness of 0.15 µm, for example. As for the Ni plating layer 822X, barrier layer 820X, and Au plating layer 823X of the substrate-connecting electrode 82X, the same thicknesses as those of the Ni plating layer 812X, barrier layer 810X, and Au plating layer 813X of the sensor-connecting electrode 81X may be adopted.

That is to say, according to the second implementation shown in FIG. 20B, the supporting member 4X includes the sensor-connecting electrodes 81X, to which the sensor element 2X is electrically connected, and the substrate-connecting electrodes 82X, to which the substrate 3X is electrically connected. Each of the sensor-connecting electrodes 81X and substrate-connecting electrodes 82X includes the underlying electrode 811X, 821X, the Ni plating layer 812X, 822X, the Au plating layer 813X, 823X, and the barrier layer 810X, 820X. On the underlying electrode 811X, 821X, the Ni plating layer 812X, 822X, the barrier layer 810X, 820X, and the Au plating layer 813X, 823X are stacked one on top of another in this order. As can be seen, each electrode 81X (or 82X) of the supporting member 4X includes the barrier layer 810X (or 820X) between the Ni plating layer 812X (or 822X) and the Au plating layer 813X (or 823X). Thus, the barrier layer 810X (or 820X) reduces diffusion of nickel (Ni) from the Ni plating layer 812X (or 822X) toward the Au plating layer 813X (or 823X). This allows, even when the electrodes 81X, 82X are heated in the heating process step, the barrier layer 810X (or 820X) to reduce the diffusion of nickel (Ni), thus reducing the chances of nickel (Ni) precipitating on the surface of the Au plating layer 813X (or 823X). Thus, the second implementation reduces the chances of causing a decrease in bond strength between the bonding wires 63X and the substrate-connecting electrodes 82X. Furthermore, forming the plating layers (including the Ni plating layer 812X and the Au plating layer 813X) on the underlying electrode 811X allows UBM for forming AuSn solder bumps (connection members 44X) to be provided for the sensor-connecting electrodes 81X.

(3) Variations

Note that the third embodiment described above is only an exemplary one of various embodiments of the present disclosure and should not be construed as limiting. The drawings that have been referred to in the foregoing description of the third embodiment are all schematic representations. That is to say, the ratio of the dimensions (including thicknesses) of respective constituent elements illustrated on the drawings does not always reflect their actual dimensional ratio. Rather, the third embodiment may be readily modified in various manners depending on a design choice or any other factor without departing from the scope of the present disclosure. Note that the variations to be described below may be adopted in combination as appropriate.

(3.1) First Variation

Figure 21:
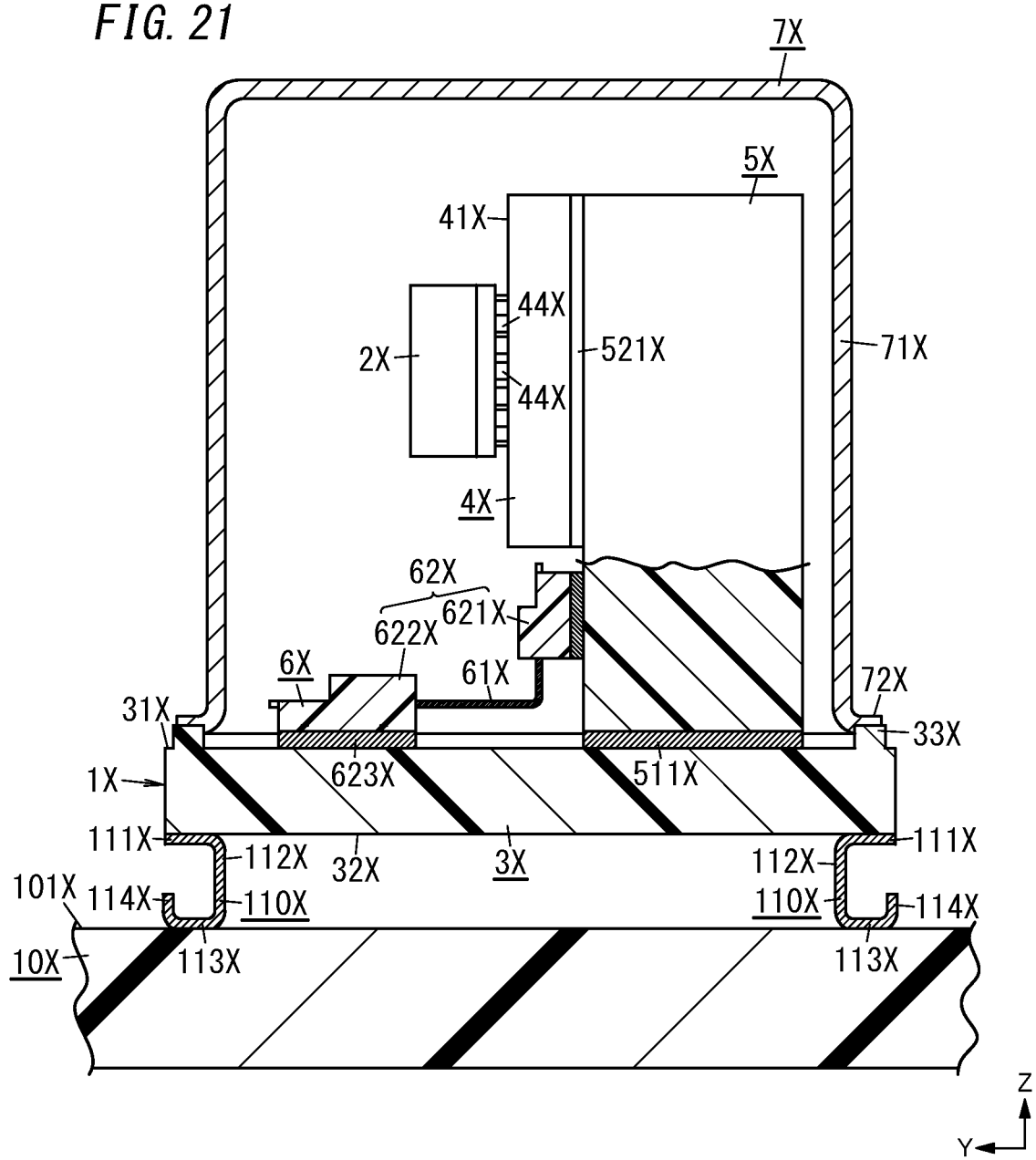
FIG. 21 is a partially cutaway side view of a sensor device according to a first variation of the third embodiment.

A sensor device 1X according to a first variation of the third embodiment is mounted onto the mount board 10X differently as shown in FIG. 21 from the sensor device 1X according to the third embodiment described above. Specifically, the sensor device 1X according to the third embodiment is bonded onto the mount board 10X via the bonding members 103X (see FIG. 17) such as gold (Au) bumps or solder, for example. On the other hand, the sensor device 1X according to this variation is bonded onto the mount board 10X via terminal members 110X.

In this variation, the sensor device 1X is mounted onto the mount board 10X with mounting surface 32X of the substrate 3X facing the one surface 101X of the mount board 10X as shown in FIG. 21. Each of the terminal members 110X is a member with spring properties (i.e., elasticity) and part of the terminal member 110X is fixed to the substrate 3X. In this variation, the terminal member 110X may be, for example, a lead terminal made of a metal with electrical conductivity (such as copper or a copper alloy). The sensor device 1X includes a plurality of terminal members 110X along outer peripheral edges of the mounting surface 32X of the substrate 3X. That is to say, the plurality of terminal members 110X are arranged along the outer peripheral edges of the mounting surface 32X.

As shown in FIG. 21, each terminal member 110X includes a first terminal piece 111X, a second terminal piece 112X, a third terminal piece 113X, and a fourth terminal piece 114X, and is formed in a generally C-shape overall. The first terminal piece 111X and the third terminal piece 113X are parallel to each other. The second terminal piece 112X couples one end of the first terminal piece 111X and one end of the third terminal piece 113X together. The fourth terminal piece 114X protrudes, from the other end, opposite from the second terminal piece 112X, of the third terminal piece 113X, toward the first terminal piece 111X. In the terminal member 110X having such a shape, the first terminal piece 111X is connected to the mounting surface 32X of the substrate 3X with solder, for example. Meanwhile, the third terminal piece 113X is connected to the one surface of the mount board 10X with solder, for example. In this manner, the terminal member 110X has one part thereof fixed to the substrate 3X and another part thereof fixed to the mount board 10X.

According to the configuration described above, to say the least, part (around the middle) of the second terminal piece 112X is connected directly to neither the substrate 3X nor the mount board 10X. Thus, letting the second terminal piece 112X flex itself due to the spring properties (elasticity) of at least the second terminal piece 112X allows the terminal member 110X to reduce the stress transferred between the mount board 10X and the substrate 3X. Thus, even if stress is applied from the mount board 10X to the terminal member 110X due to, for example, a difference in coefficient of thermal expansion between the mount board 10X and the substrate 3X, the stress may be reduced by the terminal member 110X and hardly transferrable to the substrate 3X, thus reducing the chances of the result of detection by the sensor element 2X being affected by the stress. In addition, arranging the plurality of connection members 44X as already described in the "(2.4) Arrangement of connection members" section also reduces the chances of the result of detection by the sensor element 2X being affected by the stress applied from the supporting member 4X to the sensor element 2X. Thus, the configuration according to this variation further reduces the chances of the result of detection by the sensor element 2X being affected by the stress due to the synergistic effect produced by such an arrangement of the connection members 44X and the terminal member 110X in combination.

Alternatively, in this variation, the mounting surface 32X of the substrate 3X and the one surface 101X of the mount board 10X may also be mechanically bonded together with an underfilling material, for example.

(3.2) Other Variations

Next, variations other than the first variation will be enumerated one after another.

In the third embodiment described above, the sensor element 2X detects an angular velocity around the Y-axis. However, this configuration is only an example and should not be construed as limiting. Alternatively, the sensor element 2X may also detect an angular velocity around the X-axis or around the Z-axis, for example. Still alternatively, the sensor element 2X may also be configured to detect angular velocities around two or more axes, not just the angular velocity around a single axis. For example, the sensor element 2X may also be implemented as a triaxial angular velocity sensor for detecting angular velocities around the X-, Y-, and Z-axes, respectively.

The sensor element 2X may also be configured to detect any physical quantity other than angular velocity. For example, the sensor element 2X may also be configured to detect any other physical quantity such as acceleration, angular acceleration, velocity, pressure, weight, length (distance), or temperature. Furthermore, the sensor element 2X does not have to detect a single physical quantity but may also be configured to detect a plurality of physical quantities. For example, the sensor element 2X may detect angular velocity and acceleration.

Furthermore, the sensor element 2X does not have to be an element that utilizes the MEMS technology but may also be any other type of element.

Furthermore, the number of the spacers 53X provided for the coupling member 5X does not have to be four but may also be one, two, three, or five or more. Furthermore, each spacer 53X does not have to have a dome shape but may also have a circular columnar, polygonal prismatic, conical, polygonal pyramidal, spherical, or any other appropriate shape.

Furthermore, in the third embodiment described above, the sensor device 1X is supposed to be flip-chip bonded onto the mount board 10X. However, the sensor device 1X does not have to be flip-chip bonded. For example, the sensor device 1X may also be configured to be surface-mounted (such as wire-bonded) instead of being flip-chip bonded or insertion-mounted onto the mount board 10X by providing lead terminals for the substrate 3X.

Furthermore, the substrate 3X does not have to have the shape, or be made of the material, described for the third embodiment. For example, the substrate 3X may also have a rectangular or circular shape in a plan view. Furthermore, the substrate 3X does not have to be made of a ceramic but may also be made of a resin or silicon, for example.

Furthermore, the supporting member 4X implemented as an ASIC including the processor circuit 43X is not an essential constituent element for the sensor device 1X. Alternatively, any other appropriate configuration may be adopted for the supporting member 4X. That is to say, the supporting member 4X does not have to be an electronic component but may also be a structure such as a simple plate member. Furthermore, the supporting member 4X does not have to have the shape, or be made of the material, described for the third embodiment. For example, the supporting member 4X may also have a rectangular or circular shape in a plan view. Furthermore, the supporting member 4X may also be a member made of a resin, silicon, or a ceramic, for example.

Furthermore, the coupling member 5X does not have to have the shape, or be made of the material, described for the third embodiment. For example, the coupling member 5X may also have a cubic shape or a polygonal prismatic shape (such as a triangular prismatic shape or a hexagonal prismatic shape). Alternatively, the coupling member 5X may also be configured as a stay with an L-shape in a side view.

Furthermore, the coupling member 5X does not have to be made of an LCP resin but may also be made of silicon, a metal, or a ceramic, for example.

Furthermore, the wiring member 6X does not have to be implemented as described for the third embodiment but may also be implemented as, for example, lead wires, a flexible substrate, a harness, or a connector, for example. Optionally, the wiring member 6X may also include an electrically conductive path formed on the surface of the coupling member 5X or an electrically conductive path embedded in the coupling member 5X.

Fourth Embodiment

Figure 22:
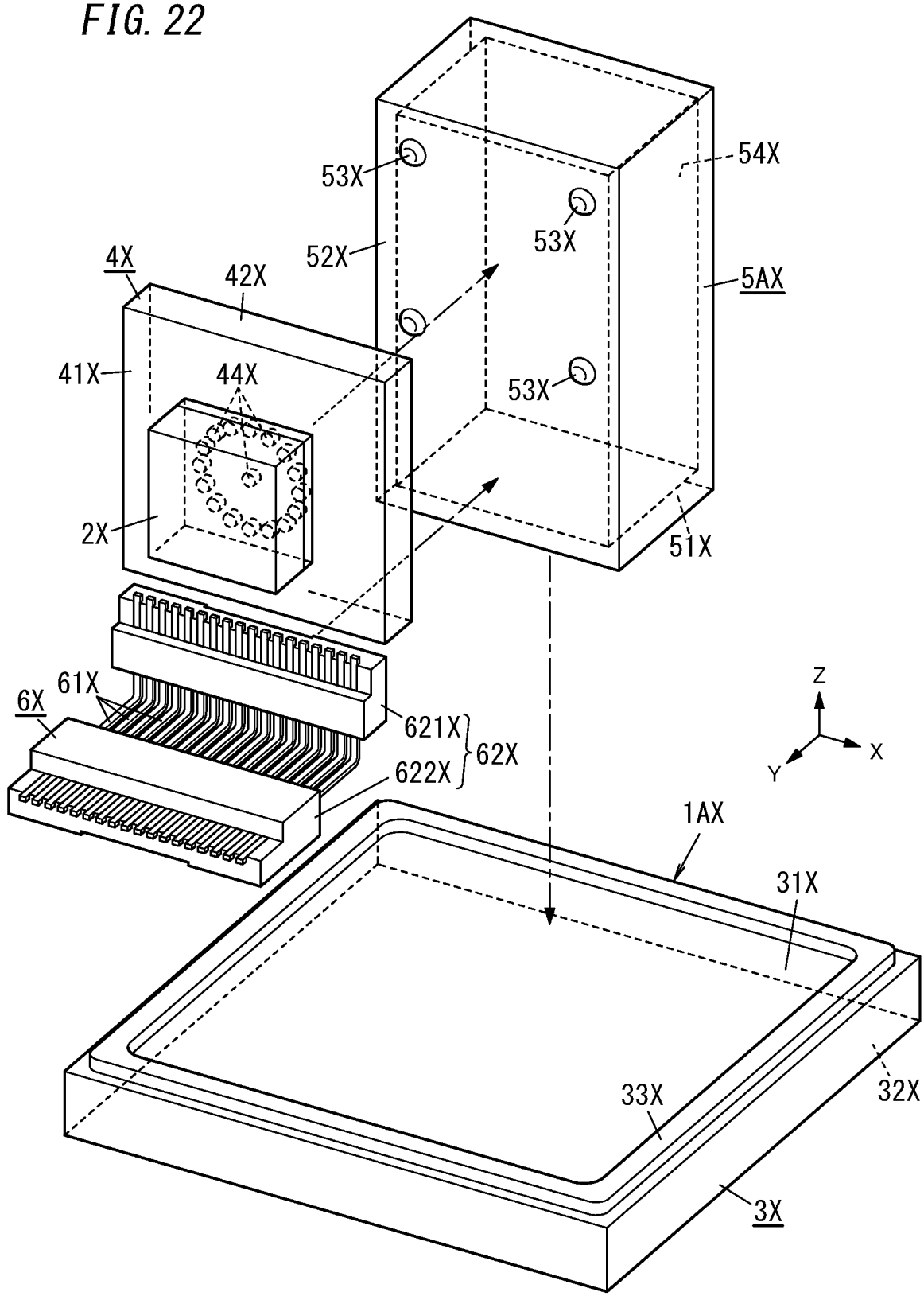
FIG. 22 is an exploded perspective view illustrating a configuration for a sensor device according to a fourth embodiment, from which a case is removed.

In a sensor device 1AX according to a fourth embodiment, the coupling member 5AX thereof has a hollow structure as shown in FIG. 22, which is a major difference from the sensor device 1X according to the third embodiment. In the following description, any constituent element of this fourth embodiment, having the same function as a counterpart of the third embodiment described above, will be designated by the same reference numeral as that counterpart's, and description thereof will be omitted herein as appropriate.

In this embodiment, the coupling member 5AX is formed in the shape of a cuboid having a hollow structure. This coupling member 5AX has a hollow portion 54X. The hollow portion 54X is a recess (depression), which is open through the other surface, located opposite in the Y-axis direction from the supporting member 4X, of the coupling member 5AX, i.e., the back surface opposite from the second surface 52X. That is to say, the coupling member 5AX embodies the hollow structure by providing the hollow portion 54X as the recess. According to this configuration, the supporting member 4X on which the sensor element 2X is provided is fixed onto the bottom wall of the hollow portion 54X (recess) of the coupling member 5AX.

The sensor device 1AX according to this embodiment allows the shock applied to the coupling member 5AX to be absorbed more significantly than coupling member 5X having a solid structure. This contributes to improving the shock absorbance of the sensor device 1AX.

Note that the shape of the coupling member 5AX illustrated in FIG. 22 is only an example. Alternatively, the coupling member 5AX may also have a hollow shape with no opening.

Optionally, the configuration described for the fourth embodiment (including variations thereof) may be adopted in combination as appropriate with the various configurations described for the third embodiment (including variations thereof).

First Reference Example

Figure 23:
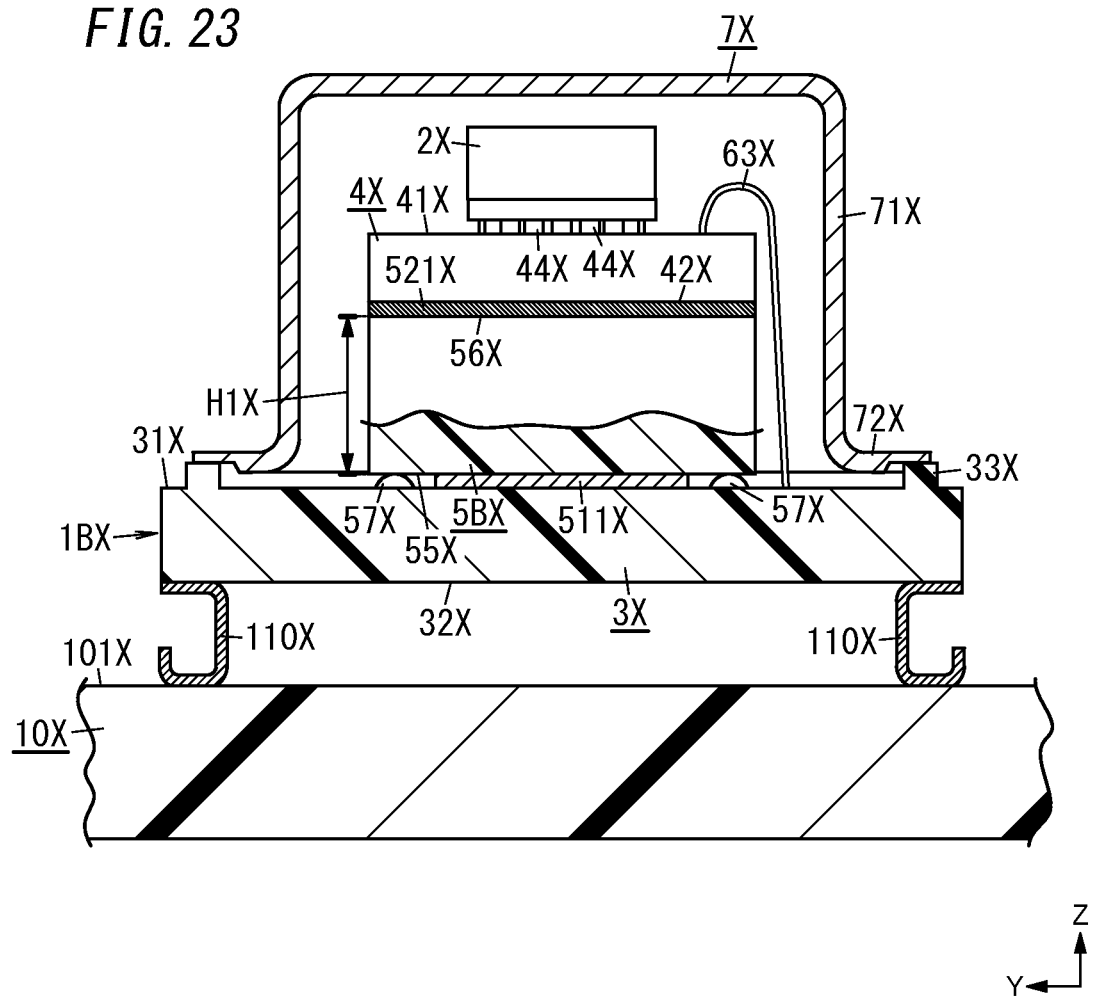
FIG. 23 is a partially cutaway side view of a sensor device according to a first reference example.

In a sensor device 1BX according to this reference example, relative positions of the substrate 3X and the supporting member 4X are different as shown in FIG. 23 from the sensor device 1X according to the third embodiment. In the following description, any constituent element of this first reference example, having the same function as a counterpart of the third embodiment described above, will be designated by the same reference numeral as that counterpart's, and description thereof will be omitted herein as appropriate.

In this reference example, the substrate 3X and the supporting member 4X are bonded together to have such positional relationship that the supporting surface 41X is aligned with the installation surface 31X as shown in FIG. 23. In the example illustrated in FIG. 23, the supporting surface 41X and the installation surface 31X are generally parallel to each other. In addition, in this reference example, the supporting member 4X on which the sensor element 2X is provided is supported over the installation surface 31X of the substrate 3X via the coupling member 5BX. In this reference example, the sensor element 2X is supposed to use the Z-axis as a detection axis and be configured to detect an angular velocity around the Z-axis as a target. The Z-axis is an axis aligned with a normal to the supporting surface 41X (installation surface 31X). Consequently, the sensor device 1BX will detect, as a target, the angular velocity applied to the sensor device 1BX itself as the sensor device 1BX turns around the normal to the supporting surface 41X (installation surface 31X).

Also, in this reference example, the supporting member 4X is directly connected to the substrate 3X via bonding wires 63X. Thus, in the sensor device 1BX according to this reference example, the plurality of lead terminals 61X (see FIG. 13) and the holding member 62X (see FIG. 13) are omitted.

As can be seen, the sensor device 1BX according to this reference example includes the sensor element 2X, the substrate 3X, the supporting member 4X, and the coupling member 5BX. The substrate 3X has an installation surface 31X. The supporting member 4X has a supporting surface 41X. On the supporting surface 41X, provided is the sensor element 2X. The coupling member 5BX is installed on the installation surface 31X. The supporting member 4X on which the sensor element 2X is provided is supported over the installation surface 31X of the substrate 3X via the coupling member 5BX.

More specifically, the coupling member 5BX has a cuboid shape with a reduced height, of which the Z-axis dimension (height H1X) is smaller than each of the X-axis dimension (width) and the Y-axis dimension (depth) thereof. As shown in FIG. 23, the coupling member 5BX has a back surface 55X and a surface 56X as two surfaces thereof along the Z-axis (i.e., along the height of the coupling member 5BX). The back surface 55X is fixed onto the installation surface 31X of the substrate 3X. The supporting member 4X is fixed on the surface 56X. That is to say, the back surface 55X of the coupling member 5BX is immobilized with respect to the installation surface 31X of the substrate 3X. Likewise, the surface 56X of the coupling member 5BX is also immobilized with respect to the attaching surface 42X of the supporting member 4X.

Fixing the coupling member 5BX having such a shape onto the (installation surface 31X of the) substrate 3X on the back surface 55X thereof and onto (the attaching surface 42X of) the supporting member 4X on the surface 56X allows the supporting member 4X to be coupled to the substrate 3X. In other words, the sensor element 2X provided on the supporting member 4X is supported indirectly over the substrate 3X via the supporting member 4X and the coupling member 5BX. In this case, the back surface 55X and the surface 56X are generally parallel to each other. Thus, the supporting member 4X and the substrate 3X are coupled together via the coupling member 5BX such that the supporting surface 41X of the supporting member 4X is aligned with the installation surface 31X. In other words, on the installation surface 31 of the substrate 3X, the coupling member 5BX, the supporting member 4X, and the sensor element 2X are stacked one on top of another in this order in one direction (i.e., Z-axis direction) aligned with a normal to the installation surface 31X.

As a means for fixing (the back surface 55X of) the coupling member 5BX onto (the installation surface 31X of) the substrate 3X, any appropriate means such as adhesion, pressure-sensitive adhesion, brazing, welding, or crimping may be adopted, for example. In this reference example, a means for fixing (the back surface 55X of) the coupling member 5BX to the substrate 3X is adhesion with an adhesive layer 511X. Likewise, as a means for fixing (the surface 56X of) the coupling member 5BX onto (the attaching surface 42X of) the supporting member 4X, any appropriate means such as adhesion, pressure-sensitive adhesion, brazing, welding, or crimping may be adopted, for example. In this reference example, a means for fixing (the surface 56X of) the coupling member 5BX to the supporting member 4X is adhesion with an adhesive layer 521X.

Furthermore, in this reference example, spacers 57X are provided between the substrate 3X and the coupling member 5BX. The sensor device 1BX includes a plurality of (e.g., four) spacers 57X. Each of the spacers 57X may be formed in, for example, a dome shape (hemispherical shape). These (four) spacers 57X may be arranged at respective positions, facing the four corners of the back surface 55X of the coupling member 5BX, for example, on the installation surface 31X of the substrate 3X. Providing these spacers 57X allows a certain interval to be left between the installation surface 31X of the substrate 3X and the back surface 55X of the coupling member 5BX as shown in FIG. 23.

In the sensor device 1BX according to the first reference example described above, the supporting member 4X on which the sensor element 2X is provided is supported over the installation surface 31X of the substrate 3X via the coupling member 5BX. This makes stress transferrable less easily from the substrate 3X to the sensor element 2X, compared to a configuration with no coupling member 5BX. That is to say, compared to the configuration in which the supporting member 4X is fixed directly on the substrate 3X, interposing the coupling member 5BX between the supporting member 4X and the substrate 3X makes stress transferrable less easily from the substrate 3X to the supporting member 4X in the sensor device 1BX, thus making stress hardly transferrable to the sensor element 2X. Thus, even if stress is applied from the mount board 10X to the substrate 3X due to a difference in coefficient of thermal expansion between the mount board 10X and the substrate 3X, for example, the result of detection by the sensor element 2X is affected less easily by the stress. Also, even if stress may be applied from the substrate 3X to the supporting member 4X due to a difference in coefficient of thermal expansion between the substrate 3X and the supporting member 4X, for example, the stress is reduced by the coupling member 5BX, thus reducing the chances of the result of detection by the sensor element 2X being affected by the stress.

Furthermore, as already described in the "(2.4) Arrangement of connection members" section for the third embodiment, arranging the plurality of connection members 44X also reduces the chances of the stress applied from the supporting member 4X to the sensor element 2X affecting the result of detection by the sensor element 2X. Thus, the configuration according to this reference example further reduces the chances of the result of detection by the sensor element 2X being affected by the stress due to the synergistic effect produced by such an arrangement of the connection members 44X and the coupling member 5BX. Likewise, the spring properties (elasticity) of the terminal members 110X as already described in the "(3.1) First variation" section for the third embodiment also reduces the chances of the stress applied from the mount board 10X to the substrate 3X affecting the result of detection by the sensor element 2X. Thus, the configuration according to this reference example further reduces the chances of the result of detection by the sensor element 2X being affected by stress due to the synergistic effect produced by the spring properties (elasticity) of the terminal members 110X and the coupling member 5BX.

Furthermore, in the sensor device 1BX, the supporting member 4X on which the sensor element 2X is provided is supported over the installation surface 31X of the substrate 3X via the coupling member 5BX. Thus, compared to a configuration having no coupling member 5BX, this configuration also reduces the chances of the result of detection by the sensor element 2X being affected by vibrations. That is to say, even if any vibration (including shock) is applied from the mount board 10X to the substrate 3X, for example, the vibration is reduced by the coupling member 5BX to the point of being hardly transferrable to the sensor element 2X provided on the supporting member 4X. Consequently, even if vibration is applied to the sensor device 1BX, the chances of the result of detection by the sensor element 2X being affected by the vibration may be reduced significantly.

In this case, the degree to which the transfer of the stress and vibration from the substrate 3X to the sensor element 2X is reducible varies according to the dimensions, material, shape, and other parameters of the coupling member 5BX, for example. In view of this consideration, the height H1X (i.e., the Z-axis dimension) of the coupling member 5BX suitably falls within the range from 0.1 mm to 1.5 mm, for example. The height H1X of the coupling member 5BX is more suitably equal to or greater than 0.5 mm but equal to or less than 1.0 mm. In this reference example, the coupling member 5BX may have a height H1X of 0.725 mm, for example. Also, the coefficient of thermal expansion of the coupling member 5BX is suitably between the coefficient of thermal expansion of the substrate 3X and the coefficient of thermal expansion of the supporting member 4X. Specifically, the coefficient of thermal expansion of the coupling member 5BX suitably falls within the range from 2 ppm/° C. to 8 ppm/° C., for example. The coefficient of thermal expansion of the coupling member 5BX is more suitably equal to or greater than 2.5 ppm/° C. but equal to or less than 7.5 ppm/° C. In this reference example, the coupling member 5BX may have a coefficient of thermal expansion of 3 ppm/° C., for example.

The advantage of reducing the chances of the result of detection by the sensor element 2X being affected by stress and vibrations by providing the coupling member 5X, 5AX is also achievable by the sensor devices 1X, 1AX according to the third and fourth embodiments, not just by the sensor device 1BX according to this reference example. That is to say, according to this reference example, on the installation surface 31X of the substrate 3X, the coupling member 5BX, the supporting member 4X, and the sensor element 2X are stacked one on top of another in this order in the Z-axis direction aligned with a normal to the installation surface 31X. However, this configuration is only an example and should not be construed as limiting. Alternatively, even in a configuration in which the supporting member 4X is fixed on the second surface 52X of the coupling member 5X, 5AX, supporting the supporting member 4X on which the sensor element 2X is provided over the installation surface 31X of the substrate 3X via the coupling member 5X, 5AX also makes the stress and vibrations hardly transferrable from the substrate 3X to the sensor element 2X.

Also, FIG. 23 illustrates an example in which the sensor device 1BX is bonded onto the mount board 10X via the terminal members 110X. However, this is only an example of the present disclosure and should not be construed as limiting. Alternatively, the sensor device 1BX may also be bonded onto the mount board 10X with bonding members 103X made of solder (see FIG. 17), for example.

Optionally, the configuration described for the first reference example (including variations thereof) may be adopted in combination, as appropriate, with the various configurations described for the third or fourth embodiment (including variations thereof). For example, the respective configurations described in the "(2.4) Arrangement of connection members," "(2.5) Electrode structure," and "(3.1) First variation" sections for the third embodiment may be adopted in combination, as appropriate, with the configuration described for the first reference example.

Second Reference Example

Figure 24:
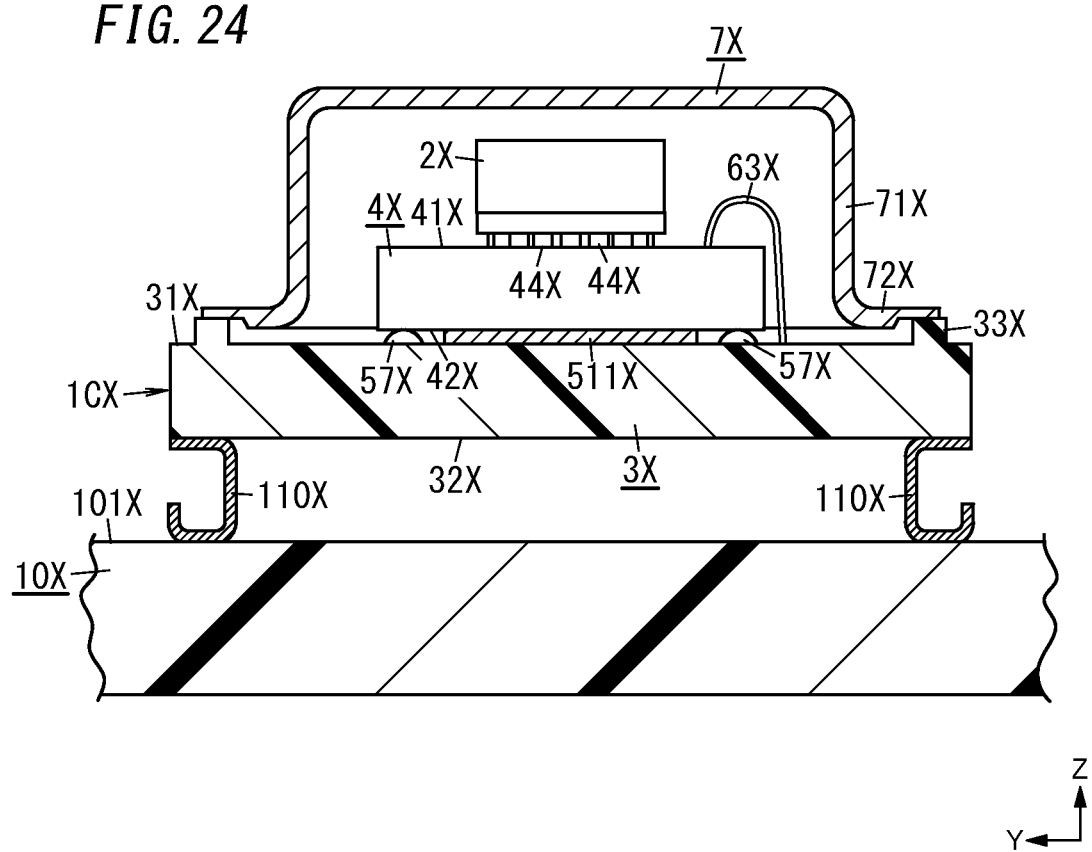
FIG. 24 is a partially cutaway side view of the sensor device according to the first reference example.

In a sensor device 1CX according to a second reference example, the supporting member 4X is fixed directly on the substrate 3X as shown in FIG. 24, which is a major difference from the sensor device 1BX according to the first reference example. In the following description, any constituent element of this second reference example, having the same function as a counterpart of the first reference example described above, will be designated by the same reference numeral as that counterpart's, and description thereof will be omitted as appropriate herein.

In this reference example, the coupling member 5BX (see FIG. 23) is omitted and the supporting member 4X is bonded directly onto the substrate 3X as shown in FIG. 24. That is to say, the supporting member 4X on which the sensor element 2X is provided is supported directly on the installation surface 31X of the substrate 3X. In other words, on the installation surface 31X of the substrate 3X, the supporting member 4X and the sensor element 2X are stacked one on top of the other in this order in one direction (Z-axis direction) aligned with a normal to the installation surface 31X.

As a means for fixing (the attaching surface 42X of) the supporting member 4X onto (the installation surface 31X of) the substrate 3X, any appropriate means such as adhesion, pressure-sensitive adhesion, brazing, welding, or crimping may be adopted. In this reference example, a means for fixing the supporting member 4X to the substrate 3X is adhesion with an adhesive layer 511X.

The sensor device 1CX according to this reference example includes no coupling member, and therefore, may have a reduced overall size. In particular, the sensor device 1CX may have its dimension reduced in one direction (Z-axis direction) aligned with a normal to the installation surface 31X of the substrate 3X as shown in FIG. 24.

Also, in the example illustrated in FIG. 24, the sensor device 1CX is bonded to the mount board 10X via the terminal members 110X. However, this is only an example of the present disclosure and should not be construed as limiting. Alternatively, the sensor device 1CX may also be bonded onto the mount board 10X via bonding members 103X (see FIG. 17) of solder, for example.

Optionally, the configuration described for the second reference example (including variations thereof) may be adopted in combination, as appropriate, with the various configurations described for the third or fourth embodiment (including variations thereof). For example, the respective configurations described in the "(2.4) Arrangement of connection members," "(2.5) Electrode structure," and "(3.1) First variation" sections for the third embodiment may be adopted in combination, as appropriate, with the configuration described for the second reference example.

Fifth Embodiment

Figure 25A:
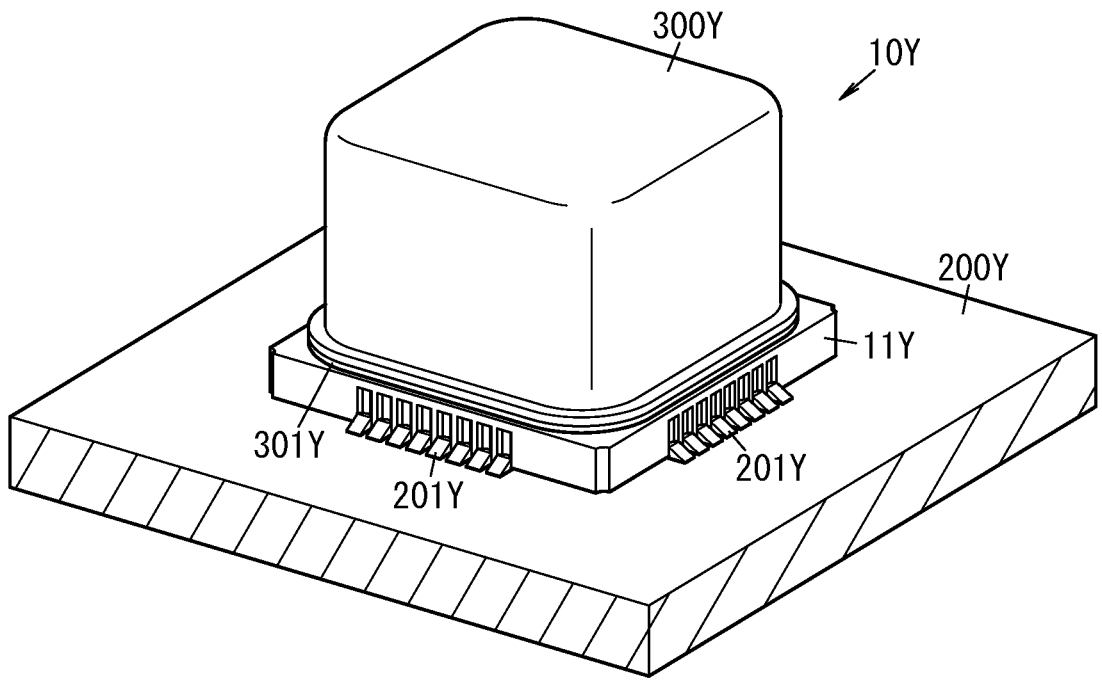
FIG. 25A is a perspective view illustrating a sensor device according to a fifth embodiment.
Figure 25B:
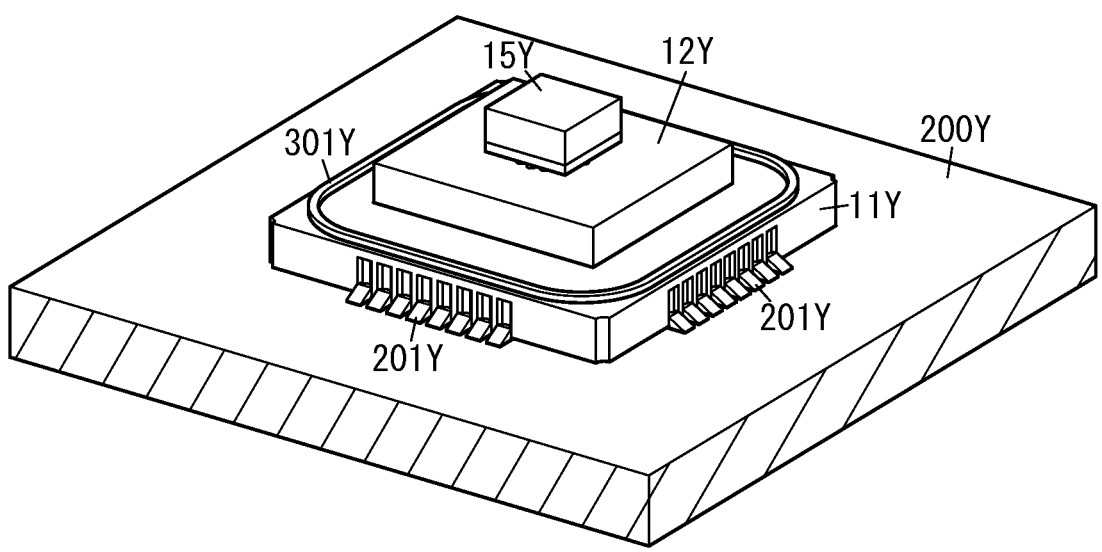
FIG. 25B is a perspective view illustrating part of the sensor device according to the fifth embodiment.

FIGS. 25A and 25B illustrate a sensor device 10Y according to a fifth embodiment. This sensor device 10Y may be implemented as, for example, an angular velocity sensor that utilizes the microelectromechanical systems (MEMS) technology. The sensor device 10Y includes a base board 11Y, an intermediate substrate 12Y, an adhesive portion 13Y (see FIG. 26B), a supporting portion 14Y (see FIG. 26B), and a sensor element 15Y. In the sensor device 10Y, the base board 11Y is mounted on the surface of a mount board 200Y such as a circuit board and the base board 11Y and the mount board 200Y are electrically connected together with a plurality of terminals 201Y. The base board 11Y, the intermediate substrate 12Y, and the sensor element 15Y are stacked one on top of another in this order on the mount board 200Y.

The base board 11Y is a circuit board of a ceramic formed in a flat plate shape. The intermediate substrate 12Y is implemented as an application specific integrated circuit (ASIC). That is to say, in this embodiment, the sensor element 15Y is mounted on a package of the intermediate substrate 12Y (ASIC) mounted on the base board 11Y.

A cap 300Y is provided on the surface of the base board 11Y. The cap 300Y is bonded onto the surface of the base board 11Y at a joint portion 301Y (such as an adhesive) having a frame shape. Inside the cap 300Y, housed are the intermediate substrate 12Y, the adhesive portion 13Y, and the supporting portion 14Y.

FIG. 25B illustrates a state where the cap 300Y is removed from the joint portion 301Y. The sensor element 15Y is provided on the intermediate substrate 12Y. That is to say, the sensor element 15Y is bonded onto the surface of the intermediate substrate 12Y. The sensor element 15Y is provided on the intermediate substrate 12Y such that a center PY thereof in the direction in which the sensor element 15Y is provided on the intermediate substrate 12Y agrees, in a plan view, with a center PY of the intermediate substrate 12Y in a bonding direction in which the intermediate substrate 12Y and the base board 11Y are bonded together. That is to say, the sensor element 15Y is located at the center of the surface of the intermediate substrate 12Y.

Figure 26A:
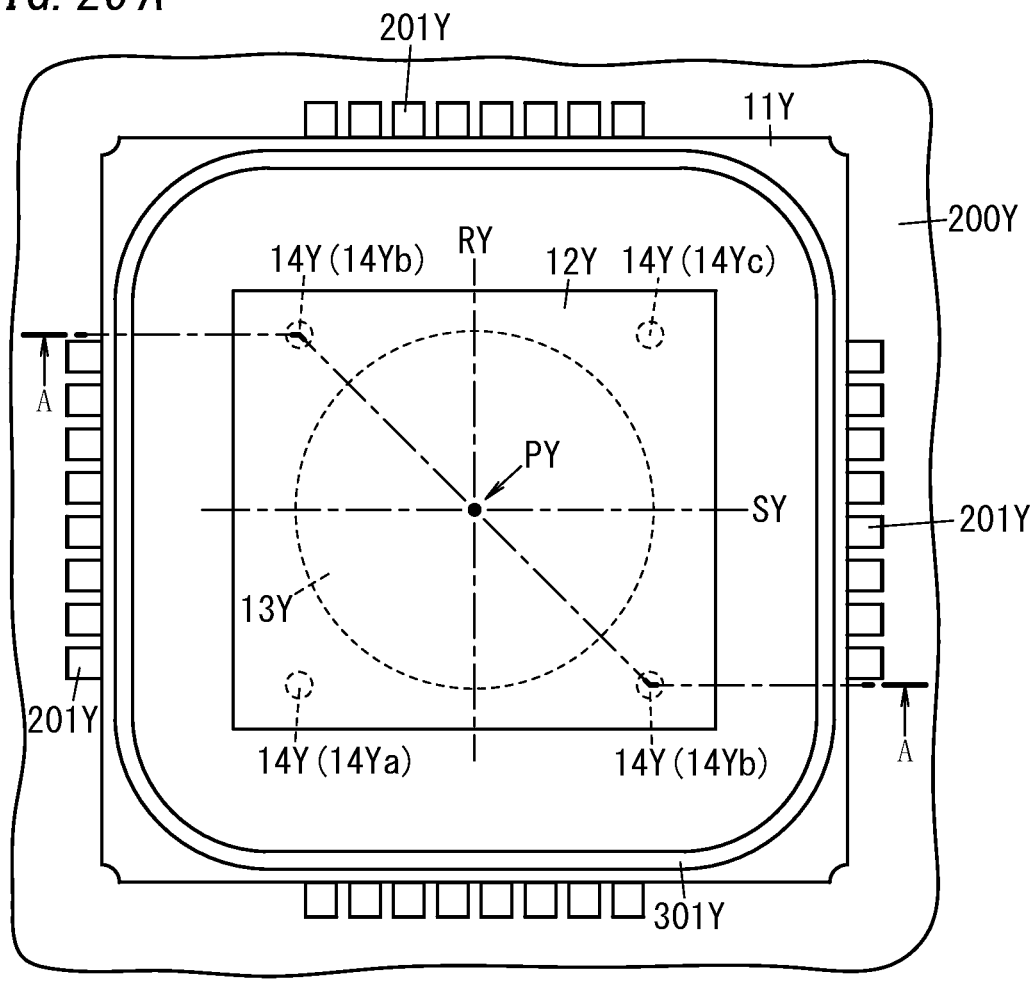
FIG. 26A is a plan view illustrating part of the sensor device.
Figure 26B:
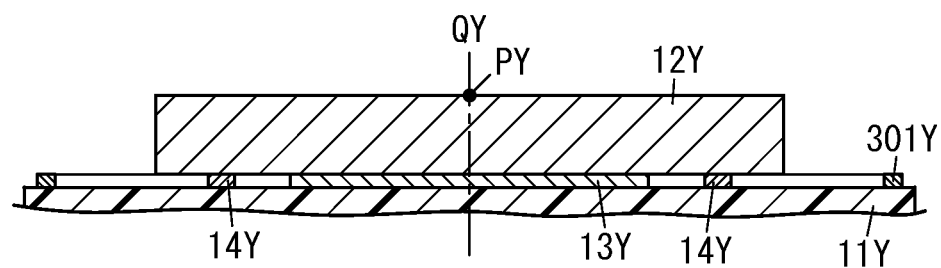
FIG. 26B is a cross-sectional view thereof taken along the plane A-A shown in FIG. 26A.

The intermediate substrate 12Y is provided on the surface of the base board 11Y. The intermediate substrate 12Y is bonded onto the base board 11Y with the adhesive portion 13Y. That is to say, the adhesive portion 13Y is located between the intermediate substrate 12Y and the base board 11Y to bond the intermediate substrate 12Y and the base board 11Y together. As shown in FIGS. 26A and 26B, the adhesive portion 13Y is formed in the shape of a disk between the intermediate substrate 12Y and the base board 11Y. The center PY in the bonding direction of the adhesive portion 13Y agrees, in a plan view, with the center PY in the bonding direction of the intermediate substrate 12Y. That is to say, the intermediate substrate 12Y is located in a central area of the surface of the base board 11Y. The adhesive portion 13Y is a cured product of a silicone-based adhesive.

Between the intermediate substrate 12Y and the base board 11Y, at least one supporting portion 14Y is provided around the adhesive portion 13Y. That is to say, one or more supporting portions 14Y are provided between the intermediate substrate 12Y and the base board 11Y to surround the adhesive portion 13Y. In FIG. 26A, supporting portions 14Ya, 14Yb, 14Yc, 14Yd are provided in the vicinity of the four corners of the intermediate substrate 12Y. Thus, when the intermediate substrate 12Y tilts with respect to an axis QY passing through the center PY, the intermediate substrate 12Y comes into contact with, and is supported by, the supporting portions 14Ya, 14Yb, 14Yc, 14Yd provided in the vicinity of the four corners of the intermediate substrate 12Y.

Each supporting portion 14Y is made of a metallic material. Specifically, each supporting portion 14Y is implemented as a metallic bump of gold (Au) or copper (Cu), for example. Each supporting portion 14Y has a circular columnar shape. Each supporting portion 14Y has higher hardness than the adhesive portion 13Y. That is to say, each supporting portion 14Y is harder, and less deformable, than the adhesive portion 13Y. Thus, even if the adhesive portion 13Y is distorted and deformed, the supporting portion 14Y is still able to support the intermediate substrate 12Y without being deformed. Each supporting portion 14Y has a smaller modulus of volume change than the adhesive portion 13Y. That is to say, each supporting portion 14Y expands or contracts to a lesser degree due to temperature or humidity than the adhesive portion 13Y does. Each supporting portion 14Y is not always in contact with the intermediate substrate 12Y. For example, when the intermediate substrate 12Y tilts, the intermediate substrate 12Y comes into contact with, and is supported by, any of the supporting portions 14Y. This prevents the intermediate substrate 12Y from further tilting.

The tip of each supporting portion 14Y is not adhered to the surface of the intermediate substrate 12Y. This reduces, even if either the supporting portion 14Y or the adhesive portion 13Y expands or contracts due to a variation in temperature or humidity, the chances of the intermediate substrate 12Y following the pattern of the expansion or contraction, thus reducing the warpage and distortion of the intermediate substrate 12Y. Consequently, this achieves the advantage of curbing a decline in the temperature characteristic or humidity characteristic of the sensor element 15Y.

The respective supporting portions 14Y are arranged to be point-symmetric with respect to an axis that passes through a part of the adhesive portion 13Y and that is aligned with a direction in which the intermediate substrate 12Y and the base board 11Y are bonded together. That is to say, the respective supporting portions 14Y are positioned such that if the respective supporting portions 14Y are supposed to be rotated 180 degrees around an axis QY that passes through the center PY and that is aligned with the direction in which the intermediate substrate 12Y and the base board 11Y are bonded together, the supporting portions 14Ya will overlap with the supporting portion 14Yc and the supporting portion 14Yb will overlap with the supporting portion 14Yd.

In addition, the respective supporting portions 14Y are also arranged to be line-symmetric with respect to an axis that passes through a part of the adhesive portion 13Y and that is perpendicular to the direction in which the intermediate substrate 12Y and the base board 11Y are bonded together. That is to say, the respective supporting portions 14Y are positioned such that if the respective supporting portions 14Y are supposed to be inverted (i.e., rotated 90 degrees) with respect to an axis RY that passes through the center PY and that is perpendicular to the direction in which the intermediate substrate 12Y and the base board 11Y are bonded together, the supporting portions 14Ya will overlap with the supporting portion 14Yd and the supporting portion 14Yb will overlap with the supporting portion 14Yc. In addition, the respective supporting portions 14Y are also positioned such that if the respective supporting portions 14Y are supposed to be inverted (i.e., rotated 90 degrees) with respect to an axis SY that passes through the center PY and that is perpendicular to the direction in which the intermediate substrate 12Y and the base board 11Y are bonded together, the supporting portions 14Ya will overlap with the supporting portion 14Yb and the supporting portion 14Yc will overlap with the supporting portion 14Yd.

Furthermore, the respective supporting portions 14Y are also arranged to form a circular pattern that is concentric with respect to the center PY of the sensor element 15Y when viewed in the direction in which the intermediate substrate 12Y and the base board 11Y are bonded together. That is to say, if a circle, of which the center is defined by the center PY of the sensor element 15Y, is drawn, then the supporting portions 14Ya, 14Yb, 14Yc, 14Yd are arranged on the circumference of the circle when viewed along the axis QY.

In addition, the adhesive portion 13Y is a silicone-based adhesive, and therefore, is relatively soft and easily deformable. Thus, the adhesive portion 13Y absorbs the stress caused by the base board 11Y to make the stress hardly transferrable to the intermediate substrate 12Y. Meanwhile, if the intermediate substrate 12Y is supported by only the adhesive portion 13Y with flexibility, then the intermediate substrate 12Y tends to tilt easily due to vibrations, for example, and the tilt sometimes affects the sensing by the sensor element 15Y. Thus, to overcome such a problem, the supporting portions 14Y, which are harder and less deformable than the adhesive portion 13Y, are arranged in this embodiment between the base board 11Y and the intermediate substrate 12Y. This allows the lower surface of the intermediate substrate 12Y to come into contact with, and be supported by, the supporting portions 14Y, thus achieving the advantage of reducing the tilt of the intermediate substrate 12Y. Furthermore, the intermediate substrate 12Y is sometimes electrically connected to the base board 11Y by wire bonding. In that case, even if the intermediate substrate 12Y is pressed downward by a capillary when wires are connected to the intermediate substrate 12Y, the intermediate substrate 12Y may still be supported by the supporting portions 14Y, thus allowing the wires to be connected easily.

Furthermore, the adhesive portion 13Y is present around the central area of one surface along the thickness of the intermediate substrate 12Y but is absent from an outer peripheral area of that surface. Thus, even if stress is transferred from the adhesive portion 13Y to the intermediate substrate 12Y, the stress is hardly transferrable to the outer peripheral area of the intermediate substrate 12Y, thus reducing the chances of the intermediate substrate 12Y tilting.

Figure 27:
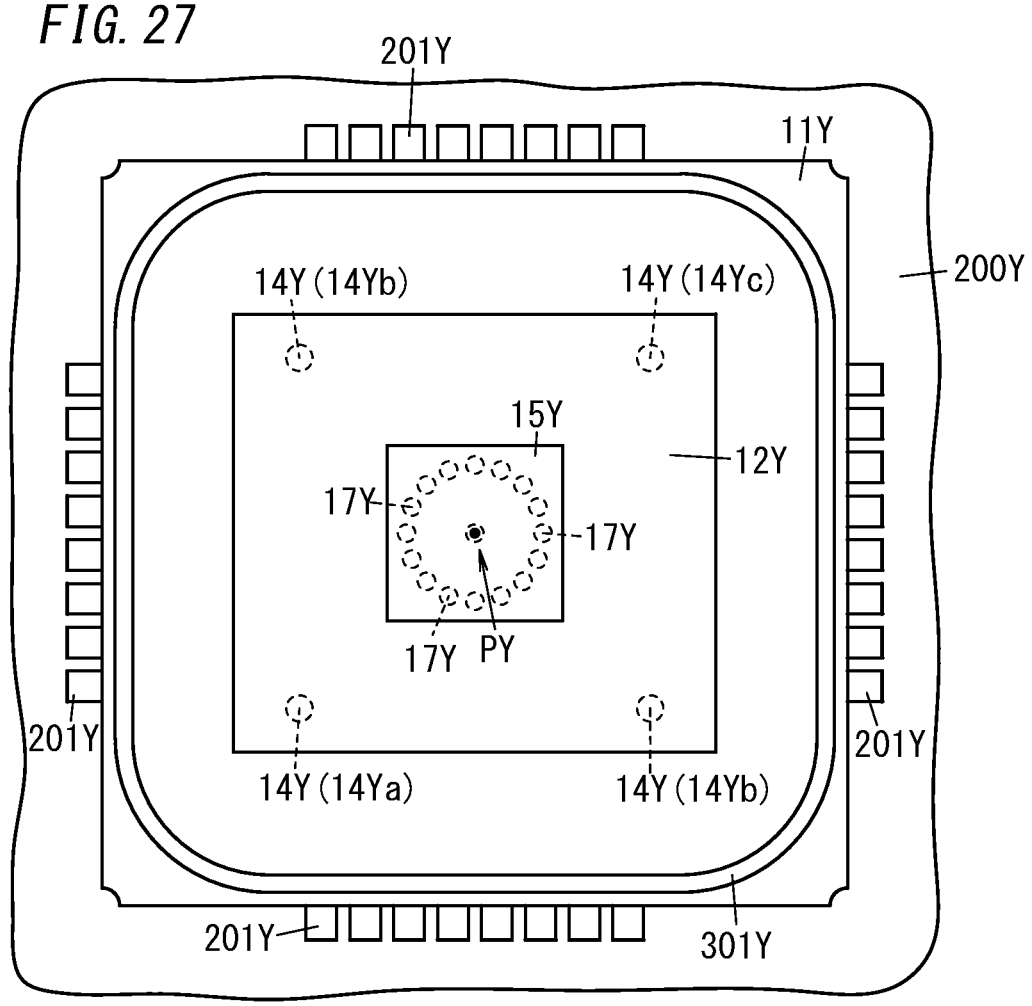
FIG. 27 is a plan view illustrating part of the sensor device.

As shown in FIG. 27, the sensor element 15Y is bonded onto the surface of the intermediate substrate 12Y via a plurality of bonding portions 17Y. The plurality of bonding portions 17Y may be implemented as bumps. The plurality of bonding portions 17Y are arranged on the circumference of a circle, of which the center is defined by the center PY of the sensor element 15Y. That is to say, the virtual circle along which the plurality of supporting portions 14Y are arranged and the virtual circle along which the plurality of bonding portions 17Y are arranged are concentric with each other.

The sensor element 15Y includes a moving portion 20Y and outputs an electrical signal representing the magnitude of movement of the moving portion 20Y. That is to say, the sensor element 15Y outputs, as the electrical signal, a variation, caused by the movement of the moving portion 20Y, in length. In addition, the sensor element 15Y also detects a physical quantity related to a direction in which the sensor element 15Y is provided onto the intermediate substrate 12Y. That is to say, the sensor element 15Y detects the magnitude of variation in the direction aligned with the axis QY. In this embodiment, the sensor element 15Y is implemented as an angular velocity sensor, and therefore, detects an angular velocity around the axis QY.

Figure 28A:
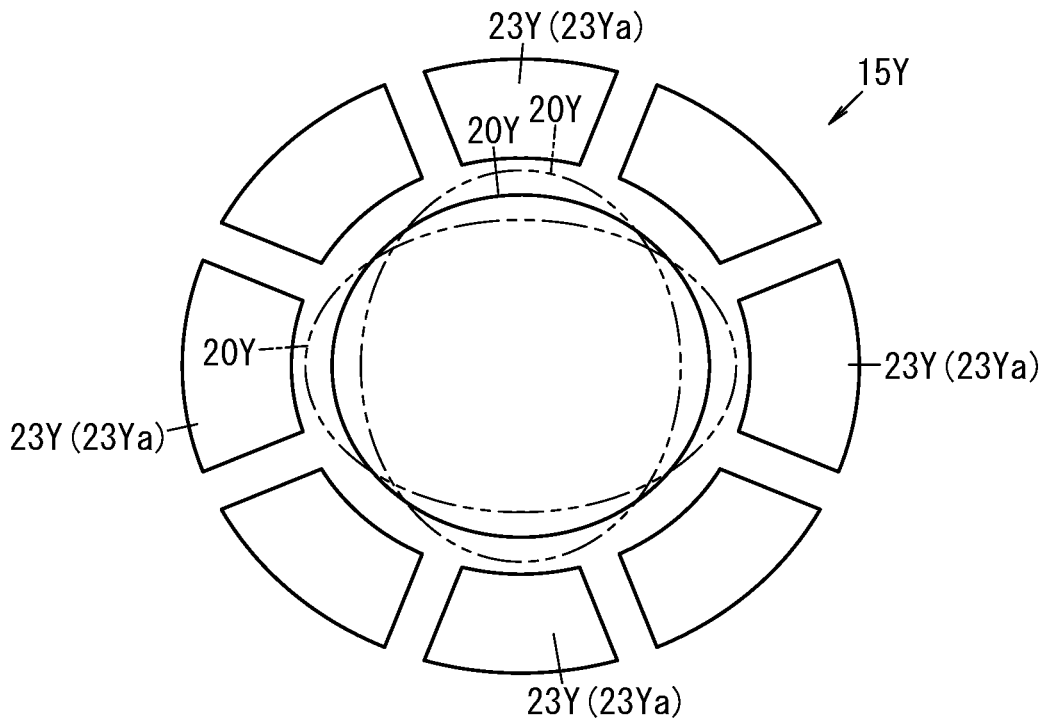
FIG. 28A is a cross-sectional view illustrating part of the sensor device.
Figure 28B:
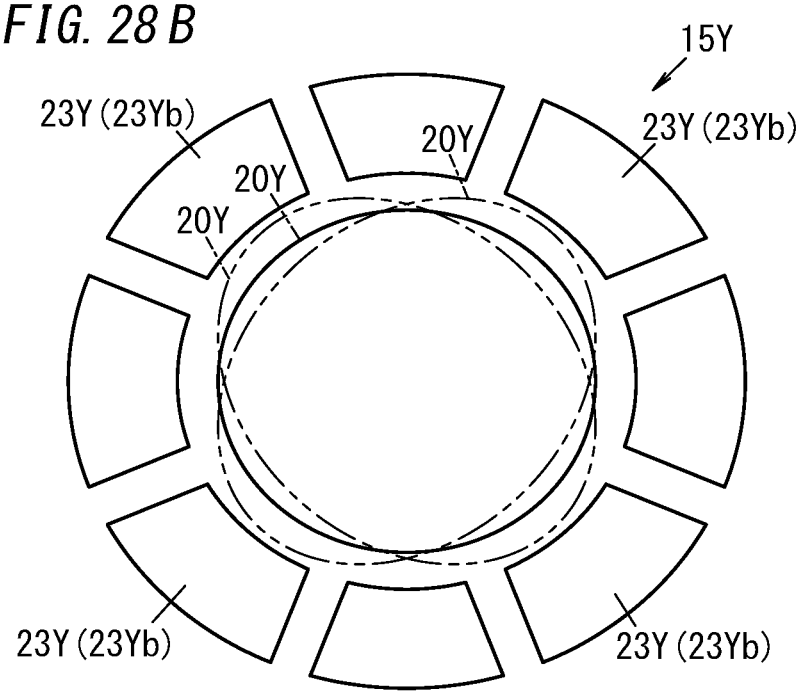
FIG. 28B is a cross-sectional view illustrating part of the sensor device.

FIGS. 28A and 28B illustrate, as an example of the sensor element 15Y, a capacitive bulk ultrasonic disk gyroscope to be driven at radio frequencies (falling within the MHz band). The gyroscope includes: a handle substrate; and a resonator serving as the moving portion 20Y. The moving portion 20Y is supported by an insulating layer on the handle substrate. Also, a plurality of electrodes 23Y surround the moving portion 20Y and are spaced from the moving portion 20Y by a very narrow capacitive gap. These electrodes 23Y may excite and detect at least two modified bulk ultrasonic resonance modes in the moving portion 20Y. The moving portion 20Y has a disk shape and a circular shape. The moving portion 20Y does not have to be made of a piezoelectric material but may be made of a non-piezoelectric substance such as single crystalline or polycrystalline silicon. Alternatively, a semiconductor such as silicon carbide, gallium nitride, aluminum nitride, or quartz or a metallic material may also be used to make the moving portion 21. The plurality of electrodes 23Y includes driving electrodes 23Ya and detecting electrodes 23Yb. The moving portion 20Y is deformed, by precession movement, between the driving mode shown in FIG. 28A and the detection mode shown in FIG. 28B. That is to say, the disklike moving portion 20Y vibrates, within a plane perpendicular to the center axis thereof (i.e., the axis QY), so as to repeat deformation including alternate expansion and contraction in two orthogonal directions. The sensor element 15Y outputs, as an electrical signal, the magnitude of deformation (magnitude of movement) of the moving portion 20Y. That is to say, the magnitude of the deformation of the moving portion 20Y manifests itself as a variation in capacitance between the moving portion 20Y and the detecting electrode 23Yb. Thus, the sensor element 15Y outputs an electrical signal representing the variation in capacitance.

The sensor element 15Y performs sensing by vibrating (i.e., deforming) the moving portion 20Y along one surface along the thickness of the intermediate substrate 12Y. However, if the sensor element 15Y is affected by the stress caused by the intermediate substrate 12Y, then the plurality of electrodes 23Y of the sensor element 15Y could be distorted and displaced. This causes a dispersion in the gap between the plurality of electrodes 23Y and the moving portion 20Y, thus possibly affecting the output of the sensor element 15Y. In this embodiment, the intermediate substrate 12Y is supported by the supporting portions 14Y, which are less deformable than the adhesive portion 13Y, thus reducing the chances of causing stress to the intermediate substrate 12Y. This would significantly curb a decline in the sensing performance of even the sensor element 15Y, of which the moving portion 20Y vibrates as described above. Furthermore, since the intermediate substrate 12Y rarely tilts, the center axis of the disklike moving portion 20Y hardly tilts, thus affecting the angular velocity, detected by the sensor element 15Y, around the axis QY much less significantly.

(Variations of Supporting Portions)

Figure 29:
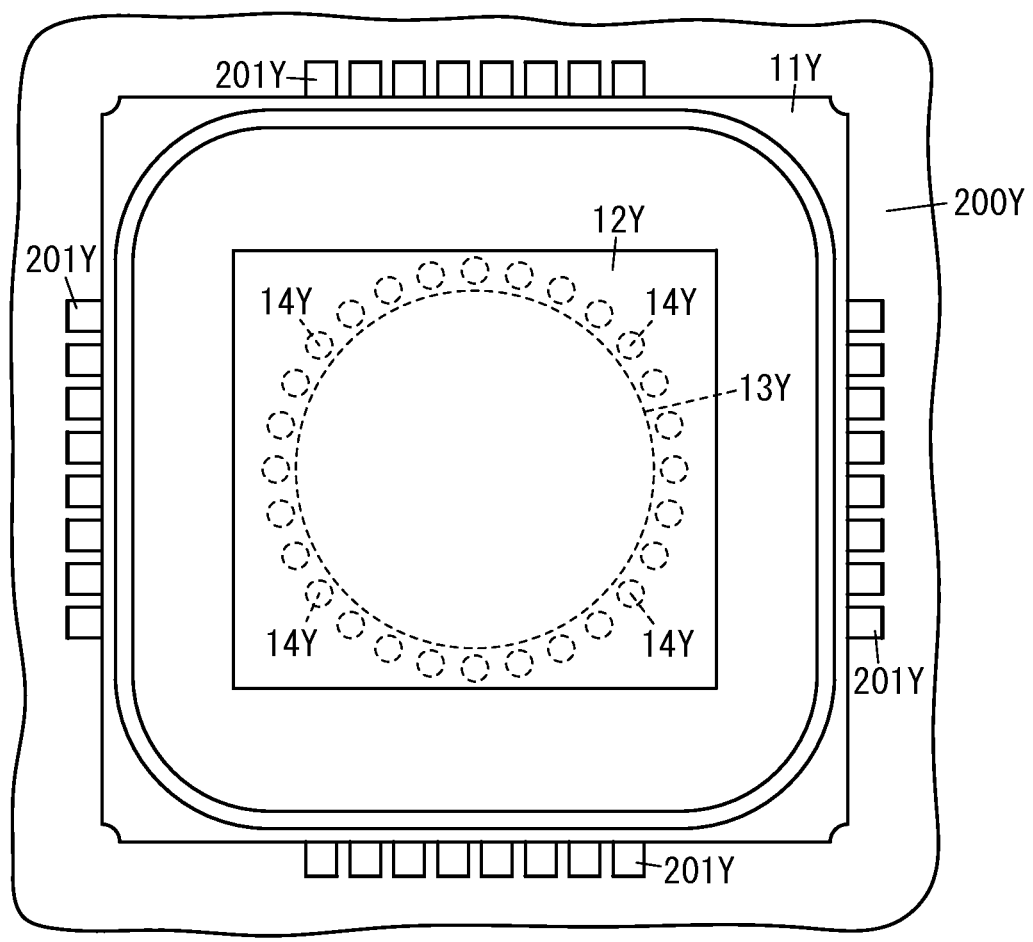
FIG. 29 is a plan view illustrating part of the sensor device.

In the fifth embodiment described above, the sensor device 10Y includes four supporting portions 14Y. However, this is only an example of the present disclosure and should not be construed as limiting. FIG. 29 illustrates a sensor device 10Y including twenty-eight supporting portions 14Y. Suppose a circle, of which the center is defined by the center PY of the sensor element 15Y, is drawn, the respective supporting portions 14Y are arranged side by side along the circumference of the circle. That is to say, as in the example shown in FIG. 27, the virtual circle along which the plurality of supporting portions 14Y are arranged and the virtual circle along which the plurality of bonding portions 17Y are arranged are concentric with each other.

Figure 30A:
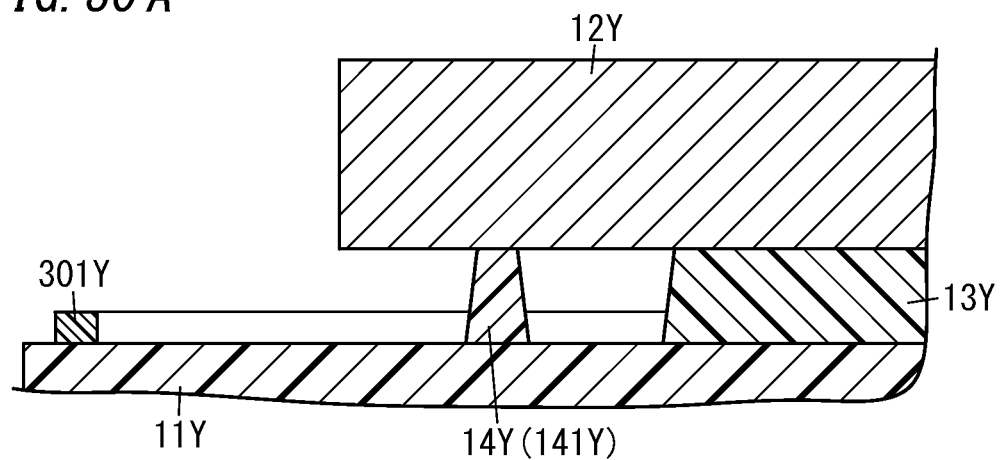
FIG. 30A is a conceptual diagram illustrating a sensor element.

Also, the shape and height of the supporting portions 14Y may be determined arbitrarily according to the type of the sensor device 10Y, for example. As shown in FIG. 30A, an alternative supporting portion 141Y has a conical cross-sectional shape as taken along a plane aligned with the axis QY and has a height of about 150 μm. Furthermore, the supporting portion 141Y may be made of a synthetic resin such as a silicone-based resin.

If the supporting portion 14Y is a cured product of a silicone-based adhesive, then the silicone-based adhesive is applied onto the base board 11Y, dried, and then cured to form the supporting portion 14Y. Thereafter, the intermediate substrate 12Y is arranged thereon. This brings the supporting portions 14Y into contact with the intermediate substrate 12Y while reducing the chances of the supporting portions 14Y adhering to the intermediate substrate 12Y.

Figure 30B:
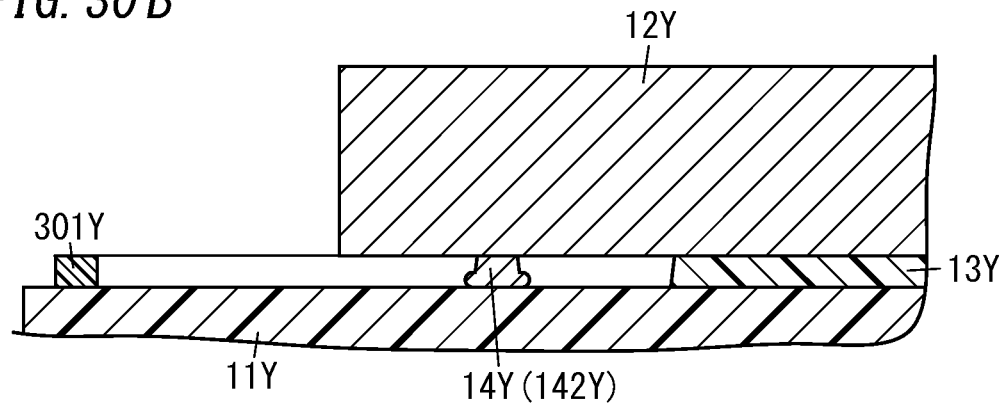
FIG. 30B is a conceptual diagram illustrating the sensor element.

As shown in FIG. 30B, another alternative supporting portion 142Y has a bump-like shape, which is crushed between the intermediate substrate 12Y and the base board 11Y. In that case, a part, located in contact with the base board 11Y, of the supporting portion 142Y has a larger diameter than another part, located in contact with the intermediate substrate 12Y, of the supporting portion 142Y. The supporting portion 142Y has a height of approximately 50 μm. Also, the material for the supporting portion 142Y may be a metal such as gold (Au) or copper (Cu), for example.

If a relatively wide gap needs to be left between the intermediate substrate 12Y and the base board 11Y, the sensor device 10Y may be formed more easily by using supporting portions 142Y made of a resin rather than using metallic supporting portions 142Y. Nevertheless, the metallic supporting portions 142Y will expand or contract less easily due to a variation in temperature or humidity than the supporting portions 142Y made of a resin. Thus, even if the adhesive portion 13Y made of a resin expands or contracts, the metallic supporting portions 142Y hardly expand or contract, thus reducing the chances of the intermediate substrate 12Y tilting by using such supporting portions 142Y. This achieves the advantage of significantly curbing a decline in the temperature or humidity characteristic of the sensor element 15Y.

Alternatively, the supporting portion 14Y may also be configured as a single ringlike member.

(Other Variations)

In the embodiment described above, the sensor device 10Y is implemented as an angular velocity sensor (gyrosensor). However, this is only an example of the present disclosure and should not be construed as limiting. Alternatively, the sensor device 10Y may also be implemented as an acceleration sensor or an image sensor. Also, the sensor element 15Y of the sensor device 10Y does not have to be an element that utilizes the MEMS technology but may also be any other type of element. That is to say, various types of sensor devices may be provided by changing the type of the sensor element 15Y to use.

Furthermore, in the embodiment described above, the supporting portions 14Y are not adhered to the intermediate substrate 12Y. However, this is only an example of the present disclosure and should not be construed as limiting. Alternatively, the supporting portions 14Y may also be adhered to the intermediate substrate 12Y. That is to say, the respective tips of the supporting portions 14Y may be bonded to the lower surface of the intermediate substrate 12Y. This allows the intermediate substrate 12Y and the supporting portions 14Y to be bonded strongly, thus further reducing the chances of the intermediate substrate 12Y tilting.

(Resume)

As can be seen from the foregoing description, a sensor device (1, 1A-1C) according to a first aspect includes a sensor element (2), a substrate (3), and a bonding wire (6, 6A). Over the substrate (3), provided is the sensor element (2). The bonding wire (6, 6A) forms at least part of a connection path (60) that electrically connects the sensor element (2) and the substrate (3) together. The bonding wire (6, 6A) is provided to connect two connection surfaces (31, 41, 201) that intersect with each other.

According to this aspect, at least part of a connection path (60) that electrically connects a sensor element (2) and a substrate (3) together is implemented as a bonding wire (6, 6A) that connects two connection surfaces (namely, an installation surface 31 and a supporting surface 41) that intersect with each other. This may reduce, compared to connecting, via the bonding wire (6, 6A), two connection surfaces arranged to face the same direction, an increase in the height dimension, for example, of the sensor device (1, 1A-1C) due to protrusion of the bonding wire (6, 6A) from the connection surface, for example. Consequently, this sensor device (1, 1A-1C) contributes to increasing the degree of freedom with respect to shape or dimensions of the sensor device (1, 1A-1C).

A sensor device (1, 1A-1C) according to a second aspect, which may be implemented in conjunction with the first aspect, further includes a supporting member (4) installed over the substrate (3) with the sensor element (2) provided on the supporting member (4). The sensor element (2) is electrically connected to the substrate (3) via the supporting member (4). One of the two connection surfaces (31, 41, 201) is one surface of the supporting member (4).

According to this aspect, the sensor element (2) is provided over the substrate (3) with the supporting member (4) interposed between them, thus making stress less easily transferrable from the substrate (3) to the sensor element (2).

A sensor device (1, 1A-1C) according to a third aspect, which may be implemented in conjunction with the second aspect, further includes a coupling member (5) that couples the supporting member (4) to the substrate (3). The supporting member (4) is installed indirectly over the substrate (3) via the coupling member (5).

According to this aspect, the supporting member (4) is installed indirectly over the substrate (3) via the coupling member (5), thus making stress even less easily transferrable from the substrate (3) to the sensor element (2).

In a sensor device (1, 1A-1C) according to a fourth aspect, which may be implemented in conjunction with the third aspect, an adhesive layer (511) bonding the coupling member (5) and the substrate (3) together has a larger Young's modulus than an adhesive layer (521) bonding the coupling member (5) and the supporting member (4) together.

This aspect allows the coupling member (5) to be fixed firmly onto the substrate (3). In addition, even if stress is applied from the substrate (3) to the coupling member (5), the stress is transferrable much less easily from the coupling member (5) to the supporting member (4), thus making the stress hardly applicable to the sensor element (2). This reduces the chances of the result of detection by the sensor element (2) being affected by the stress.

In a sensor device (1, 1A-1C) according to a fifth aspect, which may be implemented in conjunction with any one of the second to fourth aspects, the substrate (3) has an installation surface (31) over which the supporting member (4) is installed. The supporting member (4) has a supporting surface (41) on which the sensor element (2) is provided. A normal (L1) to the supporting surface (41) is aligned with the installation surface (31). One of the two connection surfaces (31, 41, 201) is the supporting surface (41).

This aspect allows the supporting member (4) supporting the sensor element (2) thereon to stand upright with respect to the installation surface (31) of the substrate (3).

In a sensor device (1, 1A-1C) according to a sixth aspect, which may be implemented in conjunction with the fifth aspect, the supporting member (4) has, on the supporting surface (41), a supporting-end electrode (602), to which one end portion of the bonding wire (6, 6A) is connected. The supporting-end electrode (602) is located closer to the substrate (3) than the sensor element (2) is, when viewed from the sensor element (2) on the supporting surface (41).

This aspect allows the bonding wire (6, 6A) to have a relatively short length.

In a sensor device (1, 1A-1C) according to a seventh aspect, which may be implemented in conjunction with the fifth aspect, the supporting member (4) has, on the supporting surface (41), a supporting-end electrode (602), to which one end portion of the bonding wire (6, 6A) is connected. The supporting-end electrode (602) is located opposite from the substrate (3) with respect to the sensor element (2), when viewed from the sensor element (2) on the supporting surface (41).

This aspect allows the sensor element (2) to be provided at a reduced height as measured from the substrate (3).

In a sensor device (1, 1A-1C) according to an eighth aspect, which may be implemented in conjunction with any one of the first to seventh aspects, one of the two connection surfaces (31, 41, 201) is one surface of the substrate (3).

This aspect allows the bonding wire (6, 6A) to be connected directly to the substrate (3).

In a sensor device (1, 1A-1C) according to a ninth aspect, which may be implemented in conjunction with the second aspect, the sensor element (2) has an electrode surface (201), which is one of the two connection surfaces (31, 41, 201).

This aspect allows the bonding wire (6, 6A) to be connected directly to the sensor element (2).

In a sensor device (1, 1A-1C) according to a tenth aspect, which may be implemented in conjunction with the ninth aspect, the supporting member (4) has a supporting surface (41) on which a vertical member (50), including the sensor element (2), is provided. The vertical member (50) is fixed to the supporting surface (41) such that a normal to the electrode surface (201) of the sensor element (2) is aligned with the supporting surface (41).

This aspect allows the sensor element (2) to stand upright with respect to the supporting surface (41) of the supporting member (4).

In a sensor device (1, 1A-1C) according to an eleventh aspect, which may be implemented in conjunction with the tenth aspect, an adhesive layer (502, 504) bonding the vertical member (50) and the supporting member (4) together has a larger Young's modulus than an adhesive layer (501) bonding the supporting member (4) and the substrate (3) together.

This aspect allows the vertical member (50) to be fixed firmly onto the supporting member (4). In addition, even if stress is applied to the substrate (3), the stress is transferrable much less easily from the substrate (3) to the supporting member (4), thus making the stress hardly applicable to the sensor element (2). This reduces the chances of the result of detection by the sensor element (2) being affected by the stress.

In a sensor device (1, 1A-1C) according to a twelfth aspect, which may be implemented in conjunction with the tenth or eleventh aspect, the vertical member (50) further includes a coupling member (5) that couples the sensor element (2) to the supporting member (4). The sensor element (2) is provided indirectly over the supporting member (4) via the coupling member (5).

According to this aspect, the sensor element (2) is provided over the supporting member (4) with the coupling member (5) interposed between them, thus making stress less easily transferrable from the supporting member (4) to the sensor element (2).

In a sensor device (1, 1A-1C) according to a thirteenth aspect, which may be implemented in conjunction with the twelfth aspect, an adhesive layer (502) bonding the coupling member (5) and the supporting member (4) together has a larger Young's modulus than an adhesive layer (503) bonding the coupling member (5) and the sensor element (2) together.

This aspect allows the coupling member (5) to be fixed firmly onto the supporting member (4). In addition, even if stress is applied from the supporting member (4) to the coupling member (5), the stress is transferrable much less easily from the coupling member (5) to the sensor element (2), thus making the stress hardly applicable to the sensor element (2). This reduces the chances of the result of detection by the sensor element (2) being affected by the stress.

In a sensor device (1, 1A-1C) according to a fourteenth aspect, which may be implemented in conjunction with any one of the first to thirteenth aspects, the bonding wire (6, 6A) includes a plurality of bonding wires. Each of the two connection surfaces (31, 41, 201) is provided with a plurality of electrodes (601-604), to which the plurality of bonding wires (6, 6A) are respectively connected. The plurality of electrodes (601-604) are arranged along a virtual line that is parallel to both of the two connection surfaces (31, 41, 201).

This aspect reduces the dispersion in length between the plurality of bonding wires (6, 6A).

In a sensor device (1, 1A-1C) according to a fifteenth aspect, which may be implemented in conjunction with any one of the first to fourteenth aspects, the sensor element (2) includes an element electrode (200). The element electrode (200) includes: an Au electrode layer (220); and a UBM layer (23) stacked on the Au electrode layer (220). A coefficient of thermal expansion of the UBM layer (23) has a value between a coefficient of thermal expansion of AuSn and a coefficient of thermal expansion of $SiO_2$.

This aspect contributes to reducing the stress applied to the sensor element (2).

Note that the constituent elements according to the second to fifteenth aspects are not essential constituent elements for the sensor device (1, 1A-1C) but may be omitted as appropriate.

A sensor device (1X, 1AX) according to a sixteenth aspect includes a sensor element (2X), a substrate (3X), a supporting member (4X), and a coupling member (5X, 5AX). The substrate (3X) has an installation surface (31X). The supporting member (4X) has a supporting surface (41X), on which the sensor element (2X) is provided. The coupling member (5X, 5AX) is installed on the installation surface (31X). The coupling member (5X, 5AX) couples the supporting member (4X) to the substrate (3X) such that a normal (L1X) to the supporting surface (41X) is aligned with the installation surface (31X).

According to this aspect, a supporting member (4X) on which a sensor element (2X) is provided is supported over an installation surface (31X) of a substrate (3X) via a coupling member (5X, 5AX), thus allowing the sensor element (2X) with the supporting member (4X) to be installed over the installation surface (31X) of the substrate (3X). The coupling member (5X, 5AX) couples the supporting member (4X) to the substrate (3X) such that a normal (L1X) to a supporting surface (41X) is aligned with the installation surface (31X). Thus, the supporting surface (41X) of the supporting member (4X) on which the sensor element (2X) is provided is generally perpendicular to the installation surface (31X) of the substrate (3). This allows the supporting surface (41X) on which the sensor element (2X) is provided to have its orientation changed by rotating the substrate (3X) within a plane aligned with one surface (101X) of a mount board (10X), thus contributing to increasing the degree of freedom of the detection target.

A sensor device (1X, 1AX) according to a seventeenth aspect, which may be implemented in conjunction with the sixteenth aspect, further includes a wiring member (6X). The wiring member (6X) electrically connects the supporting member (4X) and the substrate (3X) together.

This aspect allows the supporting member (4X) and the substrate (3X) to be electrically connected together, thus enabling adding an electrical function to the supporting member (4X).

In a sensor device (1X, 1AX) according to an eighteenth aspect, which may be implemented in conjunction with the seventeenth aspect, the wiring member (6X) is fixed to the installation surface (31X).

This aspect makes stress less easily transferrable from the wiring member (6X) to the supporting member (4X).

In a sensor device (1X, 1AX) according to a nineteenth aspect, which may be implemented in conjunction with the seventeenth or eighteenth aspect, the wiring member (6X) includes a plurality of lead terminals (61X) and a holding member (62X) that holds the plurality of lead terminals (61X).

This aspect allows the wiring member (6X) to electrically connect the supporting member (4X) and the substrate (3X) together using a relatively simple structure.

In a sensor device (1X, 1AX) according to a twentieth aspect, which may be implemented in conjunction with any one of the sixteenth to nineteenth aspects, the coupling member (5X, 5AX) further includes a spacer (53X) protruding from one surface, facing the supporting member (4X), of the coupling member (5X, 5AX) toward the supporting member (4X).

This aspect allows a gap to be left between the coupling member (5X, 5AX) and the supporting member (4X), thus making stress less easily transferrable from the coupling member (5X, 5AX) to the supporting member (4X).

In a sensor device (1X, 1AX) according to a twenty-first aspect, which may be implemented in conjunction with any one of the sixteenth to twentieth aspects, the sensor element (2X) outputs an electrical signal representing an angular velocity around an axis aligned with a normal (L1X) to the supporting surface (41X).

This aspect allows adaptively determining, by rotating the substrate (3X) within a plane aligned with one surface (101X) of a mount board (10X), in what direction the angular velocity needs to be detected.

In a sensor device (1X, 1AX) according to a twenty-second aspect, which may be implemented in conjunction with any one of the sixteenth to twenty-first aspects, the supporting member (4X) includes a processor circuit (43X). The processor circuit (43X) performs processing on an electrical signal output from the sensor element (2X).

According to this aspect, a processor circuit (43X) is arranged in the vicinity of the sensor element (2X), thus reducing the chances of the electrical signal output from the sensor element (2X) being affected by noise.

In a sensor device (1X, 1AX) according to a twenty-third aspect, which may be implemented in conjunction with any one of the sixteenth to twenty-second aspects, the coupling member (5X, 5AX) has a hollow portion (54X).

This aspect allows the shock applied to the coupling member (5X, 5AX) to be absorbed more effectively than in a situation where the coupling member (5X, 5AX) has a solid structure.

In a sensor device (1X, 1AX) according to a twenty-fourth aspect, which may be implemented in conjunction with any one of the sixteenth to twenty-third aspects, the coupling member (5X, 5AX) has: a first surface (51X) fixed to the installation surface (31X) of the substrate (3X); and a second surface (52X) intersecting with the first surface (51X). The supporting member (4X) is fixed to the second surface (52X).

This aspect allows the coupling member (5X, 5AX) to be fixed with good stability to the substrate (3X) and the supporting member (4X) by securing the first surface (51X) to the installation surface (31X) of the substrate (3X) and securing the second surface (52X) to the supporting member (4X).

A sensor device (1X, 1AX) according to a twenty-fifth aspect, which may be implemented in conjunction with any one of the sixteenth to twenty-fourth aspects, further includes a case (7X). The case (7X) is bonded to the substrate (3X) and houses at least the sensor element (2X) between the installation surface (31X) of the substrate (3X) and the case (7X) itself.

This aspect allows the sensor element (2X) and other members to be protected by the case (7).

In a sensor device (1X, 1AX) according to a twenty-sixth aspect, which may be implemented in conjunction with any one of the sixteenth to twenty-fifth aspects, the supporting member (4X) includes: a sensor-connecting electrode (81X), to which the sensor element (2X) is electrically connected; and a substrate-connecting electrode (82X), to which the substrate (3X) is electrically connected. The sensor-connecting electrode (81X) includes an underlying electrode (811X) and a plating layer (including an Ni plating layer 812 and an Au plating layer 813X). The substrate-connecting electrode (82X) is configured as an underlying electrode (821X) alone.

This aspect reduces precipitation of nickel onto the surface of the plating layer, thus curbing a decrease in bond strength between the bonding wire (63X) and the substrate-connecting electrode (82X).

In a sensor device (1X, 1AX) according to a twenty-seventh aspect, which may be implemented in conjunction with any one of the sixteenth to twenty-fifth aspects, the supporting member (4X) includes: a sensor-connecting electrode (81X), to which the sensor element (2X) is electrically connected; and a substrate-connecting electrode (82X), to which the substrate (3X) is electrically connected. Each of the sensor-connecting electrode (81X) and the substrate-connecting electrode (82X) includes an underlying electrode (811X, 821X), an Ni plating layer (812X, 822X), an Au plating layer (813X, 823X), and a barrier layer (810X, 820X). The Ni plating layer (812X, 822X), the barrier layer (810X, 820X), and the Au plating layer (813X, 823X) are stacked one on top of another in this order on the underlying electrode (811X, 821X).

This aspect reduces precipitation of nickel onto the surface of the Au plating layer (813X, 823X), thus curbing a decrease in bond strength between the bonding wire (63X) and the substrate-connecting electrode (82X).

A sensor device (1X, 1AX) according to a twenty-eighth aspect, which may be implemented in conjunction with any one of the sixteenth to twenty-seventh aspects, further includes a plurality of connection members (44X) that connect the supporting member (4X) and the sensor element (2X) together. The plurality of connection members (44X) are arranged to be point-symmetric with respect to a center point (P1X) of the sensor element (2X).

According to this aspect, even if stress is applied from the supporting member (4X) to the sensor element (2X), the distribution of the stress becomes point-symmetric with respect to the center point (P1X), thus reducing the chances of the result of detection by the sensor element (2X) being affected by the stress.

Note that the constituent elements according to the seventeenth to twenty-eighth aspects are not essential constituent elements for the sensor device (1X, 1AX) but may be omitted as appropriate.

In addition, the constituent elements according to the twenty-sixth to twenty-eighth aspects do not have to be implemented in conjunction with the sixteenth aspect but are also applicable to various sensor devices 1X, 1AX-1CX. That is to say, the constituent elements according to the twenty-sixth to twenty-eighth aspects do not have to be implemented in combination with various configurations described for the third or fourth embodiment (including variations thereof) but may also be implemented in combination as appropriate with various configurations described for the first or second reference example (including variations thereof).

A sensor device (10Y) according to a twenty-ninth aspect includes an adhesive portion (13Y) and at least one supporting portion (14Y). The adhesive portion (13Y) bonds an intermediate substrate (12Y), on which a sensor element (15Y) is provided, and a base board (11Y) together. At least one supporting portion (14Y) is located between the intermediate substrate (12Y) and the base board (11Y) and around the adhesive portion (13Y).

According to this aspect, even if the adhesive portion (13Y) contracts or expands, the intermediate substrate (12Y) is supported by the supporting portion (14Y), thus reducing the tilt of the intermediate substrate (12Y). This reduces the chances of the sensor element (15Y) provided on the intermediate substrate (12Y) being affected by the tilt of the intermediate substrate (12Y), thus curbing a decline in the detection performance of the sensor element (15Y).

In a sensor device (10Y) according to a thirtieth aspect, which may be implemented in conjunction with the twenty-ninth aspect, the at least one supporting portion (14Y) includes a plurality of supporting portions (14Y). The plurality of supporting portions (14Y) are point-symmetric with respect to an axis that passes through a part of the adhesive portion (13Y) and that is aligned with a direction in which the intermediate substrate (12Y) and the base board (11Y) are bonded together.

This aspect allows, even if the adhesive portion (13Y) contracts or expands, the intermediate substrate (12Y) to be supported by the supporting portions (14Y) with good balance, thus reducing the tilt of the intermediate substrate (12Y). This reduces the chances of the sensor element (15Y) provided on the intermediate substrate (12Y) being affected by the tilt of the intermediate substrate (12Y), thus curbing a decline in the detection performance of the sensor element (15Y).

In a sensor device (10Y) according to a thirty-first aspect, which may be implemented in conjunction with the twenty-ninth aspect, the at least one supporting portion (14Y) includes a plurality of supporting portions (14Y). The plurality of supporting portions (14Y) are line-symmetric with respect to an axis that passes through a part of the adhesive portion (13Y) and that is perpendicular to a direction in which the intermediate substrate (12Y) and the base board (11Y) are bonded together.

This aspect allows, even if the adhesive portion (13Y) contracts or expands, the intermediate substrate (12Y) to be supported by the supporting portions (14Y) with good balance, thus reducing the tilt of the intermediate substrate (12Y). This reduces the chances of the sensor element (15Y) provided on the intermediate substrate (12Y) being affected by the tilt of the intermediate substrate (12Y), thus curbing a decline in the detection performance of the sensor element (15Y).

In a sensor device (10Y) according to a thirty-second aspect, which may be implemented in conjunction with any one of the twenty-ninth to thirty-first aspects, the supporting portion (14Y) has higher hardness than the adhesive portion (13Y).

This aspect reduces, even if the intermediate substrate (12Y) comes into contact with the supporting portion (14Y), the chances of the supporting portion (14Y) being deformed, thus allowing the supporting portion (14Y) to support the intermediate substrate (12Y) more easily.

In a sensor device (10Y) according to a thirty-third aspect, which may be implemented in conjunction with any one of the twenty-ninth to thirty-second aspects, the supporting portion (14Y) has a smaller modulus of volume change than the adhesive portion (13Y).

This aspect facilitates, even if the volume of the adhesive portion (13Y) changes, bringing the adhesive portion (13Y) into contact with the supporting portion (14Y), thus allowing the supporting portion (14Y) to support the intermediate substrate (12Y) more easily.

In a sensor device (10Y) according to a thirty-fourth aspect, which may be implemented in conjunction with any one of the twenty-ninth to thirty-third aspects, the supporting portion (14Y) is made of a metallic material.

This aspect reduces, even if the intermediate substrate (12Y) comes into contact with the supporting portion (14Y), the chances of the supporting portion (14Y) being deformed, thus allowing the supporting portion (14Y) to support the intermediate substrate (12Y) more easily.

In a sensor device (10Y) according to a thirty-fifth aspect, which may be implemented in conjunction with any one of the twenty-ninth to thirty-fourth aspects, the plurality of supporting portions (14Y) are arranged concentrically with a center of the sensor element (15Y) as viewed from a direction in which the intermediate substrate (12Y) and the base board (11Y) are bonded together.

This aspect reduces the chances of the sensor element (15Y) provided on the intermediate substrate (12Y) being affected by the tilt of the intermediate substrate (12Y), thus curbing a decline in the detection performance of the sensor element (15Y).

In a sensor device (10Y) according to a thirty-sixth aspect, which may be implemented in conjunction with any one of the twenty-ninth to thirty-fifth aspects, the supporting portion (14Y) is adhered to the intermediate substrate (12Y).

This aspect allows the supporting portion (14Y) to support the intermediate substrate (12Y) more firmly, thus enabling the supporting portion (14Y) to reduce the tilt of the intermediate substrate (12Y) more easily.

In a sensor device (10Y) according to a thirty-seventh aspect, which may be implemented in conjunction with any one of the twenty-ninth to thirty-sixth aspects, the sensor element (15Y) has a moving portion (20Y) and outputs an electrical signal representing magnitude of movement of the moving portion (20Y).

This aspect reduces the chances of the movement of the moving portion (20Y) being affected by the tilt of the intermediate substrate (12Y), thus curbing a decline in the detection performance of the sensor element (15Y).

In a sensor device (10Y) according to a thirty-eighth aspect, which may be implemented in conjunction with any one of the twenty-ninth to thirty-seventh aspects, the sensor element (15Y) detects a physical quantity about a direction in which the sensor element (15Y) is provided onto the intermediate substrate (12Y).

This aspect reduces the chances of the movement of the moving portion (20Y) being affected by the tilt of the intermediate substrate (12Y), thus curbing a decline in the detection performance of the sensor element (15Y).

Note that the constituent elements according to the thirtieth to thirty-eighth aspects are not essential constituent elements for the sensor device (10Y) but may be omitted as appropriate.

REFERENCE SIGNS LIST

1, 1A-1C Sensor Device
2 Sensor Element
3 Substrate
4 Supporting Member
5 Coupling Member
6, 6A Bonding Wire
23 UBM Layer
50 Vertical Member
60 Connection Path
31 Installation Surface (Connection Surface)
41 Supporting Surface (Connection Surface)
200 Element Electrode
220 Au Electrode Layer
201 Electrode Surface (Connection Surface)
501, 502, 503, 504, 511, 521 Adhesive Layer
601 Substrate-End Electrode
602 Supporting-End Electrode
603 Feed Electrode
604 Sensor-End Electrode
L1 Normal
1X, 1AX Sensor Device
2X Sensor Element
3X Substrate
4X Supporting Member
5X, 5AX Coupling Member
6X Wiring Member
7X Case
31X Installation surface
41X Supporting Surface
43X Processor Circuit
44X Connection Member
51X First Surface
52X Second Surface
53X Spacer
54X Hollow Portion
61X Lead Terminal
62X Holding Member
81X Sensor-Connecting Electrode
82X Substrate-Connecting Electrode
811X, 821X Underlying Electrode
812X, 822X Ni Plating Layer
813X, 823X Au Plating Layer
810X, 820X Barrier Layer
L1X Normal to Supporting Surface
P1X Center Point
10Y Sensor Device
11Y Base Board
12Y Intermediate substrate
13Y Adhesive portion
14Y Supporting Portion
15Y Sensor Element
20Y Moving Portion

The invention claimed is:

1. A sensor device comprising:
   a sensor element;
   a substrate over which the sensor element is provided; and
   a bonding wire forming at least part of a connection path that electrically connects the sensor element and the substrate together, the bonding wire being provided to connect two connection surfaces that intersect with each other;
   a supporting member installed over the substrate with the sensor element provided on the supporting member; and
   a coupling member that couples the supporting member to the substrate,
   wherein
   the sensor element is electrically connected to the substrate via the supporting member,
   one of the two connection surfaces is one surface of the supporting member,
   the supporting member is installed indirectly over the substrate via the coupling member, and
   an adhesive layer bonding the coupling member and the substrate together has a larger Young's modulus than an adhesive layer bonding the coupling member and the supporting member together.

2. The sensor device of claim 1, wherein
   the substrate has an installation surface over which the supporting member is installed,
   the supporting member has a supporting surface on which the sensor element is provided,
   a normal to the supporting surface is aligned with the installation surface, and
   one of the two connection surfaces is the supporting surface.

3. The sensor device of claim 2, wherein
   the supporting member has, on the supporting surface, a supporting-end electrode, to which one end portion of the bonding wire is connected, and
   the supporting-end electrode is located closer to the substrate than the sensor element is, when viewed from the sensor element on the supporting surface.

4. The sensor device of claim 2, wherein
   the supporting member has, on the supporting surface, a supporting-end electrode, to which one end portion of the bonding wire is connected, and
   the supporting-end electrode is located opposite from the substrate with respect to the sensor element, when viewed from the sensor element on the supporting surface.

5. The sensor device of claim 1, wherein one of the two connection surfaces is one surface of the substrate.

6. The sensor device of claim 1, wherein
the bonding wire includes a plurality of bonding wires,
each of the two connection surfaces is provided with a plurality of electrodes, to which the plurality of bonding wires are respectively connected, and
the plurality of electrodes are arranged along a virtual line that is parallel to both of the two connection surfaces.

7. The sensor device of claim 1, wherein
the sensor element includes an element electrode,
the element electrode includes: an Au electrode layer; and a UBM layer stacked on the Au electrode layer, and
a coefficient of thermal expansion of the UBM layer has a value between a coefficient of thermal expansion of AuSn and a coefficient of thermal expansion of $SiO_2$.

* * * * *